US012740066B1

(12) United States Patent
Dokania et al.

(10) Patent No.: US 12,740,066 B1
(45) Date of Patent: Sep. 15, 2026

(54) SPLIT MEMORY ARRAY TO REDUCE BIT-LINE CAPACITANCE

(71) Applicant: Kepler Computing Inc., San Francisco, CA (US)

(72) Inventors: Rajeev Kumar Dokania, Beaverton, OR (US); Mustansir Yunus Mukadam, Seattle, WA (US); Noriyuki Sato, Hillsboro, OR (US); Tanay Gosavi, Portland, OR (US); Niloy Mukherjee, San Ramon, CA (US); Amrita Mathuriya, Portland, OR (US); Sasikanth Manipatruni, Portland, OR (US)

(73) Assignee: Kepler Computing Inc., San Francisco, CA (US)

( * ) Notice: Subject to any disclaimer, the term of this patent is extended or adjusted under 35 U.S.C. 154(b) by 876 days.

(21) Appl. No.: 17/812,152

(22) Filed: Jul. 12, 2022

(51) Int. Cl.
*G11C 11/22* (2006.01)
*H10B 53/30* (2023.01)
(Continued)

(52) U.S. Cl.
CPC ............ *H10B 53/30* (2023.02); *G11C 11/221* (2013.01); *G11C 11/223* (2013.01); *H10B 53/40* (2023.02); *H10B 53/50* (2023.02)

(58) Field of Classification Search
CPC ........ H10B 53/30; H10B 53/40; G11C 11/21; G11C 11/223
(Continued)

(56) References Cited

U.S. PATENT DOCUMENTS 5,086,412 A 2/1992 Jaffe et al.
5,307,304 A 4/1994 Saito et al.
(Continued)

FOREIGN PATENT DOCUMENTS

EP 4560636 A1 * 5/2025 ............. G11C 5/025
JP H0982907 A 3/1997
(Continued)

OTHER PUBLICATIONS

Notice of Allowance notified Mar. 15, 2023 for U.S. Appl. No. 17/516,293.
(Continued)

*Primary Examiner* — Viet Q Nguyen
(74) *Attorney, Agent, or Firm* — MUGHAL GAUDRY & FRANKLIN PC

(57) ABSTRACT

A memory array is split into two or more subarrays with bit-line multiplexers or selection circuitries between the subarrays. Bit-line routes are split along the subarrays via the selection circuitries. The selection circuitries decouple the bit-lines into separate bit-line routes which allow the capacitance on the bit-lines to reduce as parasitic capacitance from the bit-line routes is reduced and bit-line is not driving all the access transistors in a row of the memory array. By using one of the two split bit-lines as the main bit-line, the main bit-line has lower capacitance resulting in faster sensing and better sensing margin since the voltage for sensing on the bit-lines is developed faster, as also larger signal is developed due to lower parasitic capacitance. Further, the access transistor of the selected row can be switched faster which results in higher memory performance. Polarization density requirements also reduce by lowering the parasitic capacitance.

17 Claims, 27 Drawing Sheets

(51) Int. Cl.
*H10B 53/40* (2023.01)
*H10B 53/50* (2023.01)
(58) Field of Classification Search
USPC .......................................................... 365/145
See application file for complete search history.

(56) References Cited

U.S. PATENT DOCUMENTS 5,383,150 A 1/1995 Nakamura et al.
5,539,279 A 7/1996 Takeuchi et al.
5,739,563 A 4/1998 Kawakubo et al.
6,002,608 A 12/1999 Tanabe
6,043,526 A 3/2000 Ochiai
6,272,062 B1 * 8/2001 Mueller .............. G11C 11/4097 365/230.02
6,274,388 B1 8/2001 Aggarwal et al.
6,346,741 B1 2/2002 Buskirk et al.
6,368,910 B1 4/2002 Sheu et al.
6,388,281 B1 5/2002 Jung et al.
6,448,911 B1 9/2002 Somayajula
6,477,107 B1 * 11/2002 Lee ...................... G11C 7/1072 365/233.5
6,500,678 B1 12/2002 Aggarwal et al.
6,570,781 B1 * 5/2003 Lee ...................... H10B 12/482 365/189.08
6,587,367 B1 7/2003 Nishimura et al.
6,635,497 B2 10/2003 Aggarwal et al.
6,643,163 B2 11/2003 Takashima
6,656,301 B2 12/2003 Kirby
6,656,748 B2 12/2003 Hall et al.
6,713,342 B2 3/2004 Celii et al.
6,717,838 B2 4/2004 Hosoi
6,720,600 B2 4/2004 Okita
6,728,128 B2 4/2004 Nishimura et al.
6,738,279 B1 * 5/2004 Kablanian .............. G11C 5/025 365/72
6,798,686 B2 9/2004 Takashima
6,813,193 B2 * 11/2004 Vogelsang .......... G11C 11/4096 365/230.03
6,873,536 B2 3/2005 Komatsuzaki
6,906,944 B2 6/2005 Takeuchi et al.
6,947,324 B1 * 9/2005 Lee ...................... H10B 12/482 257/908
7,029,925 B2 4/2006 Celii et al.
7,075,134 B2 7/2006 Araujo et al.
7,099,202 B1 * 8/2006 Son .......................... G11C 7/10 365/189.05
7,169,621 B2 1/2007 Hasegawa et al.
7,173,844 B2 2/2007 Lee et al.
7,230,869 B1 * 6/2007 Redgrave ............... G11C 7/065 365/222
7,405,959 B2 7/2008 Koide et al.
7,420,832 B1 * 9/2008 Lukes ...................... G11C 8/14 365/72
7,426,130 B2 9/2008 Jeon
7,791,922 B2 9/2010 Doumae et al.
8,300,446 B2 10/2012 Qidwai
8,441,833 B2 5/2013 Summerfelt et al.
8,665,628 B2 3/2014 Kawashima
8,865,628 B2 10/2014 Manabe et al.
9,275,686 B2 * 3/2016 Patel ..................... G11C 11/419
9,368,199 B2 * 6/2016 Miyakawa .......... G11C 11/1653
9,472,560 B2 10/2016 Ramaswamy et al.
9,620,206 B2 4/2017 Nazarian et al.
9,786,348 B1 10/2017 Kawamura et al.
9,812,204 B1 11/2017 Yan et al.
9,899,085 B1 2/2018 Yan
10,032,523 B2 * 7/2018 Son ...................... G11C 29/808
10,153,042 B2 * 12/2018 Ehrman ................. G11C 15/04
10,395,710 B1 * 8/2019 Abedifard .............. G11C 7/065
10,541,007 B2 * 1/2020 Chang .................. G11C 7/1069
10,847,201 B2 11/2020 Manipatruni et al.
10,998,025 B2 5/2021 Manipatruni et al.
11,107,516 B1 8/2021 Rabkin et al.
11,107,535 B2 * 8/2021 Dinh ...................... G11C 16/26
11,107,545 B2 * 8/2021 Yuan ...................... G11C 19/28
11,133,057 B2 * 9/2021 Liaw ........................ H10D 1/00
11,233,510 B2 * 1/2022 Wuu .................. H03K 19/0013
11,335,391 B1 5/2022 Ocker et al.
11,482,270 B1 10/2022 Dokania et al.
11,699,699 B1 7/2023 Mathuriya et al.
11,733,898 B2 * 8/2023 Kolar .................... G06F 3/0604 711/154
11,854,609 B2 * 12/2023 Pallerla .................. G11C 7/065
11,968,820 B2 * 4/2024 Onuki ................ H10D 84/0126
12,020,766 B2 * 6/2024 Raj ........................ G11C 7/106
2002/0079520 A1 6/2002 Nishihara et al.
2002/0125517 A1 9/2002 Nakamura
2002/0153550 A1 10/2002 An et al.
2003/0012984 A1 1/2003 Ueda
2003/0119211 A1 6/2003 Summerfelt et al.
2003/0129847 A1 7/2003 Celii et al.
2003/0137866 A1 7/2003 Nishihara
2003/0141528 A1 7/2003 Ito
2003/0174553 A1 9/2003 Saito et al.
2004/0027873 A1 2/2004 Nishihara
2004/0047219 A1 3/2004 Ito
2004/0089854 A1 5/2004 Chen et al.
2004/0104754 A1 6/2004 Bruchhaus et al.
2004/0129961 A1 7/2004 Araujo et al.
2004/0233696 A1 11/2004 Kang
2004/0245547 A1 12/2004 Stipe
2005/0012126 A1 1/2005 Udayakumar et al.
2005/0214954 A1 9/2005 Maruyama et al.
2005/0230725 A1 10/2005 Aggarwal et al.
2005/0244988 A1 11/2005 Wang et al.
2006/0001070 A1 1/2006 Park et al.
2006/0002170 A1 1/2006 Kumura et al.
2006/0006447 A1 1/2006 Kim et al.
2006/0073613 A1 4/2006 Aggarwal et al.
2006/0073614 A1 4/2006 Hara
2006/0134808 A1 6/2006 Summerfelt et al.
2006/0138507 A1 6/2006 Kijima et al.
2006/0258113 A1 11/2006 Sandhu et al.
2007/0275484 A1 11/2007 Mitsui
2007/0298521 A1 12/2007 Obeng et al.
2008/0025063 A1 1/2008 Kang
2008/0073680 A1 3/2008 Wang
2008/0081380 A1 4/2008 Celii et al.
2008/0101107 A1 5/2008 Shiga et al.
2008/0107885 A1 5/2008 Alpay et al.
2008/0191252 A1 8/2008 Nakamura et al.
2009/0003042 A1 1/2009 Lee et al.
2009/0251950 A1 10/2009 Klostermann
2012/0127776 A1 5/2012 Kawashima
2012/0134196 A1 5/2012 Evans, Jr. et al.
2012/0313218 A1 12/2012 Fujimori et al.
2014/0063924 A1 3/2014 Nakai et al.
2014/0208041 A1 7/2014 Hyde et al.
2014/0247642 A1 9/2014 Madhan et al.
2015/0069481 A1 3/2015 Sun et al.
2015/0069555 A1 3/2015 Sakai et al.
2015/0294702 A1 10/2015 Lee et al.
2017/0069735 A1 3/2017 Oh et al.
2017/0277459 A1 9/2017 Rodriguez et al.
2018/0166453 A1 6/2018 Müller
2018/0226418 A1 8/2018 Morandi et al.
2018/0286987 A1 10/2018 Lee et al.
2018/0323309 A1 11/2018 Ando et al.
2018/0331113 A1 11/2018 Liao et al.
2019/0051642 A1 2/2019 Hyde et al.
2019/0051815 A1 2/2019 Kakinuma et al.
2019/0115353 A1 4/2019 O'Brien et al.
2019/0123099 A1 4/2019 Lee
2019/0138893 A1 5/2019 Sharma et al.
2019/0244656 A1 * 8/2019 Li ....................... G11C 11/4097
2019/0311765 A1 * 10/2019 Lin .......................... G11C 8/14
2019/0378552 A1 * 12/2019 Abedifard ........... G11C 11/1675
2020/0004583 A1 1/2020 Kelly et al.
2020/0051607 A1 2/2020 Pan et al.
2020/0273865 A1 8/2020 Manipatruni et al.
2020/0273866 A1 8/2020 Manipatruni et al.
2020/0273867 A1 8/2020 Manipatruni et al.

(56) References Cited

U.S. PATENT DOCUMENTS

| | | | |
|---|---|---|---|
| 2020/0357453 A1 | 11/2020 | Slesazeck et al. |
| 2021/0090662 A1 | 3/2021 | Mennenga et al. |
| 2021/0111179 A1 | 4/2021 | Shivaraman et al. |
| 2021/0142837 A1 | 5/2021 | Yu et al. |
| 2021/0193209 A1 | 6/2021 | Swami et al. |
| 2021/0202507 A1 | 7/2021 | Thareja et al. |
| 2021/0398580 A1 | 12/2021 | Yuh |
| 2022/0069131 A1 | 3/2022 | Pesic |
| 2023/0232609 A1 | 7/2023 | Hsu et al. |

FOREIGN PATENT DOCUMENTS

| | | | | |
|---|---|---|---|---|
| JP | H10242426 A | 9/1998 | |
| JP | H10255484 A | 9/1998 | |
| JP | H1174488 A | 3/1999 | |
| JP | 2000174224 A | 6/2000 | |
| JP | 2001237393 A | 8/2001 | |
| JP | 2002026256 A | 1/2002 | |
| JP | 2002158339 A | 5/2002 | |
| JP | 2003123465 A | 4/2003 | |
| JP | 2005057103 A | 3/2005 | |
| JP | 2005142322 A | 6/2005 | |
| JP | 2005322925 A | 11/2005 | |
| JP | 2008210955 A | 9/2008 | |
| JP | 2010021544 A | 1/2010 | |
| JP | 2011151370 A | 8/2011 | |
| JP | 2017518632 A | 7/2017 | |
| KR | 100451763 B1 * | 10/2004 | ......... G11C 11/5657 |
| KR | 100481867 B1 | 4/2005 | |
| KR | 20050105695 A | 11/2005 | |
| KR | 100895740 B1 | 4/2009 | |
| TW | 200718237 A | 5/2007 | |
| TW | 200935151 A | 8/2009 | |
| TW | 201725736 A | 7/2017 | |
| WO | 20130147295 | 10/2013 | |
| WO | 2015167887 A1 | 11/2015 | |
| WO | 2018125024 A1 | 7/2018 | |
| WO | 2021112247 A1 | 6/2021 | |
| WO | WO-2022241796 A1 * | 11/2022 | ............. G11C 11/22 |

OTHER PUBLICATIONS

Notice of Allowance notified Mar. 17, 2023 for U.S. Appl. No. 17/532,545.
Notice of Allowance notified May 2, 2023 for U.S. Appl. No. 17/532,556.
Notice of Allowance notified Nov. 17, 2022 for U.S. Appl. No. 17/530,363.
Notice of Allowance notified Nov. 22, 2022 for U.S. Appl. No. 17/530,362.
Notice of Allowance notified Nov. 25, 2022 for U.S. Appl. No. 17/531,577.
Notice of Allowance notified Nov. 27, 2023 for U.S. Appl. No. 17/654,802.
Notice of Allowance notified Nov. 29, 2023 for U.S. Appl. No. 17/654,908.
Notice of Allowance notified Oct. 20, 2022 for Taiwan Patent Application No. 110129115.
Notice of Allowance notified Sep. 13, 2022 for U.S. Appl. No. 17/530,364.
Notice of Allowance notified Sep. 14, 2022 for U.S. Appl. No. 17/530,360.
Notice of Allowance notified Sep. 21, 2022 for U.S. Appl. No. 17/530,366.
Notice of Allowance notified Sep. 23, 2022 for U.S. Appl. No. 17/339,850.
Notice of Allowance notified Sep. 26, 2022 for U.S. Appl. No. 17/367,217.
Notice of Allowance notified Sep. 27, 2022 for U.S. Appl. No. 17/346,083.
Notice of Preliminary Rejection notified Jul. 18, 2023 for Korean Patent Application No. 10-2021-7027261.
Notice of Preliminary Rejection notified Oct. 28, 2022 for Korean Patent Application No. 10-2021-7027303.
Notice of Reasons for Rejection notified Dec. 6, 2022 for Japanese Patent Application No. 2021-546823.
Notice of Reasons for Rejection notified Jun. 20, 2023 for Japanese Patent Application No. 2021-546823.
Notice of Reasons for Rejection notified Nov. 22, 2022 for Japanese Patent Application No. 2021-546864.
Office Action notified May 16, 2023 for Japanese Patent Application No. 2021-546864.
Official Communication notified Jun. 22, 2023 for German Patent Application No. 112020000956.4.
Restriction Requirement notified Aug. 5, 2022 for U.S. Appl. No. 17/359,325.
Restriction Requirement notified Aug. 26, 2022 for U.S. Appl. No. 17/390,796.
Salahuddin et al., "SRAM with Buried Power Distribution to Improve Write Margin and Performance in Advanced Technology Nodes," IEEE Electron Device Letters, vol. 40, Issue: 8, Aug. 2019. 4 pages. DOI: 10.1109/LED.2019.2921209.
Second Office Action notified Jul. 26, 2022 for Taiwan Patent Application No. 110129115.
Decision of Rejection notified Feb. 1, 2024 for Taiwan Patent Application No. 111150380.
Examination Report notified Jun. 21, 2023 for German Patent Application No. 112020000955.6.
Final Office Action notified Aug. 15, 2022 for U.S. Appl. No. 17/346,083.
Final Office Action notified Feb. 5, 2024 for U.S. Appl. No. 17/654,564.
Final Office Action notified Feb. 5, 2024 for U.S. Appl. No. 17/654,905.
Final Office Action notified Mar. 12, 2024 for U.S. Appl. No. 17/654,764.
Final Office Action notified Sep. 12, 2022 for U.S. Appl. No. 17/367,217.
First Office Action notified Jul. 5, 2023 for Taiwan Patent Application No. 111150380.
Non-Final Office Action notified Apr. 30, 2024 for U.S. Appl. No. 17/817,937.
Non-Final Office Action notified Aug. 16, 2022 for U.S. Appl. No. 17/367,217.
Non-Final Office Action notified Dec. 28, 2023 for U.S. Appl. No. 17/805,665.
Non-Final Office Action notified Dec. 29, 2023 for U.S. Appl. No. 17/805,664.
Non-Final Office Action notified Feb. 12, 2024 for U.S. Appl. No. 17/805,438.
Non-Final Office Action notified Jan. 2, 2024 for U.S. Appl. No. 17/653,811.
Non-Final Office Action notified May 9, 2023 for U.S. Appl. No. 18/061,270.
Non-Final Office Action notified May 16, 2023 for U.S. Appl. No. 17/532,647.
Non-Final Office Action notified Nov. 4, 2022 for U.S. Appl. No. 17/530,362.
Non-Final Office Action notified Nov. 21, 2022 for U.S. Appl. No. 17/532,657.
Non-Final Office Action notified Nov. 28, 2022 for U.S. Appl. No. 17/532,552.
Non-Final Office Action notified Oct. 4, 2023 for U.S. Appl. No. 17/654,905.
Non-Final Office Action notified Oct. 12, 2022 for U.S. Appl. No. 17/530,363.
Non-Final Office Action notified Oct. 12, 2023 for U.S. Appl. No. 17/654,564.
Non-Final Office Action notified Oct. 26, 2022 for U.S. Appl. No. 17/531,577.
Non-Final Office Action notified Oct. 31, 2023 for U.S. Appl. No. 17/654,764.

(56) References Cited

OTHER PUBLICATIONS

Non-Final Office Action notified Sep. 1, 2022 for U.S. Appl. No. 17/339,850.
Non-Final Office Action notified Sep. 2, 2022 for U.S. Appl. No. 17/315,139.
Non-Final Office Action notified Sep. 7, 2022 for U.S. Appl. No. 17/530,360.
Non-Final Office Action notified Sep. 14, 2023 for U.S. Appl. No. 17/654,379.
Non-Final Office Action notified Sep. 15, 2022 for U.S. Appl. No. 17/315,111.
Notice of Allowance notified Apr. 4, 2023 for U.S. Appl. No. 17/532,552.
Notice of Allowance notified Apr. 15, 2024 for U.S. Appl. No. 17/653,811.
Notice of Allowance notified Apr. 23, 2024 for U.S. Appl. No. 17/654,564.
Notice of Allowance notified Apr. 23, 2024 for U.S. Appl. No. 17/805,665.
Notice of Allowance notified Apr. 26, 2024 for U.S. Appl. No. 17/654,905.
Notice of Allowance notified Apr. 28, 2023 for U.S. Appl. No. 17/315,139.
Notice of Allowance notified Aug. 8, 2022 for U.S. Appl. No. 17/529,258.
Notice of Allowance notified Aug. 17, 2022 for U.S. Appl. No. 17/346,087.
Notice of Allowance notified Aug. 22, 2022 for U.S. Appl. No. 17/390,791.
Notice of Allowance notified Aug. 25, 2022 for U.S. Appl. No. 17/367,101.
Notice of Allowance notified Aug. 31, 2022 for U.S. Appl. No. 17/359,325.
Notice of Allowance notified Jan. 5, 2024 for Korean Patent Application No. 10-2021-7027261.
Notice of Allowance notified Jan. 10, 2024 for U.S. Appl. No. 17/654,379.
Notice of Allowance notified Jan. 18, 2024 for U.S. Appl. No. 17/654,383.
Notice of Allowance notified Jan. 20, 2023 for U.S. Appl. No. 17/532,657.
Notice of Allowance notified Jan. 23, 2023 for U.S. Appl. No. 17/315,111.
Notice of Allowance notified Jan. 30, 2023 for U.S. Appl. No. 17/531,535.
Notice of Allowance notified Jul. 3, 2023 for U.S. Appl. No. 17/532,647.
Notice of Allowance notified Jun. 16, 2023 for U.S. Appl. No. 17/532,652.
Notice of Allowance notified Jun. 26, 2023 for U.S. Appl. No. 18/061,270.
Notice of Allowance notified Mar. 13, 2023 for U.S. Appl. No. 17/516,577.
Advisory Action notified Jul. 25, 2022 for U.S. Appl. No. 17/339,850.
Advisory Action notified Nov. 16, 2021 for U.S. Appl. No. 16/287,953.
Advisory Action notified Nov. 16, 2021 for U.S. Appl. No. 16/288,004.
Advisory Action notified Nov. 16, 2021 for U.S. Appl. No. 16/288,006.
Chandler, T. “An adaptive reference generation scheme for 1T1C FeRAMs”, 2003 Symposium on VLSI Circuits. Digest of Technical Papers (IEEE Cat. No. 03CH37408), Kyoto, Japan, 2003, pp. 173-174.
Final Office Action notified Apr. 25, 2022 for U.S. Appl. No. 16/287,953.
Final Office Action notified Jun. 13, 2022 for U.S. Appl. No. 17/339,850.
Final Office Action notified May 11, 2022 for U.S. Appl. No. 16/288,004.
Final Office Action notified May 11, 2022 for U.S. Appl. No. 16/288,006.
Final Office Action notified Oct. 7, 2021 for U.S. Appl. No. 16/287,953.
Final Office Action notified Oct. 7, 2021 for U.S. Appl. No. 16/288,004.
Final Office Action notified Oct. 7, 2021 for U.S. Appl. No. 16/288,006.
Gupta et al., “Buried Power Rail Integration with Si FinFETs for CMOS Scaling beyond the 5 nm Node,” 2020 IEEE Symposium on VLSI Technology, Jun. 16-19, 2020, Honolulu, HI, US. 2 pages. DOI: 10.1109/VLSITechnology18217.2020.9265113.
Gupta et al., “Buried Power Rail Scaling and Metal Assessment for the 3 nm Node and Beyond,” 2020 IEEE International Electron Devices Meeting (IEDM), Dec. 12-18, 2020, San Francisco, CA, US. 4 pages. DOI: 10.1109/IEDM13553.2020.9371970.
International Preliminary Report on Patentability notified Sep. 10, 2021 for PCT Patent Application No. PCT/US2020/018870.
International Preliminary Report on Patentability notified Sep. 10, 2021 for PCT Patent Application No. PCT/US2020/066963.
International Search Report & Written Opinion notified Jun. 19, 2020 for U.S. Patent Application No. PCT/US2020/018879.
International Search Report & Written Opinion notified Jun. 24, 2020 for PCT Patent Application No. PCT/US2020/018870.
Jung, D. et al., “Highly manufacturable 1T1C 4 Mb FRAM with novel sensing scheme, International Electron Devices Meeting 1999. Technical Digest (Cat. No. 99CH36318), Washington, Dc, USA, 1999, pp. 279-282.”, International Electron Devices Meeting 1999. Technical Digest (Cat. No. 99CH36318), Washington, DC, USA, 1999, pp. 279-282.
Mathur et al., “Buried Bitline for sub-5nm SRAM Design,” 2020 IEEE International Electron Devices Meeting (IEDM), San Francisco, CA, US. 4 pages. DOI: 10.1109/IEDM13553.2020.9372042.
Non-Final Office Action notified Aug. 5, 2020 for U.S. Appl. No. 16/287,953.
Non-Final Office Action notified Aug. 5, 2020 for U.S. Appl. No. 16/288,004.
Non-Final Office Action notified Aug. 5, 2020 for U.S. Appl. No. 16/288,006.
Non-Final Office Action notified Dec. 20, 2021 for U.S. Appl. No. 16/288,004.
Non-Final Office Action notified Jan. 18, 2022 for U.S. Appl. No. 16/287,953.
Non-Final Office Action notified Jan. 19, 2022 for U.S. Appl. No. 16/288,006.
Non-Final Office Action notified Jun. 13, 2022 for U.S. Appl. No. 17/346,083.
Non-Final Office Action notified Jun. 15, 2022 for U.S. Appl. No. 17/367,101.
Non-Final Office Action notified Jun. 26, 2020 for U.S. Appl. No. 16/287,876.
Non-Final Office Action notified Jun. 27, 2022 for U.S. Appl. No. 17/315,143.
Non-Final Office Action notified Mar. 7, 2022 for U.S. Appl. No. 17/339,850.
Non-Final Office Action notified Mar. 30, 2022 for U.S. Appl. No. 17/346,083.
Non-Final Office Action notified Mar. 31, 2022 for U.S. Appl. No. 17/346,087.
Notice of Allowance notified Apr. 20, 2022 for U.S. Appl. No. 17/359,311.
Notice of Allowance notified Jan. 12, 2021 for U.S. Appl. No. 16/287,876.
Notice of Allowance notified Jul. 27, 2020 for U.S. Appl. No. 16/287,927.
Notice of Allowance notified Jun. 9, 2022 for U.S. Appl. No. 16/288,006.
Notice of Allowance notified Jun. 10, 2022 for U.S. Appl. No. 16/288,004.
Notice of Allowance notified Jun. 13, 2022 for U.S. Appl. No. 16/287,953.
Notice of Allowance notified Jun. 15, 2022 for U.S. Appl. No. 17/367,083.
Notice of Allowance notified Jun. 23, 2022 for U.S. Appl. No. 17/367,172.

(56) References Cited

OTHER PUBLICATIONS

Notice of Allowance notified Jun. 23, 2022 for U.S. Appl. No. 17/367,210.
Ogiwara, R. et al., "A 0.5-/spl mu/m, 3-V 1T1C, 1-Mbit FRAM with a variable reference bit-line voltage scheme using a fatigue-free reference capacitor", in IEEE Journal of Solid-State Circuits, vol. 35, No. 4, pp. 545-551, Apr. 2000.
Oh, S. et al. "Noble FeRAM technologies with MTP cell structure and BLT ferroelectric capacitors", IEEE International Electron Devices Meeting 2003, Washington, DC, USA, 2003, pp. 34.5.1-34.5.4.
Restriction Requirement notified Apr. 15, 2022 for U.S. Appl. No. 17/315,111.
Restriction Requirement notified Apr. 15, 2022 for U.S. Appl. No. 17/315,139.
Restriction Requirement notified Mar. 23, 2022 for U.S. Appl. No. 17/315,143.
Run-Lan et al., "Study on Ferroelectric Behaviors and Ferroelectric Nanodomains of YMno3 Thin Film", Acta Phys. Sin. Vol. 63, No. 18 (2014). Supported by the National Natural Science Foundation of China. DOI: 10.7498/aps.187701. 6 pages.
Ryckaert et al., "Extending the Roadmap Beyond 3nm Through System Scaling Boosters: A Case Study on Buried Power Rail and Backside Power Delivery," 2019 Electron Devices Technology and Manufacturing Conferences (EDTM), IEEE. pp. 50-52 (3 pages).
Salahuddin et al., "Buried Power SRAM DTCO and System-Level Benchmarking in N3," 2020 Symposium on VLSI Technology Digest of Technical Papers—JFS3.3 IEEE. 2 pages.
Tanaka, S. et al., "FRAM cell design with high immunity to fatigue and imprint for 0.5 /spl mu/m 3 V 1T1C 1 Mbit FRAM", in IEEE Transactions on Electron Devices, vol. 47, No. 4, pp. 781-788, Apr. 2000.
Yamaoka, K. et al., "A 0.9-V 1T1C SBT-based embedded nonvolatile FeRAM with a reference voltage scheme and multilayer shielded bit-line structure", in IEEE Journal of Solid-State Circuits, vol. 40, No. 1, pp. 286-292, Jan. 2005.
Yeh et al. "Fabrication and Investigation of Three-Dimensional Ferroelectric Capacitors for the Application of FeRAM," AIP Advances 6, 035128 (2016); https://doi.org/10.1063/1.4945405, Published Online: Mar. 30, 2016, 13 pages.

* cited by examiner

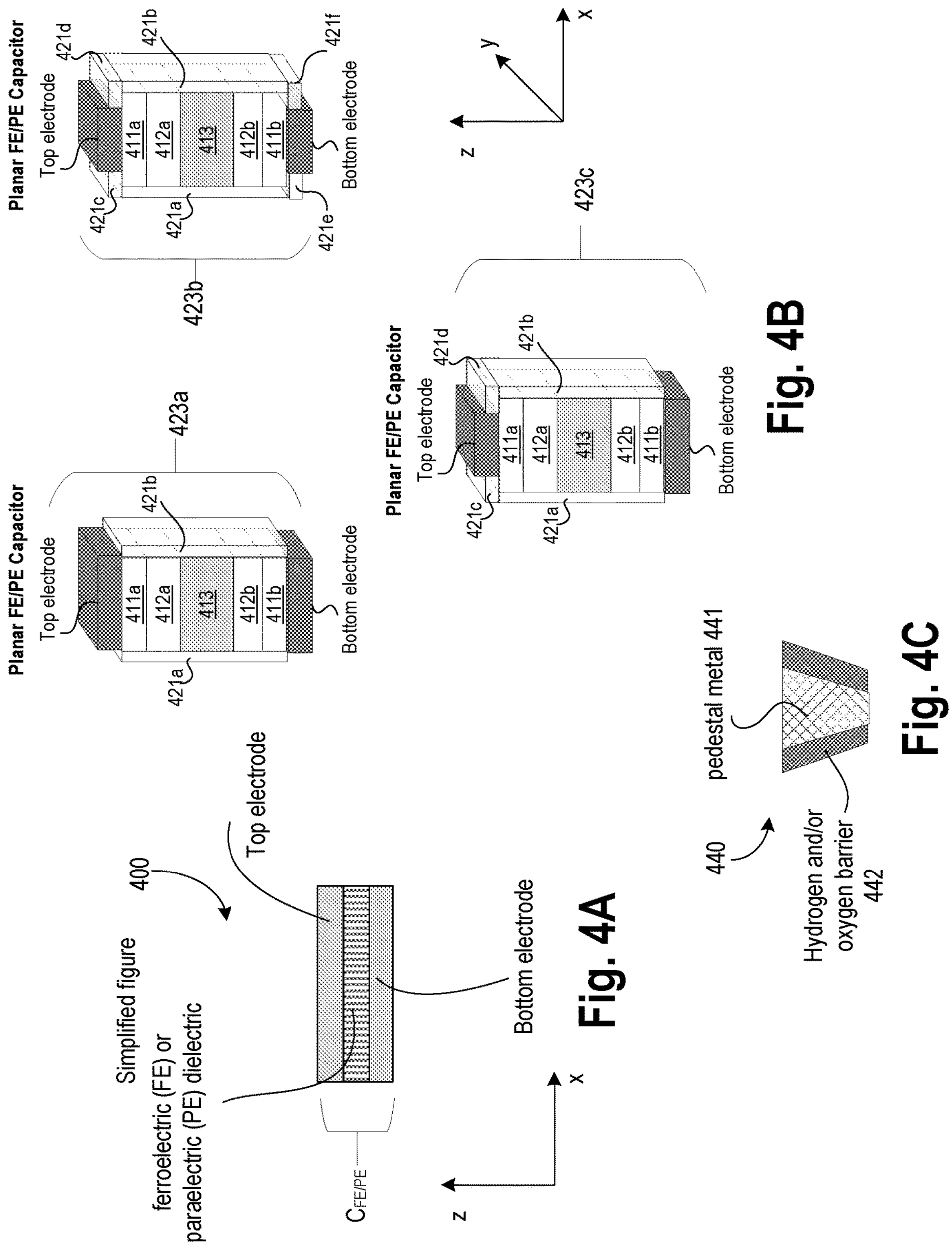

Simplified figure
ferroelectric (FE) or paraelectric (PE) dielectric
400
Top electrode
$C_{FE/PE}$
Bottom electrode
z
x
Planar FE/PE Capacitor
Top electrode
411a
412a
413
412b
411b
421a
421b
423a
Bottom electrode
Planar FE/PE Capacitor
Top electrode
421d
421c
411a
412a
413
412b
411b
421a
421b
423b
421e
421f
Bottom electrode
Planar FE/PE Capacitor
Top electrode
421d
421c
411a
412a
413
412b
411b
421a
421b
423c
Bottom electrode
z
y
x
440
pedestal metal 441
Hydrogen and/or oxygen barrier 442

Pillar Ferroelectric Capacitor 500

501b
501a
513
512a
512b
502
a
b
Top Electrode 501b
Bottom Electrode 501a
Oxide Scaffolding 502 or metal tower
FE/PE Cap Dielectric 513
Conductive Oxide contacts 512a, 512b
Conductive Oxide contact 512b
FE/PE Cap Dielectric 513
Conductive Oxide contact 512a
Top Electrode 501b
Bottom Electrode 501a Plate-line parallel to bit-line
1TnC 1TnC
Plate-lines parallel to word-line 1100
Multi-element FE gain bit-cell
Plate-lines parallel to bit-line
BL0
WL0
PL0_n
Cfen
PL0_2
Cfe2
PL0_1
Cfe1
sn1
WL
BL
MN1
SL
Vs
MTR1
SL0
701 0,0

1120
Plate-lines parallel to word-line
WL0
PL0_n
Cfen
PL0_2
Cfe2
PL0_1
Cfe1
sn1
WL
BL
MN1
Vs
MTR1
SL0
BL0
701 0,0

1200

Multi-element FE gain bit-cell
Plate-lines parallel to bit-line

BL0
WL0
BL
WLP0_8
PL0_8
$MN_{PL0_8}$
n0_16
Cfe16
WLP0_2
PL0_2
$MN_{PL0_2}$
n0_2
Cfe2
WLP0_1
PL0_1
$MN_{PL0_1}$
n0_1
Cfe1
sn1
WL
$MN_1$
SL
Vs
$MTR_1$
$701_{0,0}$
SL0

1700

SPLIT MEMORY ARRAY TO REDUCE BIT-LINE CAPACITANCE

BACKGROUND

Memory bit-cells are arranged in rows and columns that form segments, arrays, or banks. For example, a 256×8 array may have 256 bit-cells on a single row, where 8 is the number of columns. A bit-line is routed through an entire row. Continuing with the examples of 256×8, there may be 8 parallel bit-lines in the array. Routing bit-lines through large arrays adds capacitance to the bit-lines. For example, the capacitance increases as the length of the bit-line increases. Higher capacitance on the bit-line slows the accessing of the bit-cell. Also, higher capacitance on the bit-line slows the sensing on the voltage developed on the bit-line.

The background description provided here is for the purpose of generally presenting the context of the disclosure. Unless otherwise indicated here, the material described in this section is not prior art to the claims in this application and are not admitted as prior art by inclusion in this section.

BRIEF DESCRIPTION OF THE DRAWINGS

The embodiments of the disclosure will be understood more fully from the detailed description given below and from the accompanying drawings of various embodiments of the disclosure, which, however, should not be taken to limit the disclosure to the specific embodiments, but are for explanation and understanding only.

FIG. 4A illustrates a planar ferroelectric or paraelectric capacitor structure, in accordance with some embodiments.

FIG. 4B illustrates three planar ferroelectric or paraelectric capacitor structures, respectively, in accordance with some embodiments.

FIG. 4C illustrates a pedestal that connects to the top and/or bottom electrodes of the planar ferroelectric or paraelectric capacitor.

DETAILED DESCRIPTION

Figure 1:
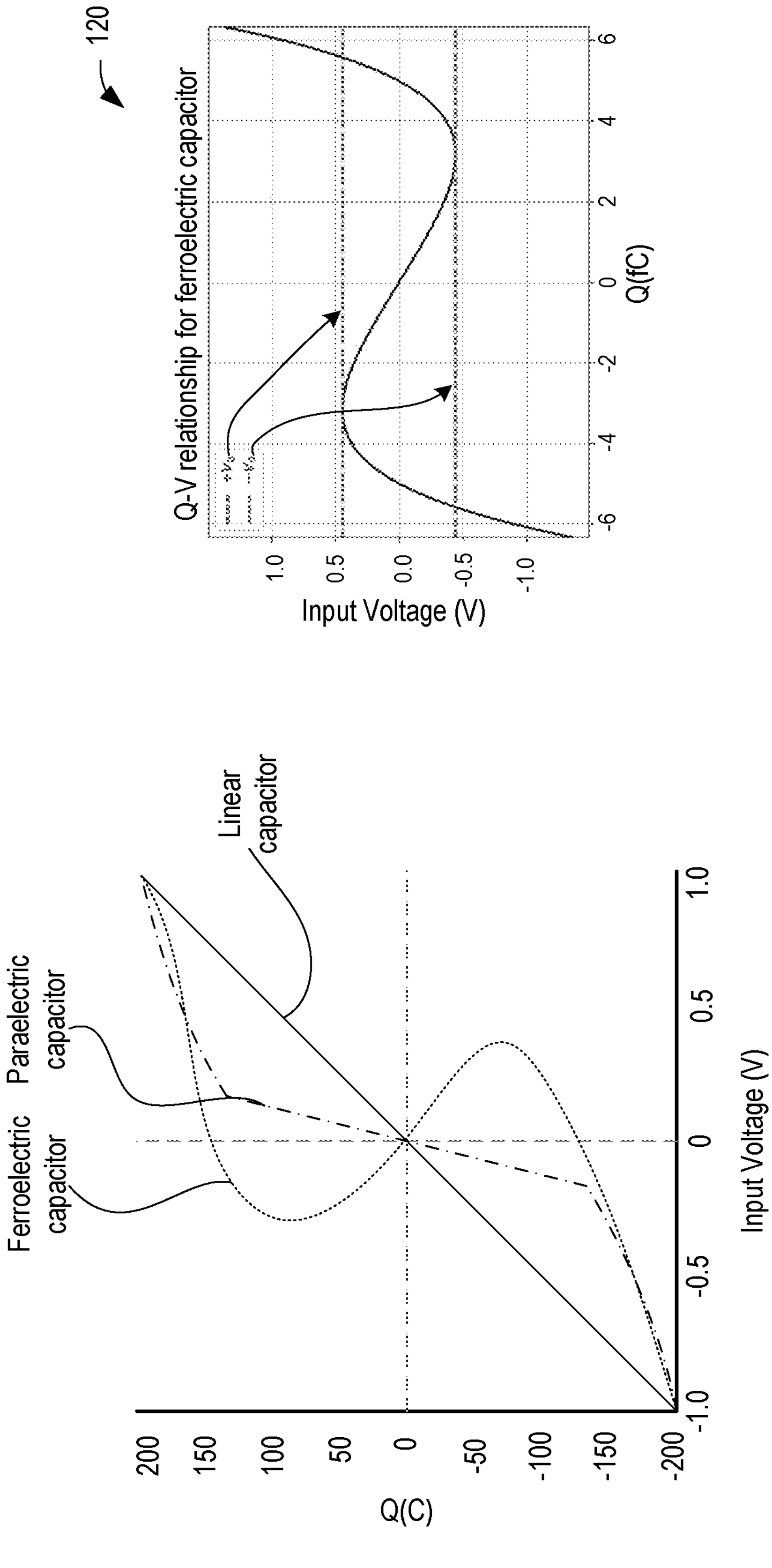
FIG. 1 illustrates a set of plots that show behavior of a ferroelectric capacitor, a paraelectric capacitor, and a linear capacitor.

In some instances when multiple capacitors are used per memory bit-cell, an access transistor of the memory bit-cell may be made larger. The access transistor is connected to a bit-line as the bit-line drives a gate terminal of the access transistor. A larger access transistor adds capacitance to the bit-line. One way to reduce the bit-line capacitance is to route the bit-line on higher level metal layers. Higher-level metal layers are usually occupied by ground and supply routes. Further connecting the gate of the access transistor to higher-level metal layers to access the bit-line means traversing through contact regions and vias. Such signal path may increase resistance and capacitance on the bit-line. In some embodiments, a memory array is split into two or more subarrays with bit-line multiplexers or selection circuitries between the subarrays. By splitting the memory array, bit-line routes are split along the subarrays via the selection circuitries. The selection circuitries decouple the bit-lines into separate bit-line routes which allow the capacitance on the bit-lines to reduce as parasitic capacitance from the bit-line routes is reduced.

Further, by splitting the array and thus the bit-line, the traditional bit-line is no longer driving all the access transistors in a row of the memory array. By using one of the two split bit-lines as the main bit-line, the main bit-line has lower capacitance which can result in faster sensing since the voltage for sensing on the bit-lines is developed faster due to lower parasitic capacitance. Also, since the split bit-lines (e.g., the left-side bit-line and the right-side bit-line) have lower parasitic capacitance, the access transistor of the selected row can be switched faster which results in higher memory performance. By lowering the parasitic capacitance on the split bit-lines, the polarization density requirements are also reduced. Lowering the parasitic capacitance on the split bit-lines facilitates a larger array design before a sense amplifier is placed. For example, the number of memory bit-cells on the same bit-line can be larger. The split bit-lines improve the effective signal margin for a given amount of parasitic capacitance on the bit-line. Since the bit-line parasitic is reduced for a given sense margin, a larger memory array can be implemented. In various embodiments, each split bit-line drives a reduced capacitive load while providing fast sense voltage development.

In some embodiments the split bit-lines may be buried bit-lines while the main bit-line may be routed above the active devices. Here buried bit-lines are metal routes below the active devices. The buried bit-lines further frees up routing space for the bit-cells. In some embodiments, the main bit-line coupled to the selection circuitry between the subarrays is routed as a buried bit-line while the split bit-lines are routed above the active devices. In some embodiments, the main bit-line and the split bit-lines are all routed as buried bit-lines. The option of burying a bit-line allows the flexibility to reduce routing congestion and simplifying fabrication processes above the active devices. Other technical effects will be evident from the various embodiments and figures.

In the following description, numerous details are discussed to provide a more thorough explanation of embodiments of the present disclosure. It will be apparent, however, to one skilled in the art, that embodiments of the present disclosure may be practiced without these specific details. In other instances, well-known structures and devices are shown in block diagram form, rather than in detail, to avoid obscuring embodiments of the present disclosure.

Note that in the corresponding drawings of the embodiments, signals are represented with lines. Some lines may be thicker, to indicate more constituent signal paths, and/or have arrows at one or more ends, to indicate primary information flow direction. Such indications are not intended to be limiting. Rather, the lines are used in connection with one or more exemplary embodiments to facilitate easier understanding of a circuit or a logical unit. Any represented signal, as dictated by design needs or preferences, may actually comprise one or more signals that may travel in either direction, and may be implemented with any suitable type of signal scheme.

It is pointed out that those elements of the figures having the same reference numbers (or names) as the elements of any other figure can operate or function in any manner like that described but are not limited to such.

FIG. 1 illustrates a set of plots showing behavior of a ferroelectric capacitor, a ferroelectric capacitor, and a linear capacitor. Plot 100 compares the transfer function for a linear capacitor, a paraelectric (PE) capacitor (a nonlinear capacitor) and a ferroelectric (FE) capacitor (a nonlinear capacitor). Here, the x-axis is input voltage or voltage across the capacitor, while the y-axis is the charge on the capacitor. The ferroelectric material can be any suitable low voltage FE material that allows the FE material to switch its state by a low voltage (e.g., 100 mV). Threshold in the FE material has a highly nonlinear transfer function in the polarization versus voltage response. The threshold is related to: a) nonlinearity of switching transfer function; and b) the squareness of the FE switching. The nonlinearity of switching transfer function is the width of the derivative of the polarization versus voltage plot. The squareness is defined by the ratio of the remnant polarization to the saturation polarization; perfect squareness will show a value of 1. The squareness of the FE switching can be suitably manipulated with chemical substitution. For example, in PbTiO3 a P-E (polarization-electric field) square loop can be modified by La or Nb substitution to create an S-shaped loop. The shape can be systematically tuned to ultimately yield a nonlinear dielectric. The squareness of the FE switching can also be changed by the granularity of an FE layer. A perfectly epitaxial, single crystalline FE layer will show higher squareness (e.g., ratio is closer to 1) compared to a polycrystalline FE. This perfect epitaxial can be accomplished using lattice matched bottom and top electrodes. In one example, BiFeO (BFO) can be epitaxially synthesized using a lattice matched SrRuO3 bottom electrode yielding P-E loops that are square. Progressive doping with La will reduce the squareness.

Plot 120 shows the charge and voltage relationship for a ferroelectric capacitor. A capacitor with ferroelectric material (also referred to as an FEC) is a nonlinear capacitor with its potential $V_F(Q_F)$ as a cubic function of its charge. Plot 120 illustrates characteristics of an FEC. Plot 120 is a charge-voltage (Q-V) plot for a block of $Pb(Zr_{0.5}Ti_{0.5})O_3$ of area $(100\ nm)^2$ and thickness 30 nm (nanometer). Plot 120 shows local extrema at $+/-V_o$ indicated by the dashed lines. Here, the term $V_c$ is the coercive voltage. In applying a potential V across the FEC, its charge can be unambiguously determined only for $|V|>V_o$. Otherwise, the charge of the FEC is subject to hysteresis effects.

In some embodiments, the FE material comprises a perovskite of the type $ABO_3$, where 'A' and 'B' are two cations of different sizes, and '0' is oxygen which is an anion that bonds to both the cations. Generally, the size of atoms of A is larger than the size of B atoms. In some embodiments, the perovskite can be doped (e.g., by La or lanthanides). In some embodiments, the FE material is perovskite, which includes one or more of: La, Sr, Co, Sr, Ru, Y, Ba, Cu, Bi, Ca, or Ni. For example, metallic perovskites such as: (La,Sr)$CoO_3$, $SrRuO_3$, (La,Sr)$MnO_3$, $YBa_2Cu_3O_7$, $Bi_2Sr_2CaCu_2O_8$, $LaNiO_3$, $BaTiO_3$, $KNbO_3$, $NaTaO_3$, etc. may be used for the FE material. Perovskites can be suitably doped to achieve a spontaneous distortion in a range of 0.3% to 2%. For example, for chemically substituted lead titanate such as Zr in Ti site; La or Nb in Ti site, the concentration of these substitutes is such that it achieves the spontaneous distortion in the range of 0.3% to 2%. For chemically substituted BiFeO3, BrCrO3, BuCoO3 class of materials, La or rare earth substitution into the Bi site can tune the spontaneous distortion. In some embodiments, the FE material is contacted with a conductive metal oxide that includes one of the conducting perovskite metallic oxides exemplified by: La—Sr—CoO3, SrRuO3, La—Sr—MnO3, YBa2Cu3O7, Bi2Sr2CaCu2O8, and LaNiO3.

In some embodiments, the FE material comprises a stack of layers including low voltage FE material between conductive oxides. In various embodiments, when FE material is a perovskite, the conductive oxides are of the type $AA'BB'O_3$. A' is a dopant for atomic site A, it can be an element from the lanthanides series. B' is a dopant for atomic site B, it can be an element from the transition metal elements, especially Sc, Ti, V, Cr, Mn, Fe, Co, Ni, Cu, or Zn. A' may have the same valency of site A, with a different ferroelectric polarizability. In various embodiments, when metallic perovskite is used for the FE material, conductive oxides can include one or more of: $IrO_2$, $RuO_2$, $PdO_2$, $OSO_2$, or $ReO_3$. In some embodiments, the perovskite is doped with La or lanthanides. In some embodiments, thin layer (e.g., approximately 10 nm) perovskite template conductors such as SrRuO3 coated on top of IrO2, RuO2, PdO2, and PtO2, which have a non-perovskite structure but higher conductivity to provide a seed or template for the growth of pure perovskite ferroelectric at low temperatures, are used as conductive oxides. In some embodiments, the conductive oxides include one or more of: Ir, In, Fe, Ru, Pd, Os, or Re.

In some embodiments, ferroelectric materials are doped with s-orbital material (e.g., materials for first period, second period, and ionic third and fourth periods). In some embodiments, f-orbital materials (e.g., lanthanides) are doped to the ferroelectric material to make paraelectric material. Examples of room temperature paraelectric materials include: SrTiO3, Ba(x)Sr(y)TiO3 (where x may be −0.05 or 0.5, and y may be 0.95), HfZrO2, Hf—Si—O, La-substituted PbTiO3, or PMN-PT based relaxor ferroelectrics.

In some embodiments, the FE material comprises one or more of: hafnium (Hf), zirconium (Zr), aluminum (Al), silicon (Si), their oxides, or their alloyed oxides. In some embodiments, the FE material includes one or more of: Al(1-x)Sc(x)N, Ga(1-x)Sc(x)N, Al(1-x)Y(x)N or Al(1-x-y) Mg(x)Nb(y)N, y doped HfO2, where x includes one of: Al, Ca, Ce, Dy, Er, Gd, Ge, La, Sc, Si, Sr, Sn, or Y, wherein 'x' is a fraction. In some embodiments, FE material includes one or more of: bismuth ferrite (BFO), lead zirconate titanate (PZT), BFO with a first doping material, or PZT with a second doping material, wherein the doping material is one of Nb or La; and relaxor ferroelectrics such as PMN-PT.

In some embodiments, the FE material includes bismuth ferrite (BFO) with a first doping material where in the first doping material is one of lanthanum, or any element from the lanthanide series of the periodic table. In some embodiments, the FE material includes lead zirconium titanate (PZT) or PZT with a second doping material, wherein the second doping material is one of La or Nb. In some embodiments, the FE material includes a relaxor ferroelectric including one of: lead magnesium niobate (PMN), lead magnesium niobate-lead titanate (PMN-PT), lead lanthanum zirconate titanate (PLZT), lead scandium niobate (PSN), barium titanium-bismuth zinc niobium tantalum (BT-BZNT), or barium titanium-barium strontium titanium (BT-BST).

In some embodiments, the FE material includes hafnium oxides of the form, Hf(1-x)ExOy where E can be Al, Ca, Ce, Dy, Er, Gd, Ge, La, Sc, Si, Sr, Sn, or Y. In some embodiments, the FE material includes niobate type compounds LiNbO3, LiTaO3, lithium iron tantalum oxy fluoride, barium strontium niobate, sodium barium niobate, or potassium strontium niobate.

In some embodiments, the FE material comprises multiple layers. For example, alternating layers of [Bi2O2]2+, and pseudo-perovskite blocks (Bi4Ti3O12 and related Aurivillius phases), with perovskite layers that are 'n' octahedral layers in thickness can be used. In some embodiments, the FE material comprises organic material. For example, polyvinylidene fluoride or polyvinylidene difluoride (PVDF).

In some embodiments, the FE material comprises hexagonal ferroelectrics of the type h-RMnO3, where R is a rare earth element which includes one of cerium (Ce), dysprosium (Dy), erbium (Er), europium (Eu), gadolinium (Gd), holmium (Ho), lanthanum (La), lutetium (Lu), neodymium (Nd), praseodymium (Pr), promethium (Pm), samarium (Sm), scandium (Sc), terbium (Tb), thulium (Tm), ytterbium (Yb), and yttrium (Y). The ferroelectric phase is characterized by a buckling of the layered MnO5 polyhedra, accompanied by displacements of the Y ions, which lead to a net electric polarization. In some embodiments, hexagonal FE includes one of: YMnO3 or LuFeO3. In various embodiments, when the FE material comprises hexagonal ferroelectrics, the conductive oxides are of A2O3 (e.g., In2O3, Fe2O3) and ABO3 type, where 'A' is a rare earth element and B is Mn.

In some embodiments, the FE material comprises improper FE material. An improper ferroelectric is a ferroelectric where the primary order parameter is an order mechanism such as strain or buckling of the atomic order. Examples of improper FE material are LuFeO3 class of materials or super lattice of ferroelectric and paraelectric materials PbTiO3 (PTO) and SnTiO3 (STO), respectively, and LaAlO3 (LAO) and STO, respectively. For example, a super lattice of [PTO/STO]n or [LAO/STO]n, where 'n' is between 1 to 100. In some embodiments, the paraelectric material includes one of: SrTiO3, Ba(x)Sr(y)TiO3 (where x is −0.5, and y is 0.95), BaTiO3, HfZrO2, Hf—Si—O, La-substituted PbTiO3, or PMN-PT based relaxor ferroelectrics.

Figure 2:
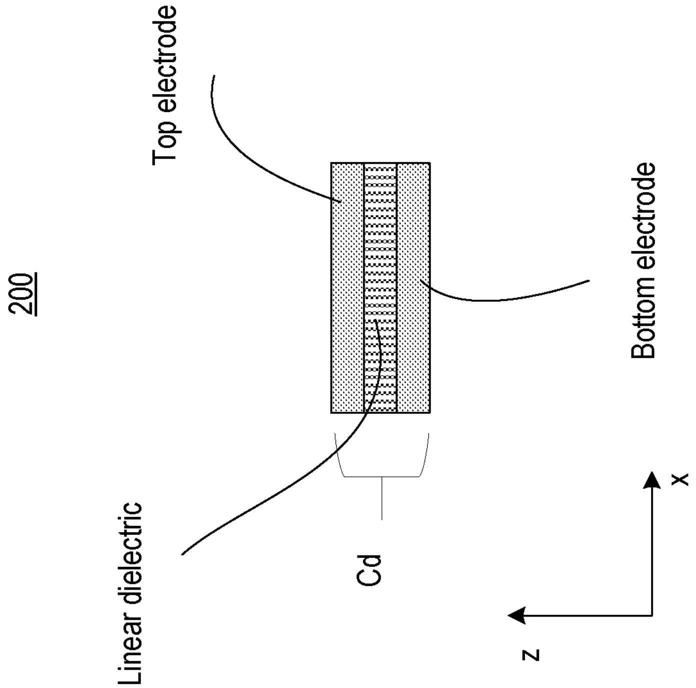
FIG. 2 illustrates a planar linear capacitor structure, in accordance with some embodiments.

FIG. 2 illustrates planar linear capacitor structure 200, in accordance with some embodiments. In some embodiments, capacitors for the multi-input capacitive structures are linear capacitors. These capacitors can take any planar form. One such form is illustrated in FIG. 2. Here, planar capacitor structure 200 is a metal-insulator-metal (MIM) capacitor comprising a bottom electrode, a top electrode, and a linear dielectric between the top electrode and the bottom electrode as shown. In some embodiments, conductive oxide layer(s) are formed between the bottom electrode and the linear dielectric. In some embodiments, conductive oxide layer(s) are formed between the top electrode and the linear dielectric. Examples of conductive oxides include: $IrO_2$, $RuO_2$, $PdO_2$, $OsO_2$, or $ReO_3$. In some examples, conductive oxides are of the form A2O3 (e.g., In2O3, Fe2O3) and ABO3 type, where 'A' is a rare earth element and 'B' is Mn.

In some embodiments, the dielectric layer includes one or more of: SiO2, Al203, Li2O, HfSiO4, Sc2O3, SrO, HfO2, ZrO2, Y2O3, Ta2O5, BaO, WO3, MoO3, or TiO2. Any suitable conductive material may be used for the top electrode and the bottom electrode. For example, the material or the electrode may include one or more of: Cu, Al, Ag, Au, W, or Co. In some embodiments, the thickness along the z-axis of the top electrode and bottom electrode is in a range of 1 nm to 30 nm. In some embodiments, the thickness along the z-axis of the dielectric is in a range of 1 nm to 30 nm. In some embodiments, the thickness along the z-axis of the conductive oxide is in a range of 1 nm to 30 nm.

Figure 3A:
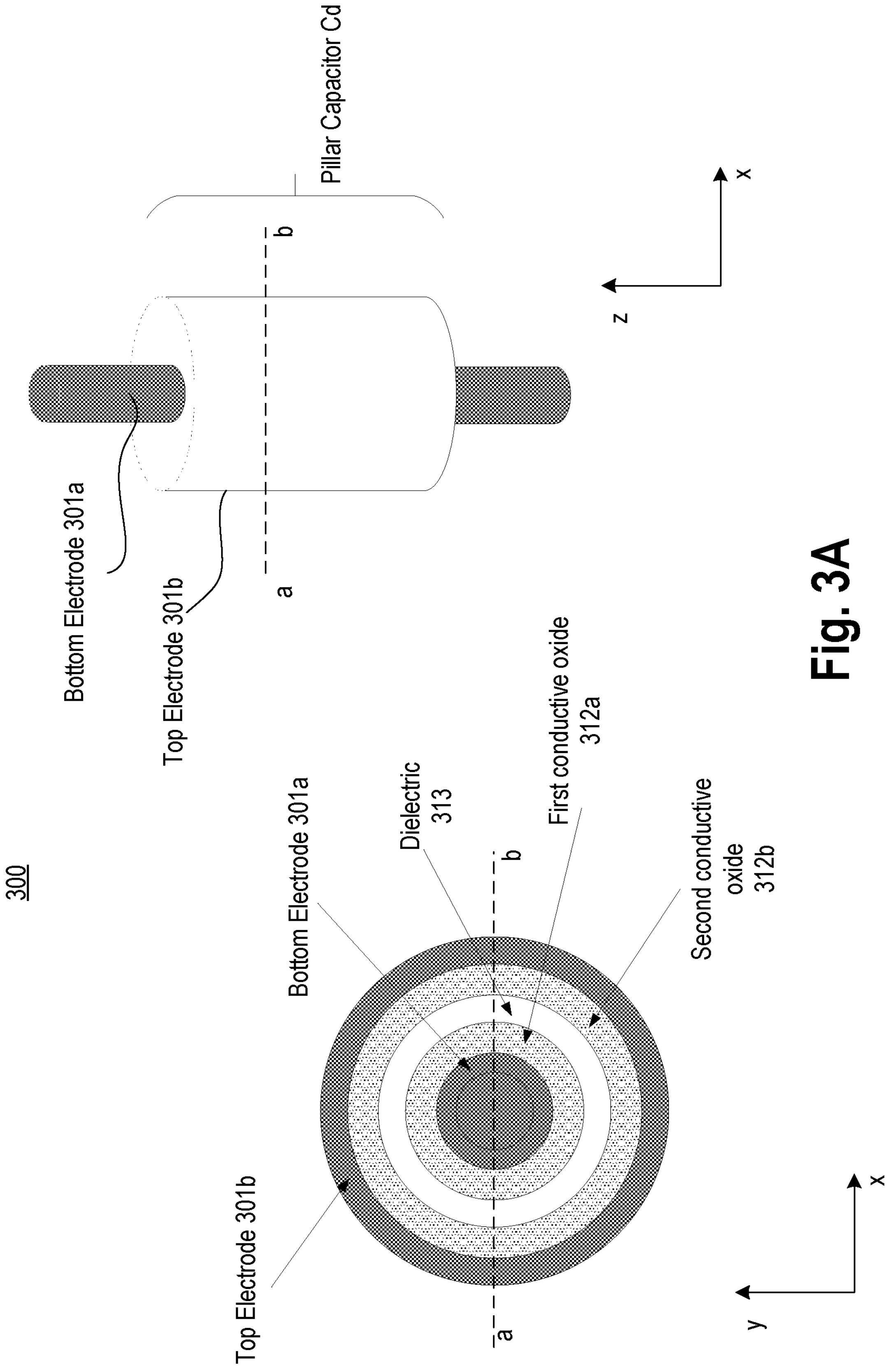
FIG. 3A illustrates a non-planar linear capacitor structure, in accordance with some embodiments.

FIG. 3A illustrates non-planar linear capacitor structure 300, in accordance with some embodiments. In some embodiments, non-planar capacitor structure 300 is rectangular in shape. Taking the cylindrical shaped case for example, in some embodiments, the layers of non-planar capacitor structure 300 from the center going outwards include bottom electrode 301*a*, first conductive oxide 312*a*, linear dielectric material 313, second conductive oxide 312*b*, and top electrode 301*b*. A cross-sectional view along the "ab" dashed line is illustrated in the middle of FIG. 3A. In some embodiments, conducting oxides are removed and the linear dielectric is directly connected to top electrode 301*b* and bottom electrodes 301*a*. In some embodiments, linear dielectric material 313 can include any suitable dielectric, where the thickness of dielectric film is a range of 1 nm to 20 nm. In some embodiments, linear dielectric material 313 comprises a higher-K dielectric material. In some embodiments, linear dielectrics include one of: SIO2, Al203, Li2O, HfSiO4, Sc2O3, SrO, HfO2, ZrO2, Y2O3, Ta2O5, BaO, WO3, MoO3, or TiO2. The high-k dielectric material may include elements such as: zinc, niobium, scandium, lean yttrium, hafnium, silicon, strontium, oxygen, barium, titanium, zirconium, tantalum, aluminum, and lanthanum. Examples of high-k materials that may be used in the gate dielectric layer include one or more of: lead zinc niobate, hafnium oxide, lead scandium tantalum oxide, hafnium silicon oxide, yttrium oxide, aluminum oxide, lanthanum oxide, barium strontium titanium oxide, lanthanum aluminum oxide, titanium oxide, zirconium oxide, tantalum oxide, or zirconium silicon oxide.

In some embodiments, first conductive oxide 312*a* is conformally deposited over bottom electrode 301*a*. In some embodiments, dielectric material 313 is conformally deposited over first conductive oxide 312*a*. In some embodiments, second conductive oxide 312*b* is conformally deposited over dielectric material 313. In some embodiments, top electrode 301*b* is conformally deposited over second conductive oxide 312*b*. In some embodiments, bottom electrode 301*a* is in the center while top electrode 301*b* is on an outer circumference of non-planar capacitor structure 300.

In some embodiments, material for bottom electrode 301*a* may include one or more of: Cu, Al, Ag, Au, W, or Co, or their alloys. In some embodiments, material for first conductive oxide 312*a* include: $IrO_2$, $RuO_2$, $PdO_2$, $OsO_2$, or $ReO_3$. In some examples, conductive oxides are of the form A2O3 (e.g., In2O3, Fe2O3) and ABO3 type, where 'A' is a rare earth element and 'B' is Mn. In some embodiments, material for second conductive oxide 312*b* may be same as the material for first conductive oxide 312*a*. In some embodiments, material for top electrode 301*b* may include one or more of: Cu, Al, Ag, Au, W, or Co, or their alloys.

In some embodiments, a first refractive inter-metallic layer (not shown) is formed between dielectric material 313 and first conductive oxide 312*a*. In some embodiments, a second refractive inter-metallic layer (not shown) is formed between dielectric capacitor material 313 and second conductive oxide 312*b*. In these cases, the first and second refractive inter-metallic layers are directly adjacent to their respective conductive oxide layers and to dielectric capacitor material 313. In some embodiments, refractive inter-metallic maintains the capacitive properties of the dielectric capacitor material 313. In some embodiments, refractive inter-metallic comprises Ti and Al (e.g., TiAl compound). In some embodiments, refractive inter-metallic comprises one or more of Ta, W, and/or Co.

For example, refractive inter-metallic includes a lattice of Ta, W, and Co. In some embodiments, refractive inter-metallic includes one of: Ti—Al such as Ti3Al, TiAl, TiAl3; Ni—Al such as Ni3Al, NiAl3, NiAl; Ni—Ti, Ni—Ga, Ni2MnGa; FeGa, Fe3Ga; borides, carbides, or nitrides. In some embodiments, TiAl material comprises Ti-(45-48)Al-(1-10)M (at X trace amount %), with M being at least one element from: V, Cr, Mn, Nb, Ta, W, and Mo, and with trace amounts of 0.1-5% of Si, B, and/or Mg. In some embodiments, TiAl is a single-phase alloy γ(TiAl). In some embodiments, TiAl is a two-phase alloy γ(TiAl)+α2(Ti3Al). Single-phase γ alloys contain third alloying elements such as Nb or Ta that promote strengthening and additionally enhance oxidation resistance. The role of the third alloying elements in the two-phase alloys is to raise ductility (V, Cr, Mn), oxidation resistance (Nb, Ta) or combined properties. Additions such as Si, B and Mg can markedly enhance other properties. The thicknesses of the layers of capacitor 300 in the x-axis are in the range of 1 nm to 30 nm. In some embodiments, refractive inter-metallic layers are not used for non-planar capacitor structure 300.

Figure 3B:
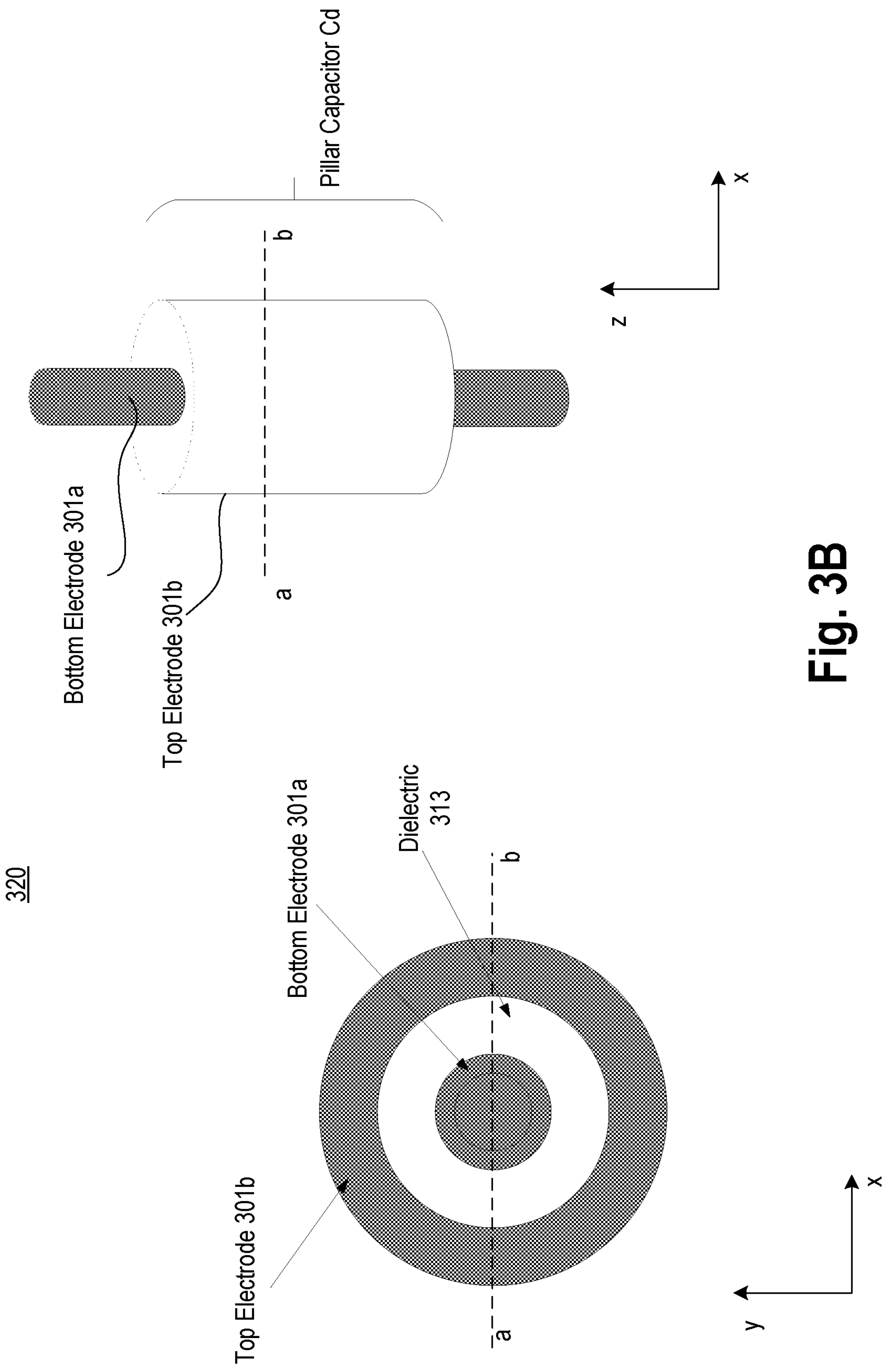
FIG. 3B illustrates a non-planar linear capacitor structure without conductive oxides, in accordance with some embodiments.

FIG. 3B illustrates a non-planar linear capacitor structure 320 without conductive oxides, in accordance with some embodiments. Compared to FIG. 3A, here the linear dielectric is adjacent to the top electrode and the bottom electrode.

FIG. 4A illustrates a planar ferroelectric or paraelectric capacitor structure, in accordance with some embodiments. FIG. 4B illustrates three planar ferroelectric or paraelectric capacitor structures, respectively, in accordance with some embodiments.

In some embodiments, capacitors are ferroelectric or paraelectric capacitors. These capacitors can take any planar form. One such simplified form is illustrated in FIG. 4A. Here, planar capacitor structure 400 is a metal-insulator-metal (MIM) capacitor comprising a bottom electrode, a top electrode, and a ferroelectric dielectric between the top electrode and the bottom electrode as shown. In some embodiments, conductive oxide layer(s) are formed between the bottom electrode and the ferroelectric dielectric.

In some embodiments, planar capacitor 423*a* includes encapsulation portions 421*a* and 421*b* (also referred to as sidewall barrier seal) that are adjacent to the side walls of the plurality of layers of the planar capacitor. In some embodiments, planar capacitor 423*b* incudes encapsulation portions 421*c* and 421*d* that are partially adjacent to sidewall barrier seal 421*a* and 421*b*, and refractive inter-metallic layers 411*a*. In some embodiments, sidewall barrier seal 421*a* and 421*b* extend in the z-plane. In various embodiments, encapsulation portions 421*c* and 421*d* terminate into a via (not shown). The material for encapsulation portions 421*c* and 421*d* is the same as those for sidewall barrier seal 421*a* and

421*b*. In some embodiments, the barrier material includes one or more of an oxide of: Ti, Al, or Mg.

In some embodiments, planar capacitor 423*c* includes encapsulation portions 421*e* and 421*f* that are partially adjacent to sidewall barrier seal 421*a* and 421*b*, and refractive inter-metallic layers 411*b*. In various embodiments, encapsulation portions 421*e* and 421*f* terminate into a via (not shown). In some embodiments, encapsulation portions 421*e* and 421*f* extend in an x-plane. The material for encapsulation portions 421*e* and 421*f* is the same as those for sidewall barrier seal 421*a* and 421*b*. Material for 421*a* and 421*b* includes one or more of: Ti—Al—O, $Al_2O_3$, MgO, or nitride. Material for 421*a* and 421*b* is a sidewall barrier (e.g., insulative material) that protects the stack of layers from hydrogen and/or oxygen diffusion. In various embodiments, the sidewall barrier material is not an interlayer dielectric (ILD) material. In some embodiments, the lateral thickness (along x-axis) of the sidewall barrier seal 421*a/b* (insulating material) is in a range of 0.1 nm to 20 nm. In some embodiments, sidewall barriers are in direct contact with ILD.

In some embodiments, planar capacitors 423*a*, 423*b*, and 423*c* comprise a number of layers stacked together to form a planar capacitor. These layers may extend in an x-plane when the capacitor is a planar capacitor. In some embodiments, the stack of layers includes refractive inter-metallic 411*a/b* as a barrier material; conductive oxides 412*a/b*, and FE material 413. FE material 413 can be any of the FE materials discussed herein. In some embodiments, refractive inter-metallic 411*a/b* are removed, and electrodes are in direct contact with conductive oxides 412*a/b*.

In some embodiments, refractive inter-metallic 411*a/b* maintains the FE properties of the FE capacitor. In the absence of refractive inter-metallic 411*a/b*, the ferroelectric material 413 of the capacitor may lose its potency. In some embodiments, refractive inter-metallic 411*a/b* comprises Ti and Al (e.g., TiAl compound). In some embodiments, refractive inter-metallic 411*a/b* comprises one or more of Ta, W, and/or Co. For example, refractive inter-metallic 411*a/b* includes a lattice of Ta, W, and Co.

In some embodiments, refractive inter-metallic 411*a/b* is part of a barrier layer which is a super lattice of a first material and a second material, wherein the first material includes Ti and Al (e.g., TiAl) and the second material includes Ta, W, and Co (e.g., layers of Ta, W, and Co together). In various embodiments, the lattice parameters of the barrier layer are matched with the lattice parameters of the conductive oxides and/or FE material 413.

In some embodiments, refractive inter-metallic 411*a/b* includes one of: Ti—Al such as Ti3Al, TiAl, TiAl3; Ni—Al such as Ni3Al, NiAl3, NiAl; Ni—Ti, Ni—Ga, Ni2MnGa; FeGa, Fe3Ga; borides, carbides, or nitrides. In some embodiments, TiAl material comprises Ti-(45-48)Al-(1-10)M (at X trace amount %), with M being at least one element from: V, Cr, Mn, Nb, Ta, W, and Mo, and with trace amounts of 0.1-5% of Si, B, and/or Mg. In some embodiments, TiAl is a single-phase alloy $\gamma$(TiAl). In some embodiments, TiAl is a two-phase alloy $\gamma$(TiAl)+$\alpha 2$(Ti3Al). Single-phase $\gamma$ alloys contain third alloying elements such as Nb or Ta that promote strengthening and additionally enhance oxidation resistance. The role of the third alloying elements in the two-phase alloys is to raise ductility (V, Cr, Mn), oxidation resistance (Nb, Ta) or combined properties. Additions such as Si, B, and Mg can markedly enhance other properties. In some embodiments, barrier layer 411*a* is coupled to a top electrode. In some embodiments, sidewall barrier seal 421*a/b* (insulating material) is placed around layers 411*a*, 412*a*, 413, 412*b*, and 411*b* along while the top and bottom surfaces of 411*a* and 411*b* are exposed for coupling to metal layers, vias, or a metallic pedestal.

In some embodiments, conductive oxide layer(s) are formed between the top electrode and the ferroelectric dielectric. Examples of conductive oxides include: $IrO_2$, $RuO_2$, $PdO_2$, $OSO_2$, or $ReO_3$. In some examples, conductive oxides are of the form A2O3 (e.g., $In_2O_3$, $Fe_2O_3$) and $ABO_3$ type, where 'A' is a rare earth element and 'B' is Mn.

Any suitable conductive material may be used for the top electrode and the bottom electrode. For example, the material or the electrode may include one or more of: Cu, Al, Ag, Au, W, or Co. In some embodiments, the thickness along the z-axis of the top electrode and bottom electrode is in a range of 1 nm to 30 nm. In some embodiments, the thickness along the z-axis of the dielectric is in a range of 1 nm to 30 nm. In some embodiments, the thickness along the z-axis of the conductive oxide is in a range of 1 nm to 30 nm.

FIG. 4C illustrates pedestal 440 that connects to the top and/or bottom electrodes of the planar ferroelectric or paraelectric capacitor, in accordance with some embodiments. In some embodiments, pedestal 440 comprises pedestal metal 441 and sidewall barrier 442. In some embodiments, barrier 442 includes materials to protect hydrogen and/or oxygen from interacting with pedestal metal 441. In some embodiments, barrier 442 comprises Ti—Al—O, $Al_2O_3$, MgO, or nitride. In some embodiments, pedestal metal 441 includes one of Cu, Al, Ag, Au, W, or Co.

Figure 5A:
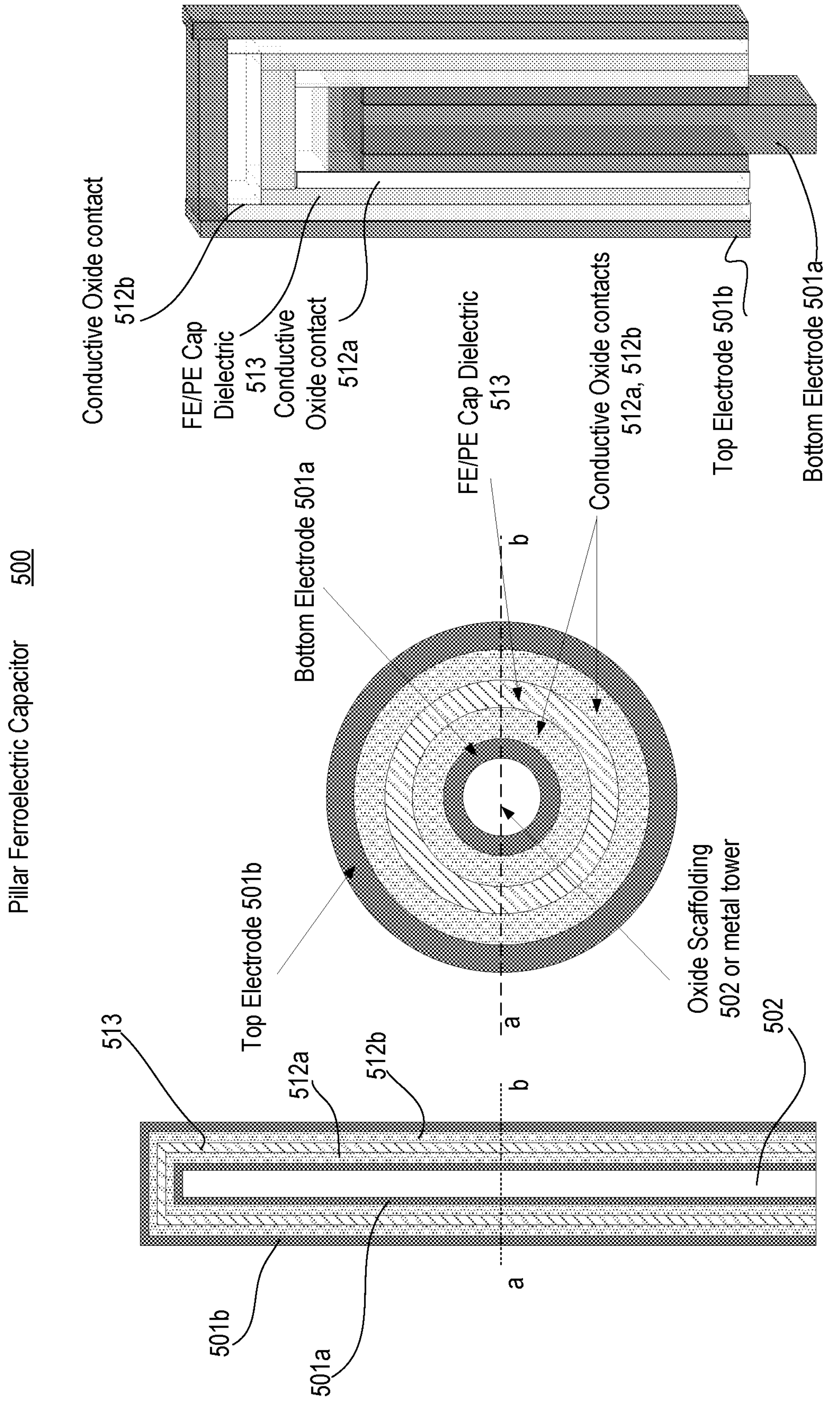
FIG. 5A illustrates a non-planar ferroelectric or paraelectric capacitor structure, in accordance with some embodiments.

FIG. 5A illustrates a non-planar ferroelectric (FE) or paraelectric (PE) capacitor structure, in accordance with some embodiments. In some embodiments, non-planar capacitor structure 500 is rectangular in shape. Taking the cylindrical shaped case for example, in some embodiments, the layers of non-planar capacitor structure 500 from the center going outwards include bottom electrode 501*a*, first conductive oxide 512*a*, ferroelectric (FE) or paraelectric (PE) dielectric material 513, second conductive oxide 512*b*, and top electrode 501*b*. In some embodiments, conducting oxides are removed and the FE/PE dielectric is directly connected to top electrode 501*b* and bottom electrode 501*a*. In some embodiments, ferroelectric dielectric material 513 can include any suitable dielectric, where the thickness of FE/PE dielectric film is a range of 1 nm to 20 nm. In some embodiments, FE/PE dielectric material 513 includes any one of the materials discussed herein for ferroelectrics or paraelectric. In some embodiments, central region 502 of capacitor 500 is filled with oxide or an insulative material. In some embodiments, central region 502 is filled with metal that abuts with bottom electrode 501*a* to form a thicker bottom electrode.

In some embodiments, first conductive oxide 512*a* is conformally deposited over bottom electrode 501*a*. In some embodiments, FE/PE dielectric material 513 is conformally deposited over first conductive oxide 512*a*. In some embodiments, second conductive oxide 512*b* is conformally deposited over FE/PE dielectric material 513. In some embodiments, top electrode 501*b* is conformally deposited over second conductive oxide 512*b*. In some embodiments, bottom electrode 501*a* is in the center while top electrode 501*b* is on an outer circumference of non-planar capacitor structure 500.

In some embodiments, material for bottom electrode 501*a* may include one or more of: Cu, Al, Ag, Au, W, or Co, or their alloys. In some embodiments, material for first conductive oxide 512*a* include: $IrO_2$, $RuO_2$, $PdO_2$, $OsO_2$, or $ReO_3$. In some examples, conductive oxides are of the form A2O3 (e.g., In2O3, Fe2O3) and ABO3 type, where 'A' is a rare earth element and 'B' is Mn. In some embodiments, material for second conductive oxide 512*b* may be same as the material for first conductive oxide 512*a*. In some embodiments, material for top electrode 501*b* may include one or more of: Cu, Al, Ag, Au, W, or Co, or their alloys.

In some embodiments, a first refractive inter-metallic layer (not shown) is formed between dielectric material 513 and first conductive oxide 512*a*. In some embodiments, a second refractive inter-metallic layer (not shown) is formed between FE/PE dielectric capacitor material 513 and second conductive oxide 512*b*. In these cases, the first and second refractive inter-metallic layers are directly adjacent to their respective conductive oxide layers and to FE/PE dielectric capacitor material 513. In some embodiments, refractive inter-metallic maintains the capacitive properties of the dielectric capacitor material 513. In some embodiments, refractive inter-metallic comprises Ti and Al (e.g., TiAl compound). In some embodiments, refractive inter-metallic comprises one or more of Ta, W, and/or Co.

For example, refractive inter-metallic includes a lattice of Ta, W, and Co. In some embodiments, refractive inter-metallic includes one of: Ti—Al such as Ti3Al, TiAl, TiAl3; Ni—Al such as Ni3Al, NiAl3, NiAl; Ni—Ti, Ni—Ga, Ni2MnGa; FeGa, Fe3Ga; borides, carbides, or nitrides. In some embodiments, TiAl material comprises Ti-(45-48)Al-(1-10)M (at X trace amount %), with M being at least one element from: V, Cr, Mn, Nb, Ta, W, and Mo, and with trace amounts of 0.1-5% of Si, B, and/or Mg. In some embodiments, TiAl is a single-phase alloy γ(TiAl). In some embodiments, TiAl is a two-phase alloy γ(TiAl)+α2(Ti3Al). Single-phase γ alloys contain third alloying elements such as Nb or Ta that promote strengthening and additionally enhance oxidation resistance. The role of the third alloying elements in the two-phase alloys is to raise ductility (V, Cr, Mn), oxidation resistance (Nb, Ta) or combined properties. Additions such as Si, B and Mg can markedly enhance other properties. The thicknesses of the layers of capacitor 500 in the x-axis are in the range of 1 nm to 30 nm. In some embodiments, refractive inter-metallic layers are not used for non-planar capacitor structure 500.

Figure 5B:
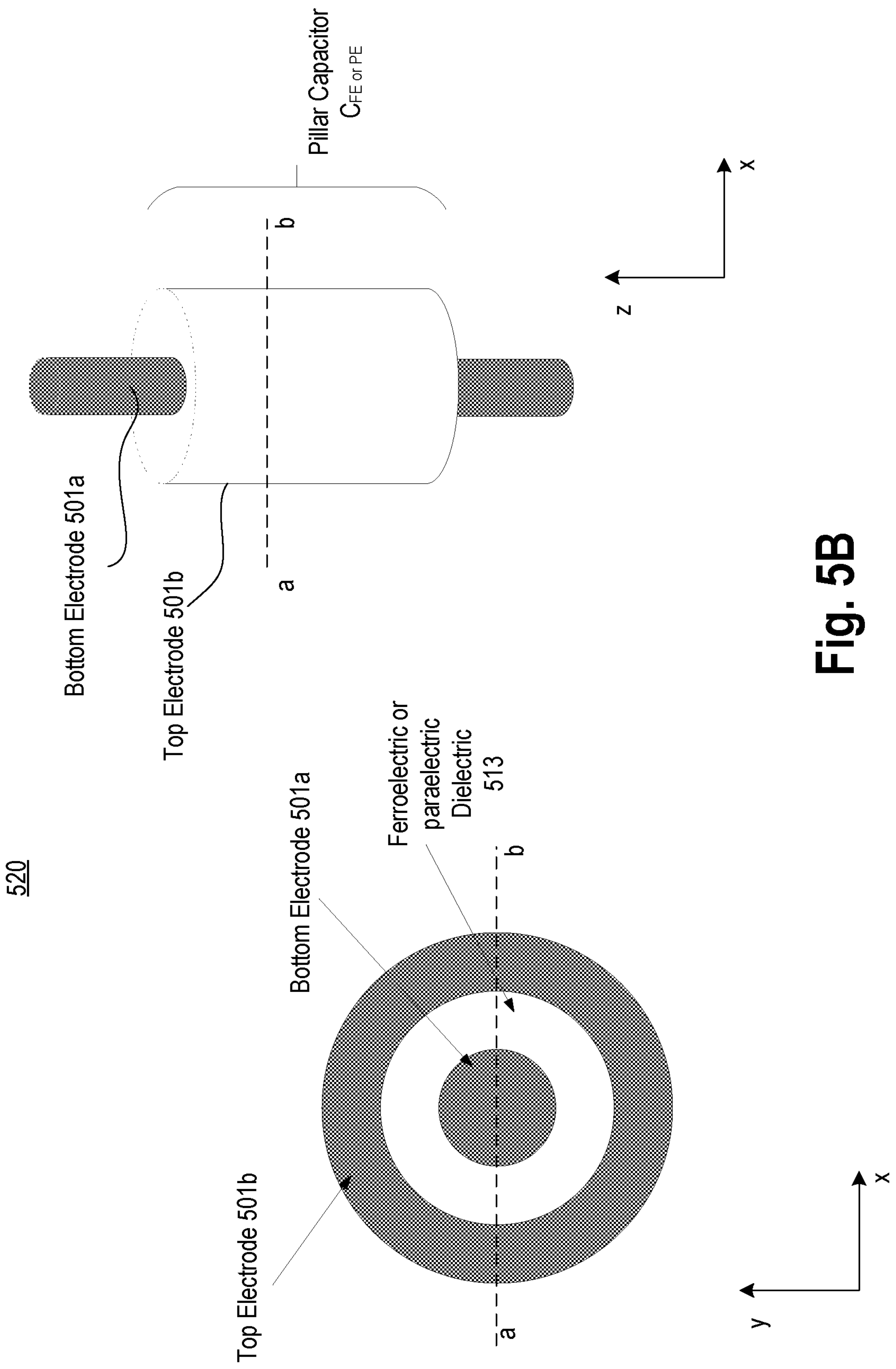
FIG. 5B illustrates a non-planar ferroelectric or paraelectric capacitor structure without conductive oxides, in accordance with some embodiments.

FIG. 5B illustrates a non-planar ferroelectric or paraelectric capacitor structure 520 without conductive oxides, in accordance with some embodiments. Compared to non-planar capacitor structure 500, here first conductive oxide 512*a* and second conductive oxide 512*b* are removed and ferroelectric material 513 is adjacent to top electrode 501*b* and bottom electrode 501*a* as shown.

The various embodiments illustrated here for ferroelectric material can replace ferroelectric material with anti-ferroelectric material. Examples of anti-ferroelectric (AFE) material include lead zirconate titanate (PZT) with high Zr doping, La-doped PZT with high Zr doping, HfSiO2 with high Si doping, HfZrO2 (HZO) with high Zr doping, ZrO2, PbZrO3 (lead zirconate), NH4H2PO4 (ammonium dihydrogen phosphate (ADP), NaNbO3 (sodium niobate), and K doped NaNbO3, etc. Table 1 also describes some bulk anti-ferroelectric materials, with various physical/chemical modifications for enhancing energy storage density.

TABLE 1

| Material name | Physical/Chemical Modifications | Energy Density (J/cm$^3$) | Electric Field (kV/cm) |
|---|---|---|---|
| (Pb0.97La0.02)(Zr0.97Ti0.03)O3 | 3 wt % glass (PbO-B2O3-SiO2-ZnO) | 3.1 | 581 |
| (Pb0.97La0.02)(Zr0.97Ti0.03)03 | without glass | 1.4 | 581 |
| Pb0.99Nb0.02[(Zr0.57Sn0.43)1-yTiy]0.98O3 | with half electrode | 1.30 | 70 |
| Pb0.99Nb0.02[(Zr0.57Sn0.43)1-yTiy]0.98O3 | with full electrode | 1.19 | 70 |
| (Pb0.94-xLa0.04Bax)[(Zr0.60Sn0.40)0.841Ti0.16]O3 | x = 0 (0 MPa) | 0.35 | 30 |
| (Pb0.94-xLa0.04Bax)[(Zr0.60Sn0.40)0.841Ti0.16]O3 | x = 0.02 (20 MPa) | 0.38 | 30 |
| Pb0.99Nb0.02[(Zr0.60Sn0.40)0.95Ti0.05]O3 | — | 0.62 | 56 |
| Pb0.97La0.02(Zr0.56Sn0.35Ti0.09)O3 | 4 wt % glass (CdO-Bi2O3-PbO-ZnO-Al2O3-B2O3-SiO2) | 3.3 | 150 |
| Pb0.97La0.02(Zr0.56Sn0.35Ti0.09)O3 | Without glass | 1.9 | 110 |
| (Pb0:97La0:02)(Zr0:92Sn0:05Ti0:03)O3 | 3% glass (0.8PbO-0.2B2O3) | 7.4 | 475 |
| (Pb0:97La0:02)(Zr0:92Sn0:05Ti0:03)O3 | Without glass | 4.5 | 320 |
| Pb0.97La0.02(Zr0.95Ti0.05)O3 | — | 12.4 | 1120 |
| (Pb0.85Ba0.08Sr0.03La0.03)(Zr0.74Sn0.22Ti 0.04) | — | 1.2 | 100 |
| (Bi½Na½)0.94Ba0.06]La0.8Zr0.2TiO3 | — | 1.58 | 85 |
| (Ba0.1La0.02)(Zr0.675Sn0.275Ti0.05)O3 | — | 2.05 | 70 |
| 0.75(0.80Bi½Na½TiO3-0.20Bi½K½TiO3)-0.25SrTiO3 | — | 0.84 | 100 |
| Pb0.97La0.02(Zr0.50Sn0.45Ti0.05)O3 | — | 5.6 | 400 |
| (Pb0.858Ba0.1La0.02Y0.008)(Zr0.65Sn0.3Ti 0.05)O3-(Pb0.97La0.02)(Zr0.9Sn0.05Ti0.05)O3 | — | 4.65 | 200 |
| 0.89Bi0.5Na0.5TiO3-0.06BaTiO3-0.05K0.5Na0.5NbO3 | double stage sintering | 0.90 | 100 |
| (Pb0.858Ba0.1La0.02Y0.008)(Zr0.65Sn0.3Ti 0.05)O3-(Pb0.97La0.02)(Zr0.9Sn0.05Ti0.05)O3 | spark plasma sintering | 6.40 | 275 |

TABLE 1-continued

| Material name | Physical/Chemical Modifications | Energy Density (J/cm$^3$) | Electric Field (kV/cm) |
|---|---|---|---|
| (Pb0.858Ba0.1La0.02Y0.008)(Zr0.65Sn0.3Ti 0.05)O3-(Pb0.97La0.02)(Zr0.9Sn0.05Ti0.05)O3 | conventional sintering | 4.65 | 200 |
| (Na1 xCax)(Nb1 xZrx)O3 x = 0.04 | conventional sintering | 0.91 | 130 |
| (Pb0.92La0.04Ba0.02)[(Zr0.60Sn0.40)0.84Ti 0.16]O3 | at 90 MPa | 0.91 | 60 |
| 0.91(Bi0.5Na0.5)TiO3-0.07BaTiO3-0.02(K0.5Na0.5)NbO3 | at 100 MPa | 0.387 | 60 |
| (Pb0.96La0.04)(Zr0.90Ti0.10)O3 | at 100 MPa | 0.698 | 60 |

Figure 6A:
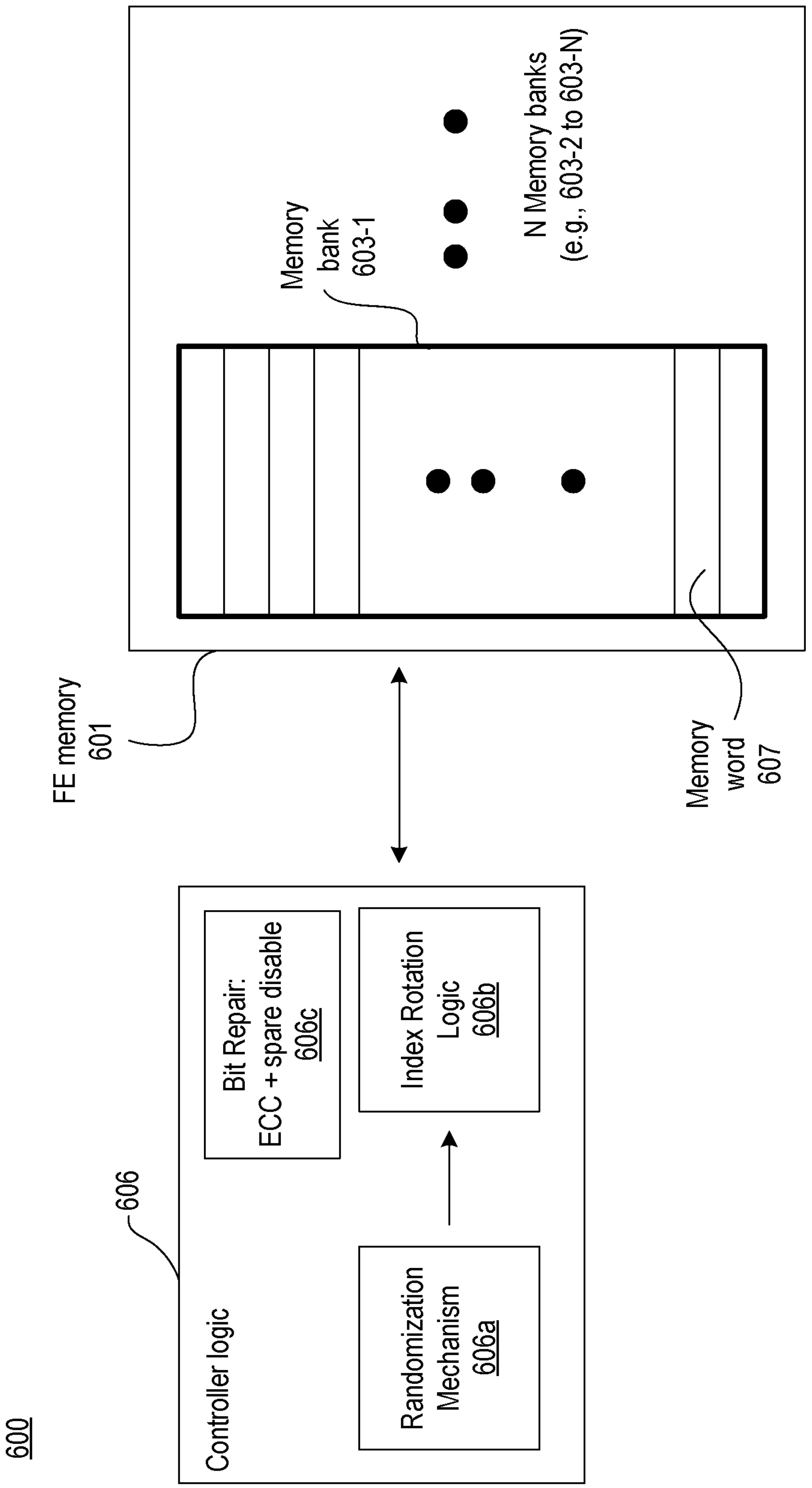
FIG. 6A illustrates a high-level endurance enhancement architecture for a paraelectric (PE) or ferroelectric (FE) memory, in accordance with some embodiments.

FIG. 6A illustrates a high-level endurance enhancement architecture 600 for a paraelectric (PE) or ferroelectric (FE) memory, in accordance with some embodiments. Architecture 600 comprises memory array 601 and controller logic 606. In various embodiments, memory array 601 is memory with non-linear polar material. For example, memory array 601 includes bit-cells that comprise at least one transistor and at least one capacitor coupled to it, where the capacitor has non-linear polar material. Examples of non-linear material include ferroelectric (FE) material, paraelectric (PE) material, and non-linear dielectric material.

In some embodiments, FE memory array 601 includes a plurality of memory banks (e.g., 603-1 through 603-N, where 'N' is a number). Each memory bank (e.g., 603-1) includes a plurality of memory words (e.g., memory word 607). Each memory word includes a plurality of memory bit-cells. For the sake of simplicity, other memory components are not shown such as write drivers, column multiplexers, sense-amplifiers, etc.

In various embodiments, controller logic 606 comprises endurance hardware and/or software to provide memory endurance to memory array 601. In general, memory endurance is needed to ensure write and/or read operations from memory array 601 are reliable. Write endurance is a number of programs and erase cycles that, when applied to a memory block, bank, or word before the memory block, bank, or word, becomes unreliable. The endurance mechanisms of some embodiments include a wear leveling scheme that uses index rotation, outlier compensation to handle weak bits, and random swap injection to mitigate wear out attacks. For the sake of simplicity, memory banks are generally referred to their reference 603 instead of a particular memory bank reference (e.g., 603-1, 603-2, etc.). Embodiments described to the general reference are applicable to an individual particular reference. For example, description of memory bank 603 is applicable for memory banks 603-1, 603-2, through 603-N.

In some embodiments, controller logic 606 (also referred to as refresh logic) comprises random invertible bit matrix 606*a*, index rotation logic 606*b*, and bit repair logic 606*c*. In some embodiments, index rotation logic 606*b* enables random swap injection which randomizes index rotation to obfuscate the mapping from addresses to rotated indexes. In some embodiments, index rotation logic 606*b* randomizes the rotation of gap words in memory bank 603. In some cases, malicious users (or attackers) may write programs that deliberately track the wear leveling scheme described herein. These attackers may attempt to alter a memory reference pattern to continue to stress a single physical line even as the wear leveling scheme assigns that physical line to different addresses. Some embodiments provide a facility to make tracking of the physical lines difficult. This facility makes a random decision (e.g., using an externally generated random number) to either swap or not each time a swap opportunity arises. Over time the randomness injected into the swapping process makes tracking cache lines more difficult.

In some embodiments, index rotation logic 606*b* is used for implementing the wear leveling scheme. In some embodiments, index rotation logic 606*b* rotates the addresses throughout memory bank 603 to perform a wear leveling function. In various embodiments, index rotation logic 606*b* ensures that memory requests are spread across memory locations rather than a single memory location.

In some embodiments, bit repair logic 606*c* includes double error correcting, or triple error detecting error correction code (ECC) to discover new bit errors and spare disable which eliminate memory words with particularly high error rates. Spare disable involves having a buffer of spare cache lines. When cache lines are particularly unreliable, spare disable can swap out unreliable cache lines for the reliable spares. In some embodiments, the spares may be implemented with a memory technology other than FE memory such as static random-access memory (SRAM). In various embodiments, bit repair logic 606*c* addresses the problem of weak memory bits. In some embodiments, each cache line or word 607 in memory bank 603 includes a valid bit. The valid bit indicates whether the data associated with that line/word is stored in the memory or the redundant word array. The redundant word array comprises spares that can be used to compensate for defective words in memory. When accessing memory, controller 606 checks the valid bit, if the valid bit is set then the data is stored in the redundant memory rather than the memory array or bank 603. In various embodiments, ECC is used to identify and/or correct bit errors in both the memory array and the redundant memory. As the ECC discovers bit errors, additional lines may be marked valid and the data stored in the redundant memory location rather than the memory. The various endurance mechanisms discussed herein can be used in any combination or order. Some memory products may select one or more of the endurance mechanisms instead of all three discussed herein. Some memory products may apply all three endurance mechanisms to achieve most endurance for FE memory array 601. These endurance mechanisms are applied to FE memory array 601 to maximize usage of such memory.

Figure 6B:
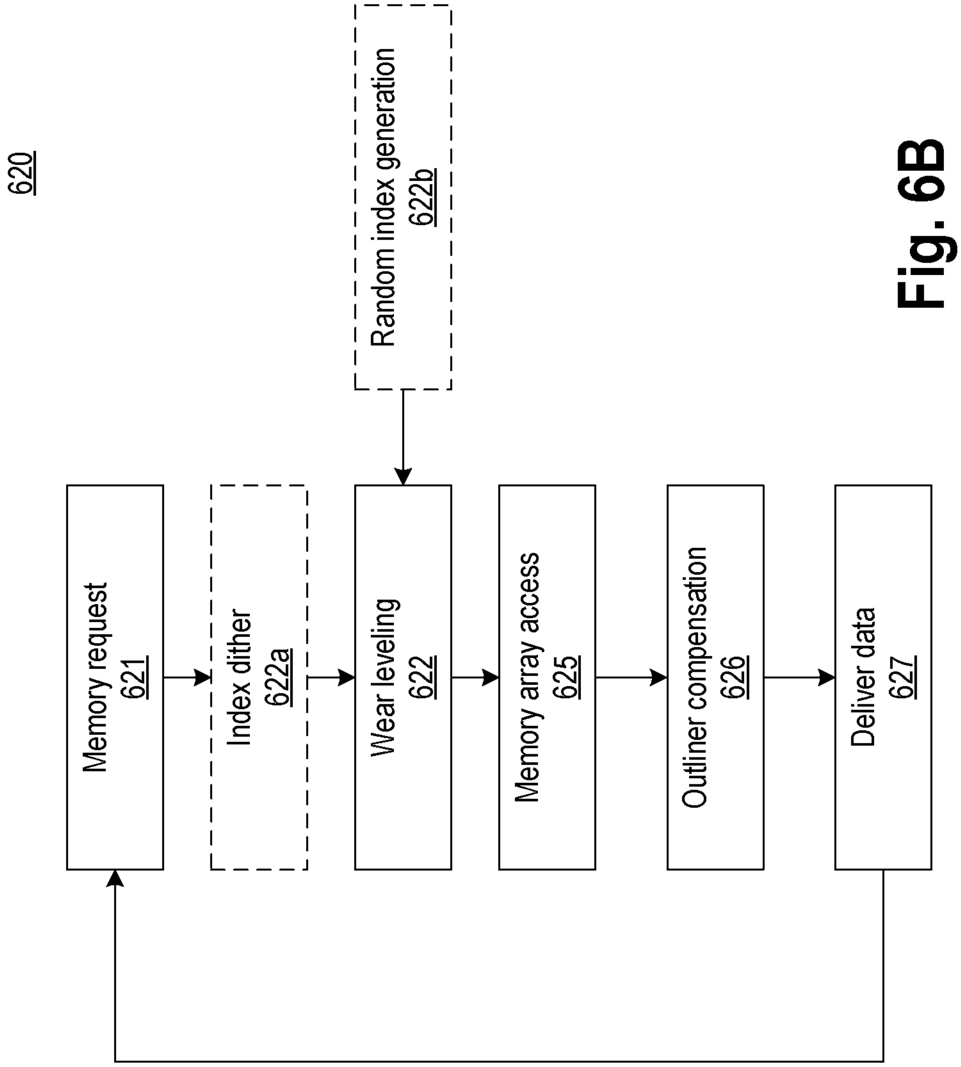
FIG. 6B illustrates a flowchart of memory endurance for the PE and FE memory, in accordance with some embodiments.

FIG. 6B illustrates flowchart 620 of memory endurance for the PE and FE memory, in accordance with some embodiments. While the blocks in flowchart 620 are illustrated in a particular order, the order can be modified. For example, some blocks may be performed before others based on whether read or write operations are being performed. As described herein, the various blocks can be implemented in hardware, software, or a combination of them.

At block 621, controller 606 sends a memory request to memory array 601. This request may be a read request or a write request. If it is a write request, controller 606 applies the wear leveling scheme at block 622. In some embodiments, the wear leveling scheme is linear in that a gap word or gap cache line is swapped with an adjacent word or cache line. In some embodiments, wear leveling is dithered as indicated by block 622*a*. In one such embodiment, the index or pointer to gap word or gap cache line is used to swap the gap word or gap cache line with either an adjacent cell with one higher index or address or with an adjacent cell with one lower index or address. As such, wear leveling is dithered.

In some embodiments, wear leveling is randomized. In one such embodiment, a random index is generated at block 622*b*. This random index is then used to swap the gap word or gap cache line with an adjacent or a non-adjacent word or cache line. In some embodiments, the random index is dithered. This dithered random index is then used for wear leveling.

In some embodiments, if the memory request is a read access (as indicated by block 625), outlier compensation is applied as indicated by block 626. At block 626, controller 606 addresses the problem of weak memory bits by checking a valid bit for the memory word being addressed or accessed. The valid bit indicates whether the data associated with that line or word is stored in the memory or the redundant word array. The redundant word array comprises spares that can be used to compensate for defective words in memory. When accessing memory, controller 606 checks the valid bit, if the valid bit is set then the data is stored in the redundant memory rather than the memory array or bank 603. In various embodiments, ECC is used to identify and/or correct bit errors in both the memory array and the redundant memory. As the ECC discovers bit errors, additional lines may be marked valid and the data stored in the redundant memory location rather than the memory. After ECC is applied, the requested data is provided to controller 606 as indicated by block 627. The memory endurance for non-linear polar material based memory is enhanced by the endurance mechanisms of various embodiments. This allows more read and write operations to memory before any memory block, bank, or word becomes unreliable. In various embodiments, the capacitors for each bit-cell in FE memory 601 (which can also be a PE memory) are arranged in a stack and fold manner.

Figure 7:
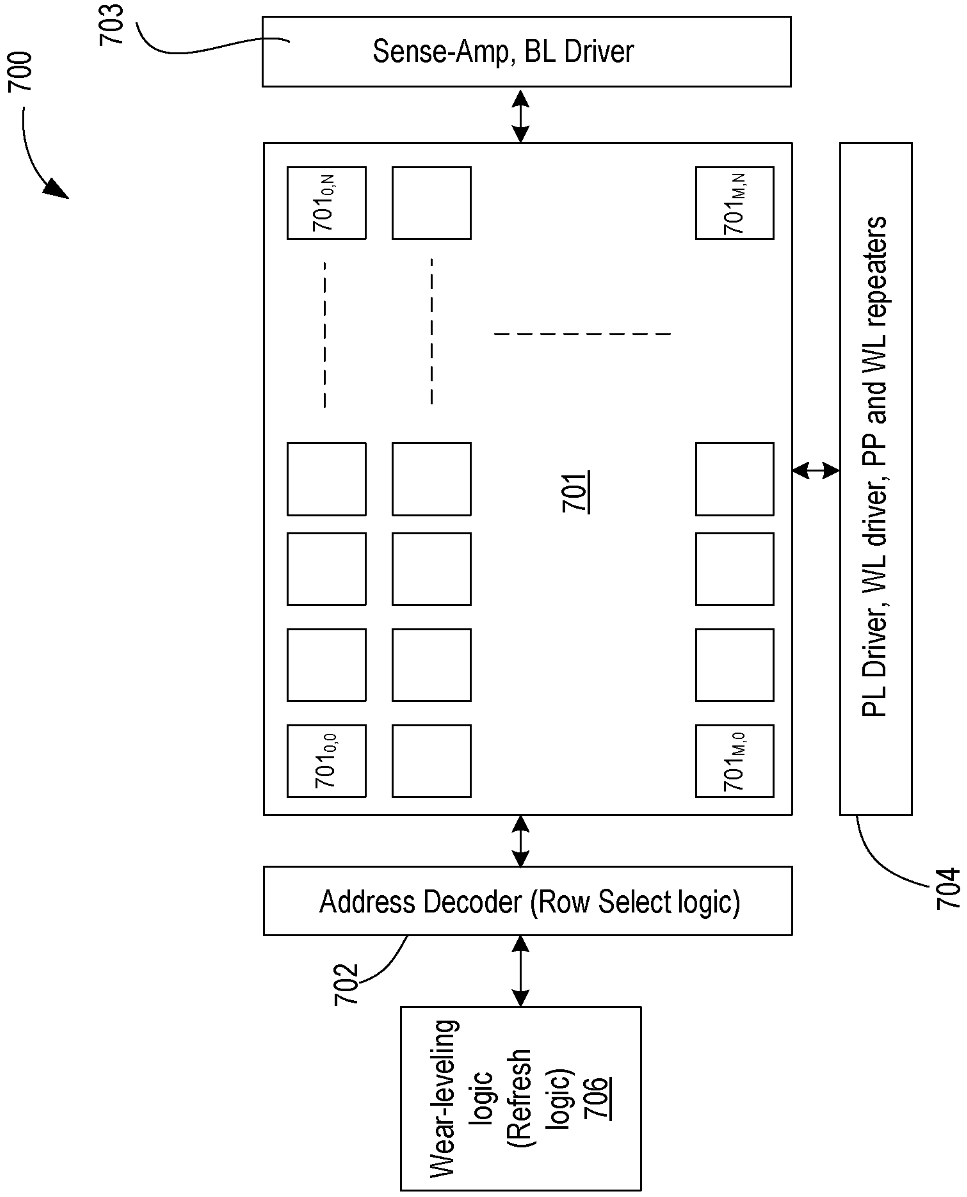
FIG. 7 illustrates an M×N memory array of bit-cells and corresponding periphery circuitry, in accordance with some embodiments.

FIG. 7 illustrates apparatus 700 comprising an M×N memory array of bit-cells and corresponding periphery circuitry, in accordance with some embodiments. Apparatus 700 comprises M×N memory array 701 of bit-cells, logic circuitry 702 for address decoding, and logic circuitry 703 for sense amplifier, write drivers, and plate-line (PL) drivers. In some embodiments, plate-lines PL0, PL1 through PLN are parallel to word-lines WL0, WL1, through WLM while bit-lines BL0, BL1 through BLN are orthogonal to the plate-lines and the word-lines, where 'N' is a number greater than 1. In some embodiments, plate-lines PL0, PL1 through PLN are parallel to bit-lines BL0, BL1 through BLN, while word-lines WL0, WL1, through WLM are orthogonal to the plate-lines and the bit-lines, where 'N' is a number greater than 1. In some embodiments, individual memory bit-cells in memory array 701 are organized in rows and columns. For example, memory bit-cells $\mathbf{701}_{0,0}$ through $\mathbf{701}_{M,N}$ are organized in an array.

In some embodiments, an individual memory bit-cell (e.g., $\mathbf{701}_{0,0}$) is a 1TnC bit-cell. An example of a 1TnC bit-cell is described with reference to FIGS. 10A-B. In some embodiments, an individual memory bit-cell (e.g., $\mathbf{701}_{0,0}$) is a multi-element FE gain bit-cell. An example of a 1TnC bit-cell is described with reference to FIGS. 11A-B. In some embodiments, an individual memory bit-cell (e.g., $\mathbf{701}_{0,0}$) is a multi-element FE gain bit-cell, where an individual capacitor of the bit-cell is connected to a transistor switch. An example of such a memory bit-cell is described with reference to FIG. 12. In some embodiments, an individual memory bit-cell (e.g., $\mathbf{701}_{0,0}$) is a multi-element gain bit-cell where the capacitor is replaced with a memory element. An example of such a memory bit-cell is described with reference to FIGS. 14A-B. In some embodiments, an individual memory bit-cell (e.g., $\mathbf{701}_{0,0}$) is a multi-element gain bit-cell where the capacitor is replaced with a memory element (ME), and an individual capacitor is connected to a switch. An example of such a memory bit-cell is described with reference to FIG. 15.

In some instances when multiple capacitors are used per bit-cell, the access transistor may be made larger. The access transistor is connected to the bit-line as the bit-line drives a gate terminal of the access transistor. A larger access transistor adds capacitance to the bit-line. One way to reduce the bit-line capacitance is to route the bit-line on higher level metal layers. Higher-level metal layers are usually occupied by ground and supply routes. Further connecting the gate of the access transistor to higher-level metal layers to access the bit-line means traversing through contact regions and vias. Such signal path may increase resistance and capacitance on the bit-line. In some embodiments, memory array 701 is split into two or more subarrays with bit-line multiplexers between the subarrays. By splitting the array, bit-line routes are split along the subarrays via a selection circuitry. The selection circuitry decouples the bit-line into separate bit-line routes which allows the capacitance on the bit-line to reduce as parasitic capacitance from the bit-line route is reduced and bit-line is not driving all the access transistors in a row of the array.

Figure 8:
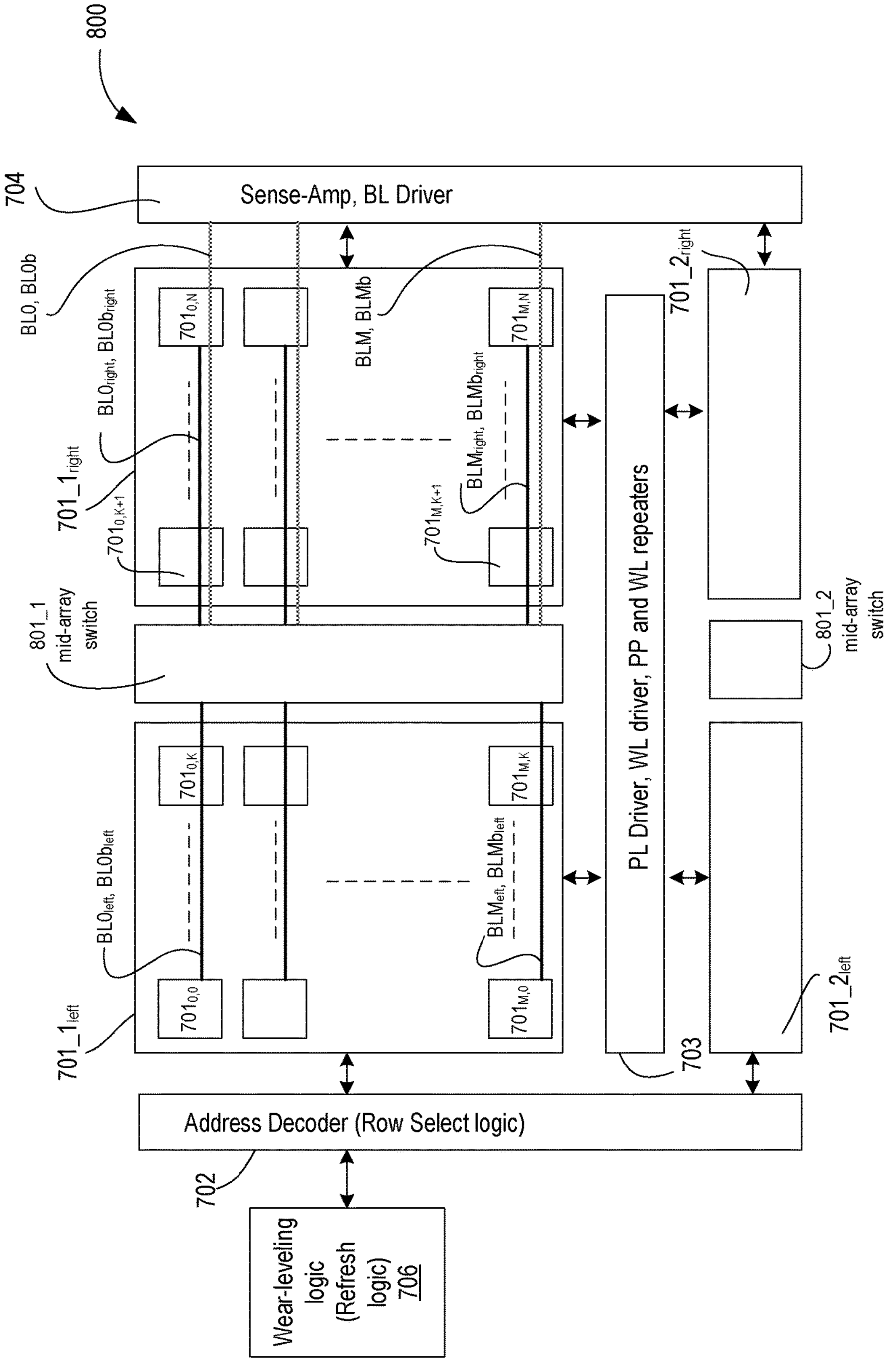
FIG. 8 illustrates apparatus comprising a split memory array with mid-array switch or selection circuitry, in accordance with some embodiments.

FIG. 8 illustrates apparatus 800 comprising a split memory array with mid-array switch or selection circuitry, in accordance with some embodiments. In some embodiments, apparatus 800 comprises left-side array $\mathbf{701\_1}_{left}$ and right-side array $\mathbf{701\_1}_{right}$. For example, array 701 of FIG. 7 having M×N bit-cells is split substantially equally into left-side array $\mathbf{701\_1}_{left}$ and right-side array $\mathbf{701\_1}_{right}$. Left-side array $\mathbf{701\_1}_{left}$ comprises bit-cells $\mathbf{701}_{0,0}$ through $\mathbf{701}_{M,K}$. Right-side array $\mathbf{701\_1}_{right}$ comprises bit-cells $\mathbf{701}_{0,K+1}$ through $\mathbf{701}_{M,N}$. In some embodiments, array 701 can be further sub-divided into additional split arrays such as $\mathbf{701\_2}_{left}$ and $\mathbf{701\_2}_{right}$ as shown. In some embodiments, sub-arrays $\mathbf{701\_2}_{left}$ and $\mathbf{701\_2}_{right}$ are split arrays of another array of a memory. In various embodiments, a mid-array switch or selection circuitry is placed between the split arrays. For example, mid-array switch 801_1 is placed between array $\mathbf{701\_1}_{left}$ and $\mathbf{701\_1}_{right}$. In another example, mid-array switch 801_2 is placed between array $\mathbf{701\_2}_{left}$ and $\mathbf{701\_2}_{right}$. While the embodiments are described with reference to a memory array being split into left and right segments or subarrays, the split of the array can result in top and bottom memory segments or subarrays.

In some embodiments, mid-array switch 8011 (generally referred to as mid-array 801) comprises a selection circuitry or multiplexer that operates in two different modes. In a first mode of operation (e.g., write operation), the main BL and BLb (e.g., inverse of BL) for a memory array row is driven by BL driver 704 and controllably split into left and right BLs via switch transistors. These transistors can be n-type transistors, p-type transistors, or a combination of them. In one example, BL0 is driven by a BL driver and this BL0 is split into $BL0_{left}$ and $BL0_{right}$. In some embodiments, $BL0_{left}$ is routed to the first row (e.g., row 0) of split array $701\_1_{left}$. In some embodiments, $BL0_{right}$ is routed to the first row (e.g., row 0) of split array $701\_1_{right}$. Likewise, BL0*b* is driven by a BL driver and this BL0*b* is split into $BL0b_{left}$ and $BL0b_{right}$. In some embodiments, $BL0b_{left}$ is routed to the first row (e.g., row 0) of split array $701\_1_{left}$. In some embodiments, $BL0b_{right}$ is routed to the first row (e.g., row 0) of split array $701\_1_{right}$.

In a second mode of operation (e.g., read or sense operation), left and right bit-lines BL and BL0 from the split arrays are selectively multiplexed into the main bit-line which is received by a sense amplifier (Sense-Amp) for detection. In one example, $BL0_{left}$ is routed from the first row (e.g., row 0) of split array $701\_1_{left}$ to BL0 via a first controllable transistor. In another example, $BL0_{right}$ is routed from the first row (e.g., row 0) of split array $701\_1_{right}$ to BL0 via a second controllable transistor. In some embodiments, of $BL0_{right}$ or $BL0_{left}$ is provided as BL0 for sensing. By using one of the two split bit-lines as the main bit-line, the main bit-line has lower capacitance which can result in faster sensing since the voltage for sensing on the BL is developed faster due to lower parasitic capacitance. A similar multiplexing takes place with split BLb lines. For instance, $BL0b_{left}$ is routed from the first row (e.g., row 0) of split array $701\_1_{left}$ to BLb0 via a third controllable transistor. In another example, $BL0_{bright}$ is routed from the first row (e.g., row 0) of split array $701\_1_{right}$ to BL0*b* via a fourth controllable transistor. In some embodiments, $BL0b_{right}$ or $BL0b_{left}$ is provided as BL0*b* for sensing.

By using one of the two split bit-lines as the main bit-line, the main bit-line has lower capacitance even through the interconnect length of the overall bit-line (i.e., the sum of the lengths of two split bit-lines) is substantially the same as before. Using one of the two split bit-lines lowers the number of access transistors (or select transistors, or pass-gates) within the bit-cells and their associated parasites as seen on the split bit-line. Using one of the two split bit-lines as the main bit-line can result in faster sensing since the voltage for sensing on the BLb is developed faster due to lower parasitic capacitance. Also, since the split bit-lines (e.g., the left-side bit-line and the right-side bit-line) have lower parasitic capacitance, the access transistor of the selected row can be switched faster which results in higher memory performance. By lowering the parasitic capacitance on the split bit-lines, the polarization density requirements also reduce. Lowering the parasitic capacitance on the split bit-lines facilitates larger array-based design for a given sense margin. This is because the sense margin improves as the parasitic on the bit-line improves (e.g., parasitic capacitance reduces).

Figure 9:
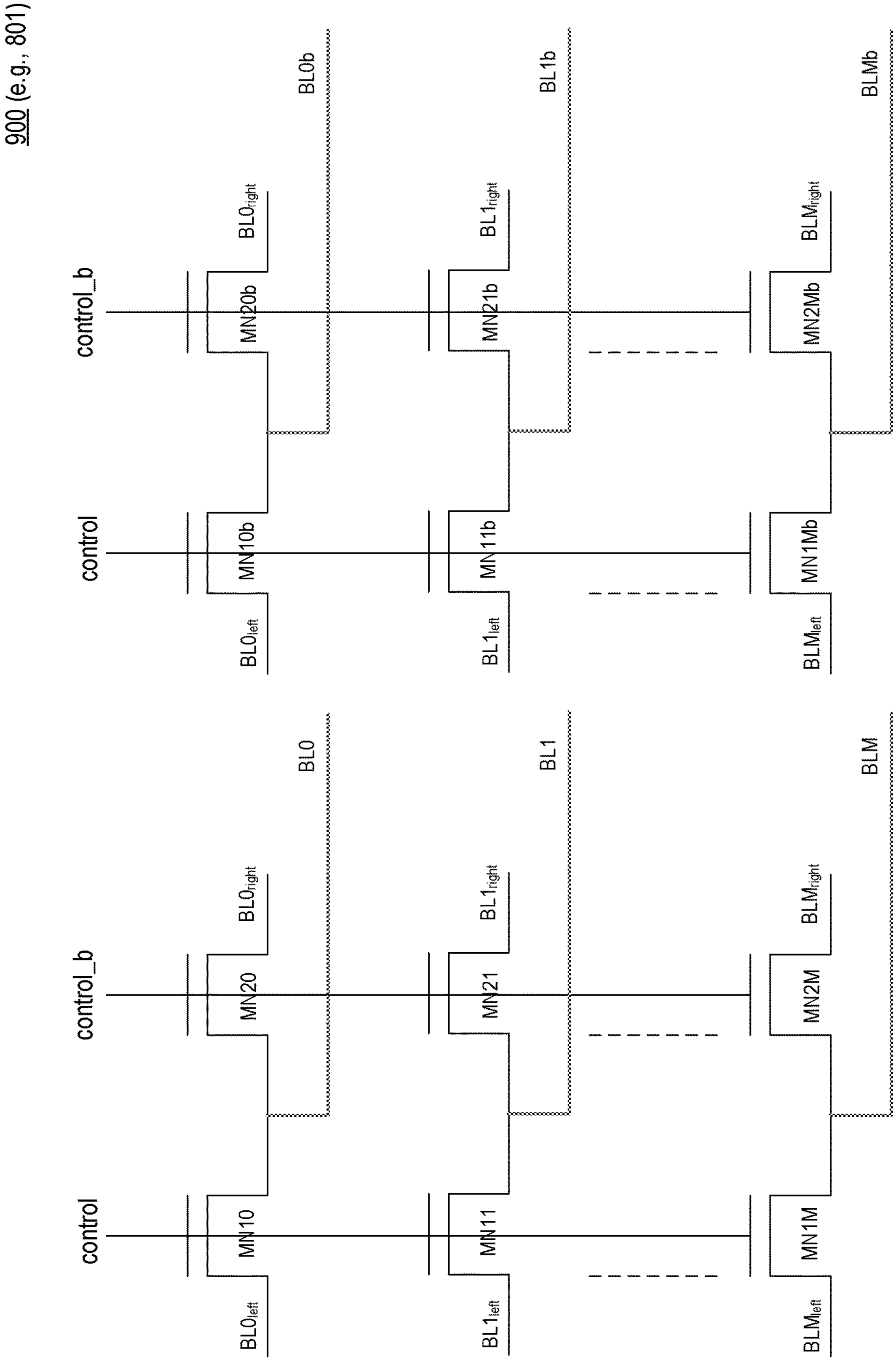
FIG. 9 illustrates apparatus comprising mid-array switches or multiplexer, in accordance with some embodiments.

FIG. 9 illustrates apparatus 900 comprising mid-array switches or multiplexer, in accordance with some embodiments. In this example, 2×M number of switches are shown. For the sake of explaining apparatus 900, an individual switch or multiplexer is described. The same description is applicable to other switches. In some embodiments, the individual switch or multiplexer comprises a first transistor (e.g., MN10) and a second transistor (e.g., MN20) coupled in series. The node which is common to the first and second transistors is the main bit-line (e.g., BL0). In some embodiments, the first transistor (e.g., MN10) is controlled by a first control (e.g., control) while the second transistor is controlled by a second control (e.g., control_b, where control_b is an inverse of control). For example, control_b is complementary of control. In various embodiments, the first and second controls are generated by the logic that generates the bit-line signal. At a time, one of the right or left bit-lines are active, in accordance with some embodiments. The various embodiments are not limited to the specific circuit design of apparatus 900.

In some embodiments, the n-type transistors may be replaced with p-type transistors. In some embodiments, a combination of n-type and p-type transistors may be used. For example, the pass-gates shown in FIG. 9 can be replaced with transmission gates. In some embodiments, an additional n-type transistors are connected in parallel to MN10 and transistor MN20, respectively. These additional n-type transistors may be driven by a boosted voltage to overdrive the gates of the n-type transistors. In some embodiments, the boosted voltage is above the power supply voltage level and provided to the additional n-type transistors when control or control_b are asserted (e.g., when control signal transitions from login low to logic high to turn on transistor MN10). For example, when transistor MN10 is turned on by the control signal then the additional n-type transistor in parallel to the transistor MN10 is also turned on by a boosted voltage applied to the gate of the additional transistor. The same mechanism may be used by transistor MN20 and its respective additional transistor MN20.

Figures 10A, 10B:
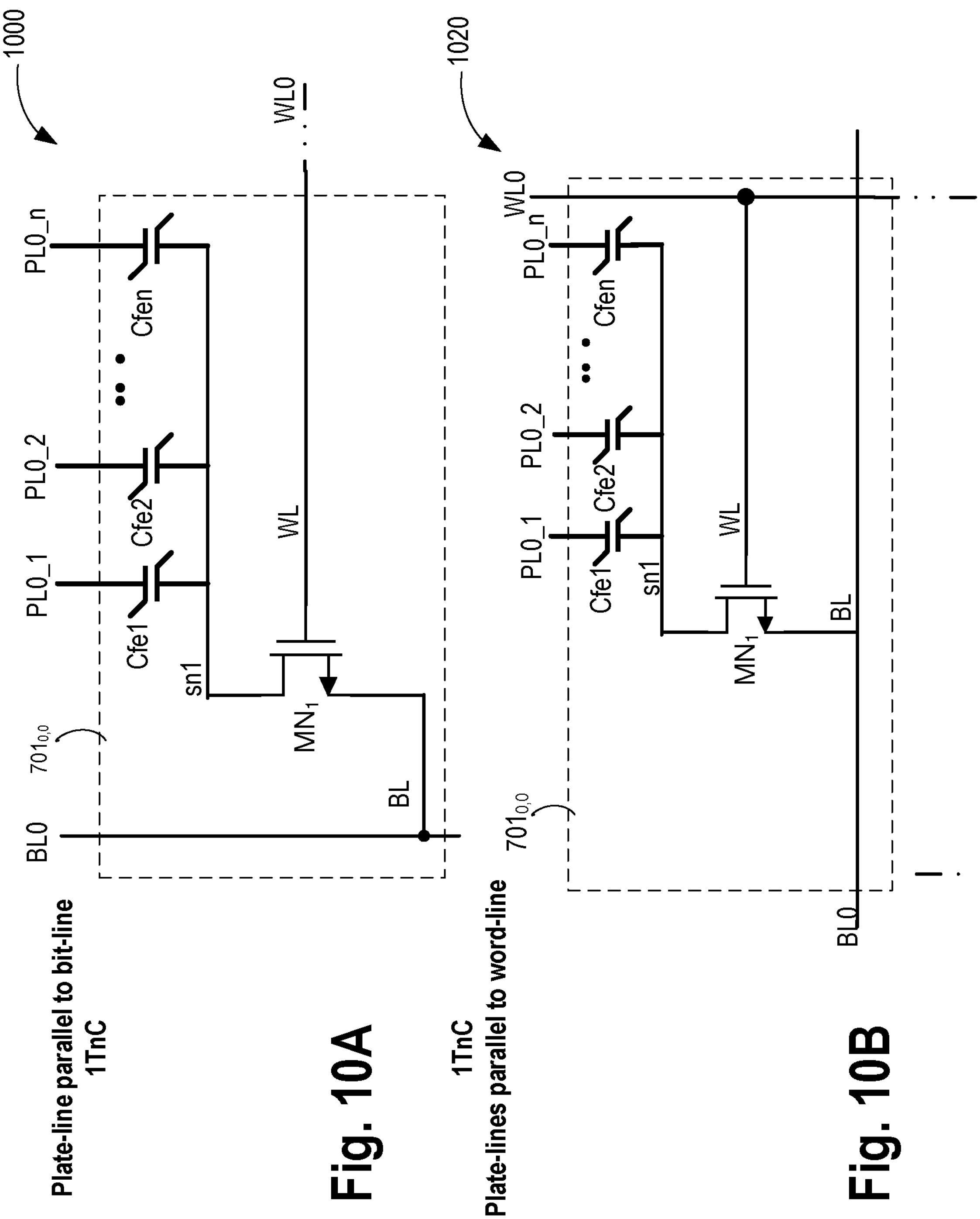
FIG. 10A illustrates a 1TnC bit-cell comprising non-linear polar material for its capacitors, where the plate-lines are parallel to the bit-line, in accordance with some embodiments.
FIG. 10B illustrates a 1TnC bit-cell comprising non-linear polar material for its capacitors, where the plate-lines are parallel to the word-line, in accordance with some embodiments.

FIG. 10A illustrates 1TnC bit-cell 1000 comprising non-linear polar material for its capacitors, where plate-lines are parallel to the bit-line, in accordance with some embodiments. In some embodiments, memory bit-cell 1000 (e.g., $701_{0,0}$) comprises one select transistor $MN_1$ and a plurality of capacitors Cfe1, Cfe2, through Cfen (where 'n' is a number greater than 1) comprising non-linear polar material (e.g., ferroelectric, paraelectric, or non-linear dielectric). The capacitors can be a planar or non-planar capacitor as described with reference to various embodiments. In some embodiments, the plurality of capacitors Cfe1, Cfe2, through Cfen are stacked and folded capacitors.

The gate terminal of transistors $MN_1$ is controllable by WL. In some embodiments, BL is coupled to a source or drain terminal of transistor $MN_1$. In some embodiments, an individual PL of a plurality of PLs is coupled to an individual capacitor. For example, capacitor Cfe1 is coupled to plate-line PL0_1, capacitor Cfe2 is coupled to plate_line PL0_2, and capacitor Cfen is coupled to plate_line PL0_*n*. In some embodiments, the plurality of capacitors is coupled to storage node sn1, which is coupled to a drain or source terminal of transistor $MN_1$. For example, a first terminal of capacitor Cfe1 is coupled to PL0_1 and a second terminal of capacitor Cfe1 is coupled to storage node sn1. In some embodiments, apparatus 700 has n-number of PLs (e.g., PL0_1 through PL0_*n*) per column which are parallel to a BL for that column.

While the various embodiments are illustrated with reference to an n-type transistor, the embodiments are also applicable to a p-type transistor or a combination of n-type or p-type transistors. A person skilled in the art would appreciate that when a transistor of a different conductivity type is used than what is shown in FIG. 10A, then driving logic for BL, PLs, and/or WL may also change for proper read and/or write operations. In various embodiments, PLs are parallel to BL. For example, PL0_1, PL0_2, PL0_*n* are parallel to BL. In some embodiments, transistor $MN_1$ is fabricated on the frontend of the die and capacitors are stacked over the transistor. For example, the capacitors are stacked along the z-direction and folded along the x-axis. The capacitors can be planar or non-planar capacitors. As such, a taller and wider bit-cell is formed with a footprint comparable to the footprint of the transistor $MN_1$. In some embodiments, the x-y footprint is determined by the size of transistor $MN_1$ and its connections to BL, WL, and storage node sn1.

In some embodiments, PL (e.g., PL0_1, PL0_2, . . . PL0_*n*) controls which capacitor of the bit-cell is programmed, and the value of programming. In some embodiments, BL acts as a sense-line. The voltage on BL (e.g., sense voltage) can create disturbance on other bit-lines during read operation. To mitigate such disturbances, in some embodiments, the 1TnC bit-cell is periodically refreshed (e.g., every 1 second). In some embodiments, periodic refresh is minimized by refreshing in active mode of operation. In some embodiments, in standby mode (e.g., low power mode), the 1TnC bit-cell is not refreshed as there is no disturb mechanism during standby. In some embodiments, wear-leveling logic 706 provides one or more endurance mechanisms for the 1TnC memory bit-cells. One of the endurance mechanisms involves refreshing of the data content in the capacitor(s).

In the 1TnC bit-cell case (e.g., bit-cell $\mathbf{701}_{0,0}$) with PL parallel to BL, the activities seen on an unselected or un-intended bit-cell while performing read/write operations on the same column as that of the selected bit-cell can have large disturb effects on the unselected or unintended bit-cells. This may be true if the PL within the same column toggles (during read or write) a particular value to the desired bit-cell. This signal on the PL of that column, which is shared with other unselected cells, can create a field across the non-linear polar material based capacitors or devices of the unselected cells. The field across the unselected non-linear polar material based capacitors or devices is a function of the dielectric component of individual non-linear polar material based capacitors or devices and the total capacitance on the storage node sn1 of those bit-cells. Since in the 1TnC bit-cells the storage capacitor has much larger capacitance load, the activity seen on the unselected bit-line can result into almost all voltage getting dropped across the ferroelectric capacitors (e.g., Vfe=Vpl*(Cp/(Cfed+Cp), which creates a disturb effect, which in turn causes unintentional modification of the polarization stage of the ferroelectric capacitor.

FIG. 10B illustrates 1TnC bit-cell 1020 comprising non-linear polar material for its capacitors, where plate-lines are parallel to the word-line, in accordance with some embodiments. 1TnC bit-cell 1020 is similar to 1TnC bit-cell 1000 but plate-lines are parallel to the word line.

Figure 11A:
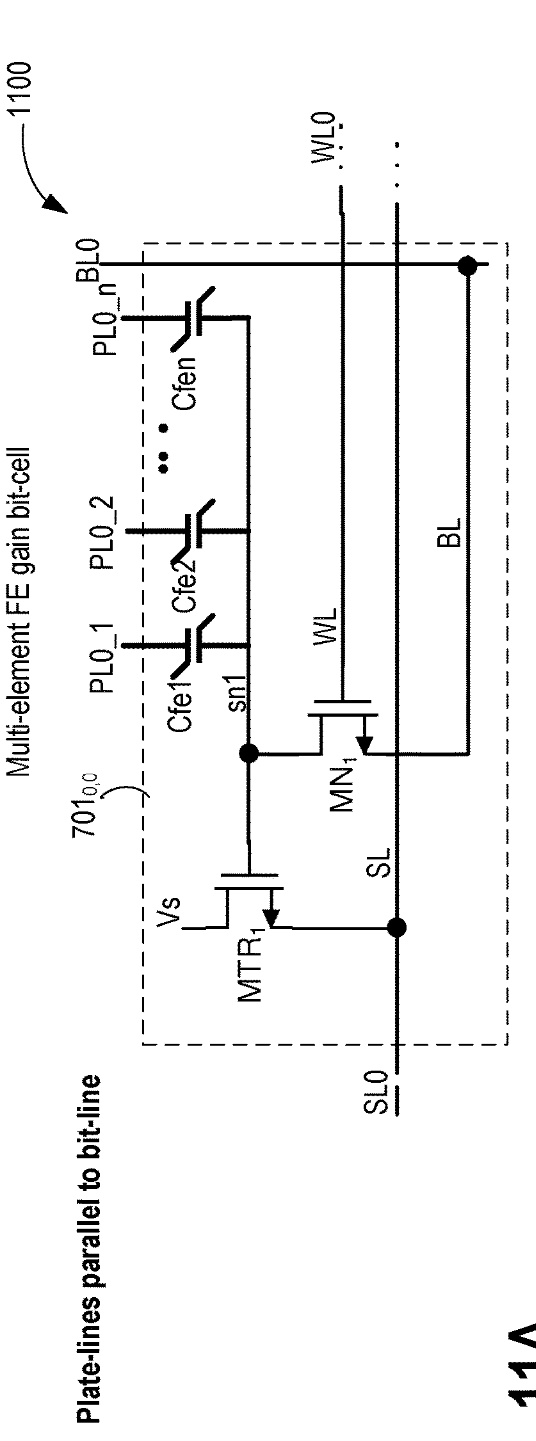
FIG. 11A illustrates a multi-element FE gain bit-cell with plate-lines parallel to the bit-line, in accordance with some embodiments of the disclosure.

FIG. 11A illustrates a multi-element FE gain bit-cell 1100 with plate-lines parallel to the bit-line, in accordance with some embodiments of the disclosure. In some embodiments, bit-cell 1100 (e.g., $\mathbf{701}_{0,0}$) comprises n-type select transistor $MN_1$, n-type transistor $MTR_1$, bit-line (BL), word-line (WL), sense-line (SL), and 'n' number of ferroelectric (or paraelectric) capacitors Cfe1 through Cfen. In various embodiments, the gate terminal of the n-type transistor $MN_1$ is coupled to WL (e.g., WL1). In some embodiments, the drain or source terminal of the n-type transistor $MN_1$ is coupled to BL. In various embodiments, first terminals of each of the capacitors Cfe1 through Cfen is coupled to a storage node sn1. The storage node sn1 is coupled to a source or drain terminal of n-type transistor $MN_1$ and to a gate of transistor $MTR_1$. In various embodiments, drain or source terminal of $MTR_1$ is coupled to a bias voltage Vs. In some embodiments, Vs is a programmable voltage that can be generated by any suitable source. Vs voltage helps in biasing the gain transistor in conjunction with the sense-voltage that builds at sn1 node. In some embodiments, the source or drain terminal of transistor $MTR_1$ is coupled to SL (e.g., SL1). In some embodiments, a p-type transistor can be used as well for gain.

In some embodiments, second terminals of each of the capacitors Cfe1 through Cfen is coupled to a corresponding plate-line (PL). For example, the second terminal of Cfe1 is coupled to PL0_1, the second terminal of Cfe2 is coupled to PL0_2, and so on. Apparatus 700 has n-number of PLs (e.g., PL0_1 through PL0_*n*) per column which are parallel to a BL for that column, in accordance with some embodiments. In some embodiments, the SL is parallel to the PL. In some embodiments, the SL is parallel to the WL.

In some embodiments, ferroelectric (or paraelectric) capacitors Cfe1 through Cfen are planar capacitors such as those discussed with reference to various embodiments herein. In some embodiments, ferroelectric (or paraelectric) capacitors Cfe1 through Cfen are pillar capacitors such as those discussed with reference to various embodiments herein. In some embodiments, the ferroelectric (or paraelectric) capacitors Cfe1 through Cfen are vertically stacked and horizontally folded allowing for tall bit-cells (e.g., higher in the z-direction) but with x-y footprint of two transistors. By folding the capacitors, the diffusion capacitance on the BL reduces for a given array size, which improves reading speed. Further, folding the capacitors lowers the effective routing capacitance on the BL. The larger footprint in the x-y direction of multi-element FE gain bit-cell compared to the footprint in the x-y direction of 1TnC bit-cell, vertical height of the capacitor can be reduced as the capacitors can expand in the x-y direction more than before for a given height. As such, capacitors are folded more effectively. For example, n/2 capacitors per metal or via layer can be packed. In various embodiments, more capacitors can be stacked in multi-element FE gain bit-cell because storage node sn1 is decoupled from the BL. The multi-element FE gain bit-cell reduces the thickness scaling requirement for the pillar capacitor. The polarization density requirements are reduced for multi-element FE gain bit-cell compared to 1TnC bit-cell.

In this example, the x-y footprint is determined by the size of transistor $MN_1$ and its connections to BL, WL, and storage node sn1. In some embodiments, the footprint can still be decided by other factors such as: a number of capacitors that connect to the node; how the capacitors are arranged, e.g., more folding on the same node versus stacking; effective size constraints on those capacitors; and number of capacitors that share the same bit-cell. In some embodiments, PL (e.g., PL0_1, PL0_2, . . . PL_n) controls which cell within the same access transistor gets programmed, and the value of programming. In some embodiments, BL acts as a sense-line. The voltage on BL (e.g., sense voltage) can create disturbance on other bit-lines during read operation. To mitigate such disturbances, in some embodiments, multi-element FE gain bit-cell (e.g., $\mathbf{701}_{0,0}$) is periodically refreshed (e.g., every 1 second). In some embodiments, periodic refresh is minimized by refreshing in active mode of operation that can be coupled with advance schemes for wear leveling. In standby mode (e.g., low power mode), multi-element FE gain bit-cell (e.g., $\mathbf{701}_{0,0}$) is not refreshed as there is no disturb mechanism during standby. In some embodiments, multi-element FE gain bit-cell (e.g., $\mathbf{701}_{0,0}$) relies on isolating the read mode from BL or SL capacitance by isolating through access transistor $MN_1$, where $MN_1$ transistor facilitates pre-charging the sn1 node, prior to read operation.

In some embodiments, there is a possibility of disturbance at the storage node sn1 during read operation. In some embodiments, PL is toggled for other capacitors to the average value of the disturbance that will be seen on the sn1 node, i.e., when a read pulse of some polarity is applied at PL of the capacitor to be read, a non-zero voltage is applied on other PLs of multi-element FE gain bit-cell (e.g., $\mathbf{701}_{0,0}$), that matches the expected disturbance seen on the shared node. In one such example, the PL driver is configured to support driving different voltage levels on different PLs. In some embodiments, wear-leveling logic 706 provides one or more endurance mechanisms for the multi-element FE gain bit-cells. One of the endurance mechanisms involves refreshing of the data content in the capacitor(s).

Figure 11B:
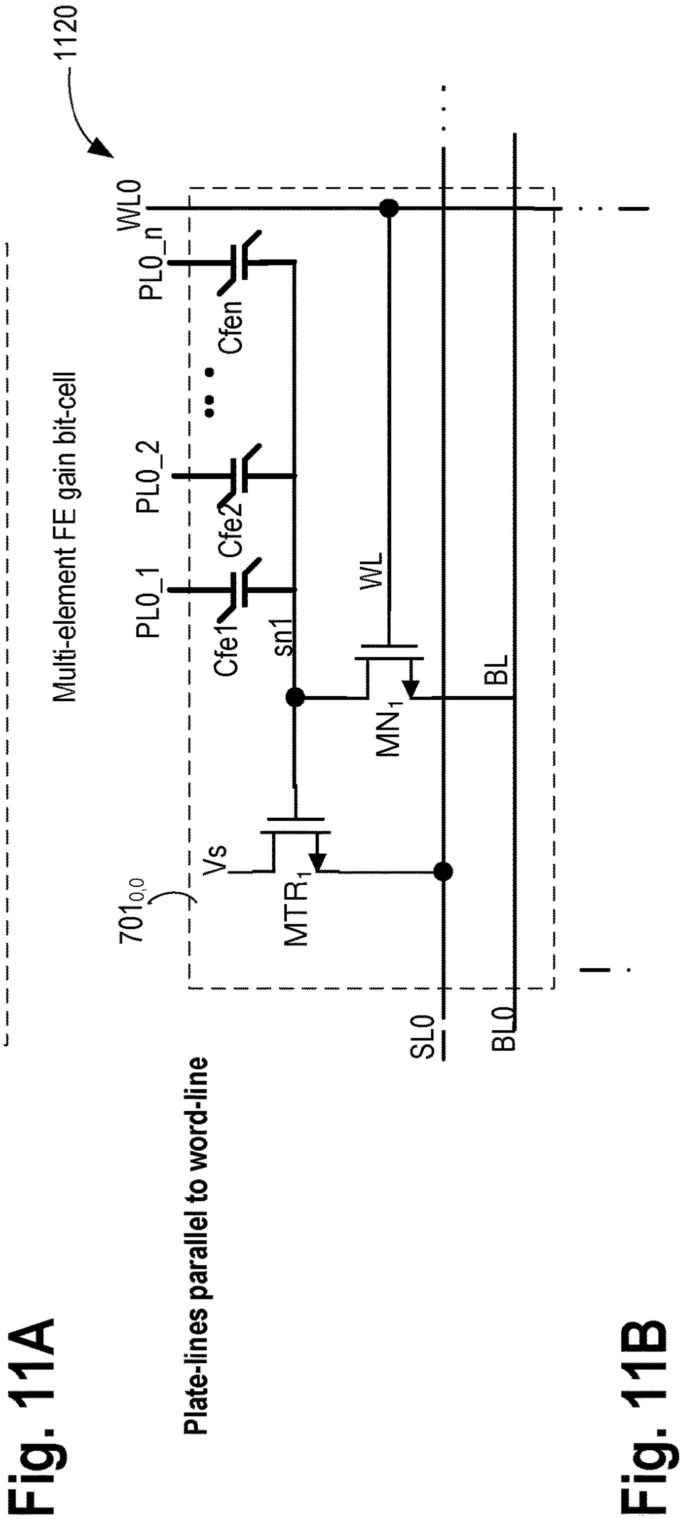
FIG. 11B illustrates a multi-element FE gain bit-cell with plate-lines parallel to the word-line, in accordance with some embodiments of the disclosure.

FIG. 11B illustrates a multi-element FE gain bit-cell 1120 with plate-lines parallel to the word-line, in accordance with some embodiments of the disclosure. Multi-element FE gain bit-cell 1120 is similar to multi-element FE gain bit-cell 1100 but plate-lines are parallel to the word line.

Figure 12:
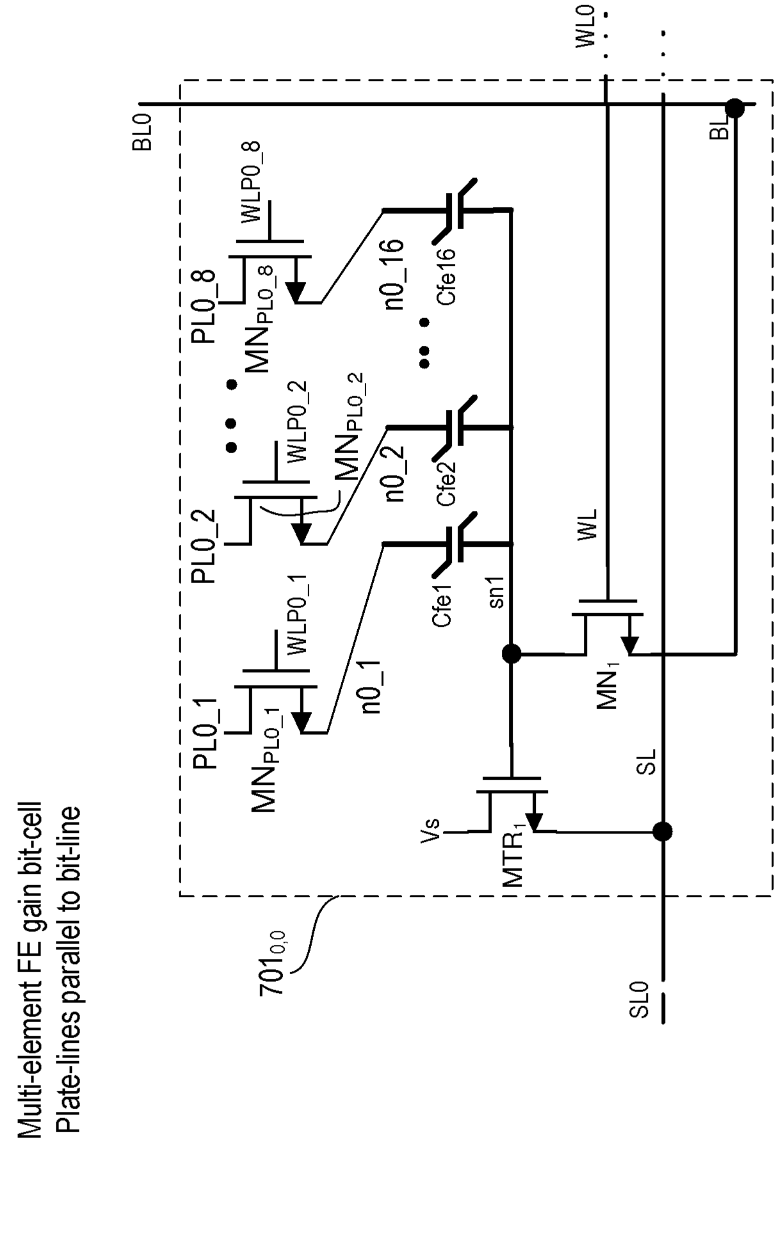
FIG. 12 illustrates a multi-element FE gain bit-cell with plate-line switches, in accordance with some embodiments of the disclosure.

FIG. 12 illustrates multi-element FE gain bit-cell 1200 with plate-line switches, in accordance with some embodiments of the disclosure. Bit-cell 1200 is like bit-cell 1100, but with switches in the path of the plate-lines and hence a different kind of memory bit-cell. These switches are added to remove the charge disturb effect of unselected bit-cells when bit-lines are arranged parallel to the plate-lines. The charge disturb effect here is on the stored state of the capacitors with non-linear polar material. By adding the switches, the plate-lines are no longer directly affecting the charge disturb effect because of the corresponding WLs that control the switches.

In some embodiments, each memory bit-cell in memory array 1001 is organized in rows and columns like in bit-cell 1100, but with bit-lines running parallel to the plate-lines. In some embodiments, n-type transistor $MN_{PLO\_1}$ is coupled to Cfe1 and plate-line PL0_1. In some embodiments, n-type transistor $MN_{PLO\_2}$ is coupled to Cfe2 and plate-line PL0_2. Likewise, in some embodiments, n-type transistor $MN_{PLO\_n}$ is coupled to Cfen and plate-line PL0_*n*. Each transistor (or switch) is controlled separately, in accordance with some embodiments. In some embodiments, transistor $MN_{PLO\_1}$ is controllable by WLP0_1, transistor $MN_{PL0_2}$ is controllable by WLP0_2, and so on. Likewise, transistor $MN_{PL0}_n$ is controllable by WLP0_*n*. Here, WLP0_1 . . . . WLP0_*n* are the extensions of an address space. In this case, depending upon which storage element is being programmed or read, the corresponding WLP0_1 . . . WLP0_*n* are kept high (e.g., Vdd) whenever the plate-line voltage of 0V or Vdd is applied, while the unselected storage element sees 0V.

While the various embodiments are illustrated with reference to an n-type transistor or switch, the embodiments are also applicable to a p-type transistor or a combination of n-type or p-type transistors. A person skilled in the art would appreciate that when a transistor of a different conductivity type is used than what is shown in FIG. 12, then driving logic for BL, PLs, WL, and/or WLPs may also change for proper read and/or write operations.

In some embodiments, the switches added to the plate-lines are fabricated in different layers of a die. For example, transistor $MN_1$ is fabricated on the frontend of the die while transistors $MN_{PLO\_1}$, $MN_{PLO\_2}$, . . . and $MN_{PLO\_n}$, are fabricated in the backend of the die. On one such embodiment, the capacitor Cfe is fabricated between the frontend and the backend of the die. In one example, capacitors Cfe are vertically stacked capacitors and horizontally folded. In some embodiments, each switch and its corresponding coupled capacitor is formed in the backend of the die. In some embodiments, each switch and its corresponding coupled capacitor is stacked vertically. For example, transistor $MN_{PLO\_1}$ and capacitor Cfe1 are stacked vertically in a first vertical stack, and transistor $MN_{PLO\_2}$ and capacitor Cfe2 are stacked vertically in a second vertical stack. In some embodiments, capacitors Cfe1 and Cfe2 are stacked and folded. These backed transistors or switches can be fabricated using any suitable technology such as IGZO (indium gallium zinc oxide).

Figure 13:
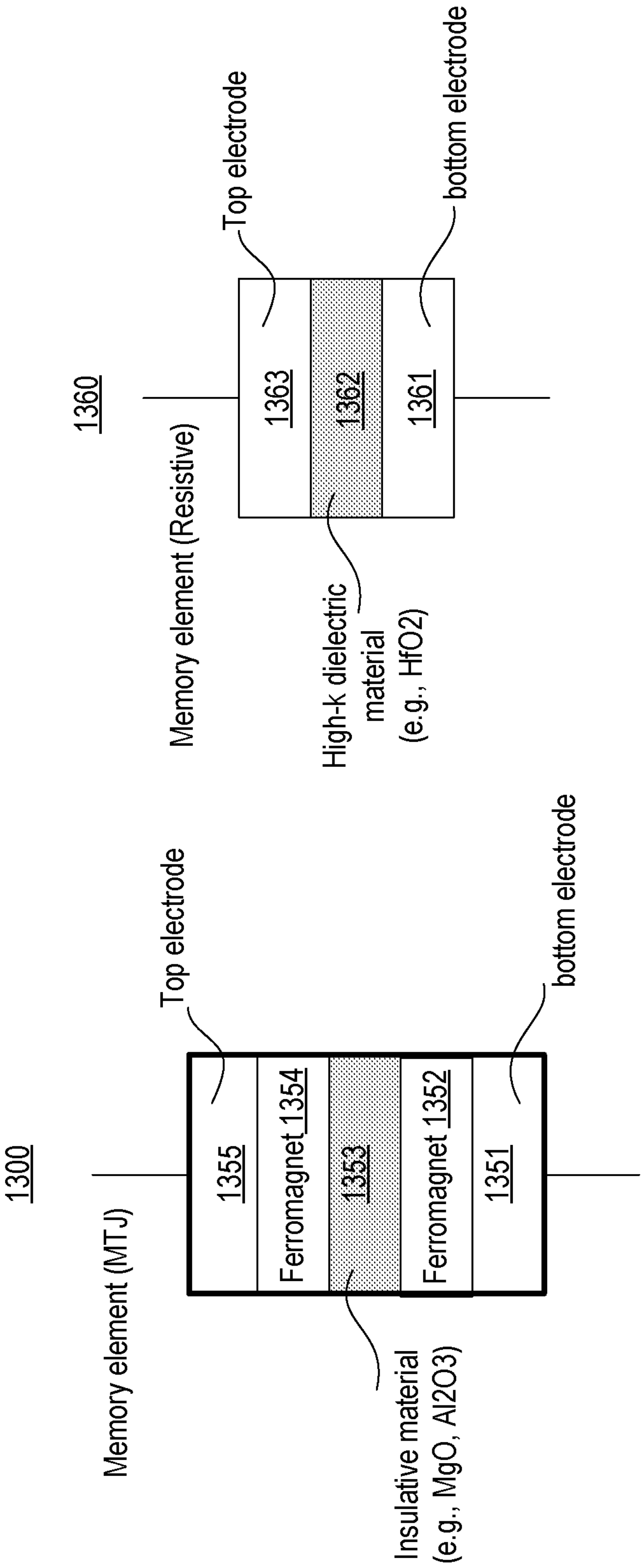
FIG. 13 illustrates memory elements (MEs) for use in memory bit-cells, in accordance with some embodiments.

FIG. 13 illustrates memory elements (MEs) 1300 and 1360 for use in memory bit-cells, in accordance with some embodiments. In some embodiments, planar memory element structures are resistive elements. In some embodiments, planar memory element structures are magnetic tunnel junctions (MTJs). In some embodiments, planar memory element structures are phase change memory (PCM) memories.

In some embodiments, MTJ 1300 comprises a bottom electrode 1351, free ferromagnetic layer 1352, insulative material 1353 (e.g., tunnel barrier materials such as MgO, Al2O3, SrTiO3), fixed ferromagnetic layer 1354, and top electrode 1355. In some embodiments, free ferromagnetic layer 1352 comprises one or more of CrO2, Heusler alloys, Fe, or CoFeB. In some embodiments, insulative material 1353 (also referred to as tunnel barrier) includes one of: MgO, AlOx (where x is a number or fraction), or SrTiO3. In some embodiments, fixed ferromagnetic layer 1354 includes one of CrO2, Heusler alloys, FeCo(001), CoFeB. In some embodiments, an anti-ferromagnetic layer (not shown) is formed over fixed ferromagnetic layer 1354. In some embodiments, the anti-ferromagnetic (AFM) layer comprises Ru or Ir. In some embodiments, the AFM layer comprises a super lattice of Co and Pt coupled with Ru or Ir. In some embodiments, bottom electrode 1351 and top electrode 1355 includes one or more of: Al, Ti, Cu, Ag, Pt, TiN, TaN, Al doped ZnO, Ga-doped ZnO, or indium tin oxide (ITO). In some embodiments, bottom electrode 1351 and top electrode 1355 are symmetric. In some embodiments, bottom electrode 1351 and top electrode 1355 are asymmetric. In some embodiments, bottom electrode 1351 and top electrode 1355 may have the same materials as those discussed with reference to electrodes in FIG. 4B.

In some embodiments, resistive memory 1360 (ReRAM) comprises bottom electrode 1361, insulative material 1362, and top electrode 1363. In some embodiments, insulative material 1362 includes: HfOx, TiOx, TaOx, NiO, ZnOx, Zn2TiO4, KnOx, MgO, AlOx, ZrOx, CuxOy, SnOz, GeOx, LaOx, YOx, MoOx, or CoOx (where x and y are a number or a fraction). In some embodiments, insulative material 1362 for the ReRAM includes oxides of: Mg, Ce, Y, La, Ti, Zr, Hf, V, Nb, Tn, Cr, Mo, W, Mn, Fe, Gd, Co, Ni, Cu, Zn, Al, Ga, Si, Ge, Sn, Yb, or Lu. In some embodiments, bottom electrode 1361 and top electrode 1363 includes one or more of: Al, Ti, Cu, Ag, Pt, TiN, TaN, Al doped ZnO, Ga-doped ZnO, or indium tin oxide (ITO). In some embodiments, bottom electrode 1361 and top electrode 1363 are symmetric. In some embodiments, bottom electrode 1361 and top electrode 1363 are asymmetric. In some embodiments, bottom electrode 1361 and top electrode 1363 may have the same materials as those discussed with reference to electrodes in FIG. 4B.

In ReRAM systems that use forming of filaments, an initial operation may begin by applying a voltage pulse with an increasing magnitude, between top electrode 1363 and bottom electrode 1361. The magnitude of the voltage pulse may be substantially greater than a voltage level utilized to cycle the ReRAM device during regular course of programming. A high voltage pulse may be utilized to perform an intentional one-time breakdown process, known as forming. The forming process creates one or more conductive filaments that provide pathways for electron transport during device operation.

In some embodiments, resistive memory 1360 is a phase-change memory (PC-RAM). In some embodiments, comprises bottom electrode 1361, insulative material 1362, and top electrode 1363. In this case, insulative material 1362 is a phase-change material. In some embodiments, the phase-change material comprises phase-change chalcogenides. In some embodiments, the phase-change material includes one of: (GeTe)m(Sb2Te3)n, Ge2Sb2Te5, Ge2Sb2Te4, AgInSbTe, super lattices of GeTe, Sb2Te3, super lattices of TiTe2 and Sb2Te3, WSe2, WS2, or PtSe2 (where m and n are numbers or fractions). Other examples of the phase-change material includes binary transition metal oxides such as NiO or TiO2, perovskites such as Sr(Zr)TiO3 or PCMO, solid-state electrolytes such as GeS, GeSe, SiOx, or Cu2S, organic materials such as AlDCN, or layered materials such as hexagonal boron nitride.

In various embodiments, when the ME structures are not capacitors (as those described with reference to various embodiments herein), current based pulsing scheme(s) are used to drive (e.g., write) and for sensing (e.g., read). For example, plate-lines flow current to configure or read the ME structures. In some embodiments, the ME structures may be a mix of various types of ME structures (e.g., ferroelectric based capacitors, paraelectric based capacitors, MTJ, ReRAM, or PC-RAM). In some embodiments, all ME structures for an array are of the same type.

Figure 14A:
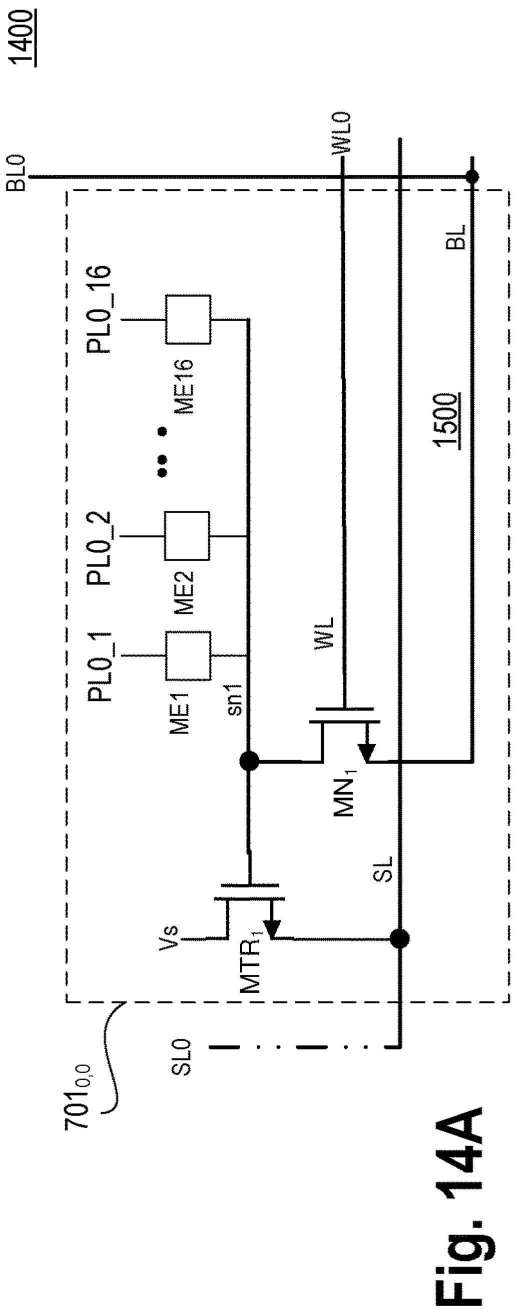
FIG. 14A illustrates a multi-element gain bit-cell with plate-lines parallel to the bit-line, in accordance with some embodiments.

FIG. 14A illustrates a 1TnME bit-cell 1400 where plate-lines are parallel to the bit-line, in accordance with some embodiments. Multi-element gain bit-cell 1400 is the same as the multi-element FE gain bit-cell described herein, but with 16 memory elements and 16 associated plate-lines. In this case, the plate-lines are parallel to the bit-line.

Figure 14B:
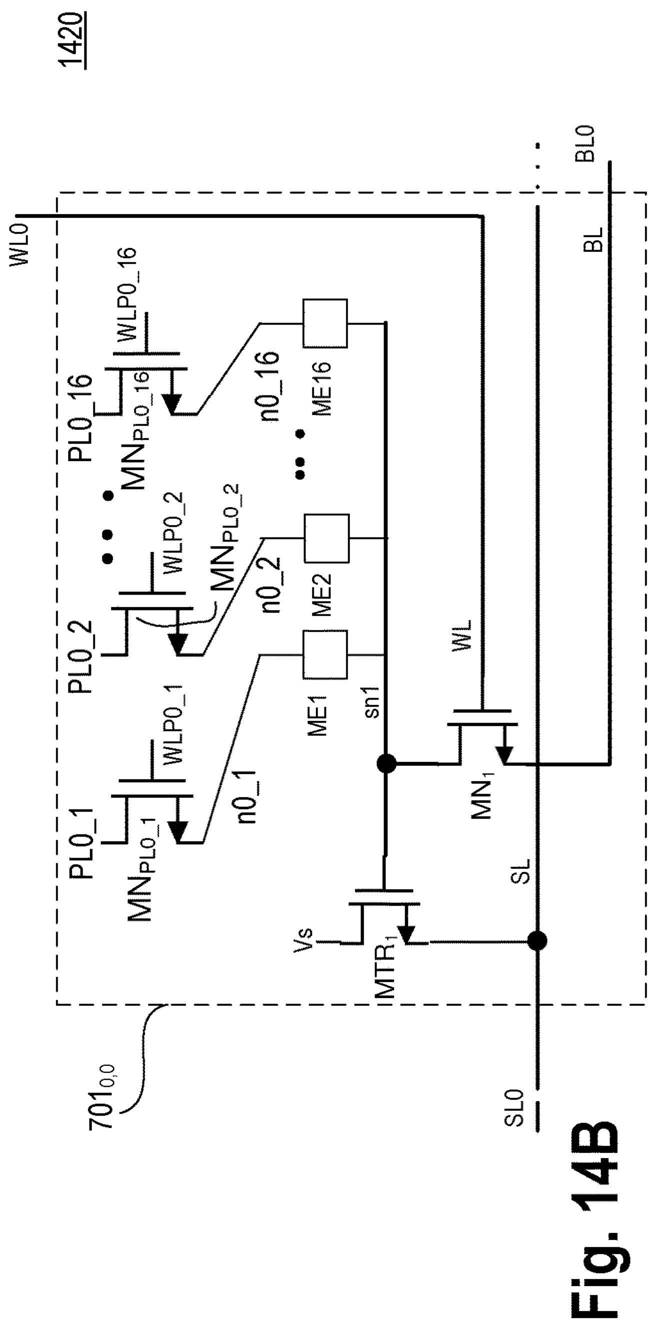
FIG. 14B illustrates a multi-element bit-cell with plate-lines parallel to the word-line, in accordance with some embodiments.

FIG. 14B illustrates a 1TnME bit-cell 1420 where plate-lines are parallel to the word-line, in accordance with some embodiments. When ME devices are current-mode programmed (e.g., MTJ, ReRAM, PC-RAM), then having word-line parallel to the plate-line may use switches $MN_{PLO\_x}$ to enable column multiplexing from a memory programming and memory sensing perspective. In some embodiments, when plate-line is parallel to the word-line, the switches may be removed. In that case, the internal nodes n0_1 through n0_16 are directly connected to respective plate-lines.

In some embodiments, the multi-element gain bit-cell does not have switches $MN_{PL0_1}$ through $MN_{PL0_16}$ as shown in FIG. 14A. In one such example, the internal nodes n0_1 through n0_16 are replaced with plate-lines. In multi-element gain bit-cell 1420 the plate-lines are parallel to the bit-line and switches $MN_{PL0_1}$ through $MN_{PL0_16}$ are removed. This allows for efficient flow of current through the ME devices of the bit-cell.

Figure 15:
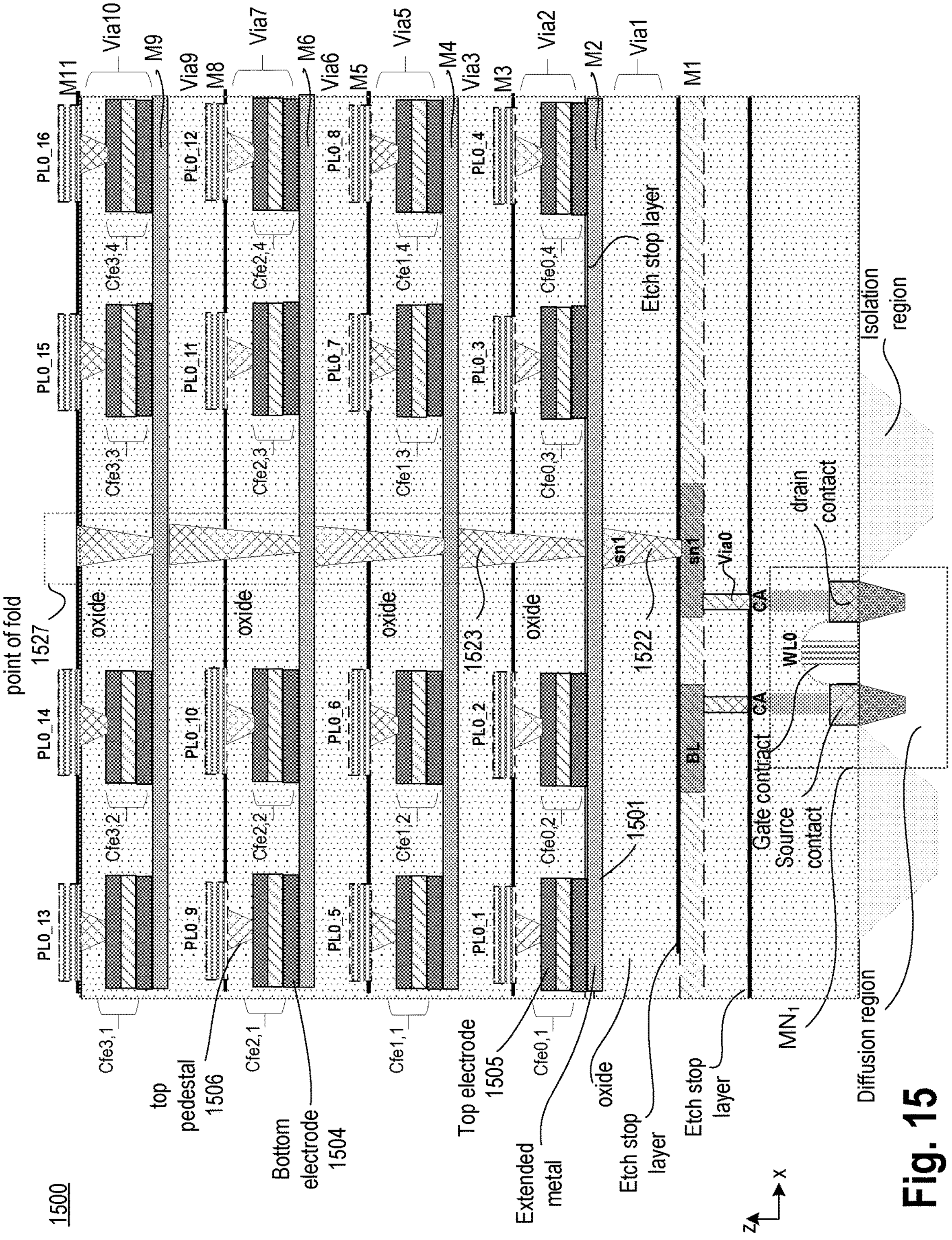
FIG. 15 illustrates a cross-section of a memory bit-cell with folded and stacked capacitors or memory elements, in accordance with some embodiments.

FIG. 15 illustrates a cross-section of a memory bit-cell 1500 with folded and stacked capacitors or memory elements, in accordance with some embodiments. In this example, the memory bit-cell comprises one transistor $MN_1$ having a gate terminal controllable by WL0. The source and drain terminals or contacts of the transistor are coupled to respective contacts (CA). Etch stop layer is used in the fabrication of vias (via0) to connect one of the source or drain contacts of the transistor to the storage node sn1 on metal-1 (M1) layer, and another one of the source or drain contacts of the transistor to BL on M1 layer. In some embodiments, another etch stop layer is formed over M1 layer to fabricate vias (via1) to couple to respective M1 layers.

In this example, the 1TnC memory bit-cell has 16 capacitors. However, any number of capacitors may be used for 1TnC memory bit-cell. An individual capacitor has a bottom shared electrode 1501 which is coupled to storage node sn1 1522 and top electrode 1505 which is coupled to a respective plate-line. In some embodiments, instead of or in addition to shared bottom electrode 1501, an individual capacitor may include a bottom electrode 1504. In some embodiments, top electrode 1505 is coupled to the plate-line via pedestal 1506. In the stack and fold configuration, N number of capacitors can be divided in L number of stack layers such that there are N/L capacitors in each cap layer. In this example, 16 capacitors (Cfe0,1, Cfe0,2, Cfe0,3, Cfe0,4, Cfe1,1, Cfe1,2, Cfe1,3, Cfe1,4, Cfe2,1, Cfe2,2, Cfe2,3, Cfe2,4, Cfe3,1, Cfe3,2, Cfe3,3, and Cfe3,4) are divided in four number of stacked layers such that there are 16/4 capacitors in each stacked layer. Each capacitor has a first terminal coupled to a common node sn1 1522, and a second terminal coupled to a respective plate-line. In various embodiments, common node sn1 1522 thus becomes a point of fold 1527.

In the various embodiments, the planar capacitors are illustrated with three layers-top electrode, dielectric, and bottom electrode. While capacitors can be formed like that, the illustrative capacitor can include any of the planar capacitor configurations discussed herein. For example, the planar capacitors can be any one of capacitors of FIGS. 4A-B or memory elements described with reference to FIG. 13.

Referring to FIG. 15, in some embodiments, the capacitors are positioned symmetrically relative to point of fold 1527, common node sn1. In one example, equal number of capacitors are positioned on either side of the common node sn1 and in the stack. In some embodiments, the capacitors are not positioned symmetrically relative to the point of fold. For example, there may be more capacitors on one side of the storage node sn1 relative to another side. Further, each layer may also have a symmetric or non-symmetric arrangement of the capacitors. In some embodiments, the capacitors are spaced by substantially at equal lateral (horizontal x-plane) distance Li. In some embodiments, the capacitors are separated by non-equal lateral distance.

In a stacked only configuration, the capacitors would be vertically stacked resulting in a tall memory cell. In that case, depending on the process technology node, the number of capacitors may be limited by the number of metal layers available by the process technology node. In the stack and fold configuration, the capacitors are vertically stacked as well as horizontally placed by sharing a common electrode, which in turn couples to a shared node (e.g., storage node sn1). So, first terminals of the capacitors are coupled to the shared node sn1.

In some embodiments, in the first row, the second terminal of Cfe0,1 is coupled to plate-line PL0_1, the second terminal of Cfe0,2 is coupled to plate-line PL0_2, the second terminal of Cfe0,3 is coupled to plate-line PL0_3, and the second terminal of Cfe0,4 is coupled to plate-line PL0_4. In some embodiments, in the second row, the second terminal of Cfe1,1 is coupled to plate-line PL0_5, the second terminal of Cfe1,2 is coupled to plate-line PL0_6, the second terminal of Cfe1,3 is coupled to plate-line PL0_7, and the second terminal of Cfe1,4 is coupled to plate-line PL0_8. In some embodiments, in the third row, the second terminal of Cfe2,1 is coupled to plate-line PL0_9, the second terminal of Cfe2,2 is coupled to plate-line PL0_10, the second terminal of Cfe2,3 is coupled to plate-line PL0_11, and the second terminal of Cfe2,4 is coupled to plate-line PL0_12. In some embodiments, in the fourth row, the second terminal of Cfe3,1 is coupled to plate-line PL0_13, the second terminal of Cfe3,2 is coupled to plate-line PL0_14, the second terminal of Cfe3,3 is coupled to plate-line PL0_15, and the second terminal of Cfe3,4 is coupled to plate-line PL0_16.

In some embodiments, each capacitor structure includes a shared bottom electrode 1501 which couples to the capacitors of that row and to the common node sn1 1522. In some embodiments, multiple vias are used for common node sn1 to connect the common node sn1 on M1 to shared bottom electrode 1501. In some examples, multiple vias are used for storage node sn1 to couple to shared bottom electrode 1501 to reduce reliability issues like electromigration. In some embodiments, a vertical tower of vias and metal layers are used to extend the storage node sn1 to higher levels along the vertical direction.

In some embodiments, shared bottom electrode 1501 (or the extended bottom electrode) can be a metal electrode or a first conductive oxide, or a combination of a second conductive oxide and a barrier or insulative material, in accordance with some embodiments. The barrier material or insulative material can be according to any one of the insulative materials discussed herein. In some embodiments, shared bottom electrode 1501 comprises a reflective intermetallic material. By using a shared bottom electrode, fabrication steps for fabricating each capacitor are reduced. Further, the vertical height is also reduced for the memory bit-cell. In some embodiments, shared bottom electrode 1501 is in direct contact with the ferroelectric material or the memory material. In some embodiments, shared bottom electrode 1501 is indirectly coupled to the ferroelectric material or the memory material.

In some embodiments, a metal layer is formed over top electrode of each capacitor to connect to a respective input. In some embodiments, a pedestal is formed between the top electrode and the metal layer connected to the respective input. For example, metal layer over a pedestal which is adjacent to the top electrode of capacitor Cfe0,1 is connected to plate-line PL0_1. Metal layer over a pedestal which is adjacent to the top electrode of capacitor Cfe1,1 is connected to plate-line PL0_5 and so on. In some embodiments, the pedestals have a barrier material on its sidewalls as discussed with reference to FIG. 4C.

Referring to FIG. 15, the metal layers coupled to the bottom electrodes of the capacitors are coupled to storage node sn1 through respective vias. In some embodiments, multiple vias connect the bottom extended electrode of each capacitor stack. These multiple vias are connected to the storage node sn1. The multiple vias, connected to the metal layer (e.g., M3) for sn1 as the storage node, connect to extended bottom electrode of higher capacitors in the stack. In some embodiments, vias 1523 are misaligned. In some embodiments, vias 1523 are aligned. Here the term "misaligned" is generally referred to vias or pedestals that are not continuous in their vertical extension and have side branches as the vias couple to metal layers and other vias to extend vertically up. Conversely, the term "aligned" here generally refers to vias or pedestals that are continuous in their vertical extension. The term continuous here generally means that the via or pedestal extends without interruption. In some examples, the term continuous also refers to the extension of via or pedestal with nominal interruption (such as an intervening metal layer) but the subsequent via or pedestal on the metal layer is along the same vertical line of extension as the via below the metal line.

In some embodiments, metal-2 (M2) is deposited over vias (via1). M2 layer is then polished. In some embodiments, capacitors can be moved further up in the stack, where the capacitor level processing is done between different layers. In some embodiments, oxide is deposited over the etch stop layer. Thereafter, dry, or wet etching is performed to form holes for pedestals. The holes are filled with metal, and land on the respective M2 layers. Fabrication processes such as interlayer dielectric (ILD) oxide deposition followed by ILD etch (to form holes for the pedestals), deposition of metal into the holes, and subsequent polishing of the surface are used to prepare for post pedestal fabrication.

A number of fabrication processes of deposition, lithography, and etching takes place to form the stack of layers for the planar capacitor. In some embodiments, the capacitors are formed in a backend of the die. In some embodiments, deposition of ILD is followed by surface polish.

In some embodiments, after polishing the surface, ILD is deposited, in accordance with some embodiments. Thereafter, holes are etched through the ILD to expose the top electrodes of the capacitors, in accordance with some embodiments. The holes are then filled with metal, in accordance with some embodiments. Followed by filling the holes, the top surface is polished, in accordance with some embodiments. As such, the capacitors are connected to plate-lines and storage node sn1 (through the pedestals), in accordance with some embodiments.

In some embodiments, ILD is deposited over the polished surface. Holes for via are then etched to contact the M2 layer, in accordance with some embodiments. The holes are filled with metal to form vias (via2), in accordance with some embodiments. The top surface is then polished, in accordance with some embodiments. In some embodiments, process of depositing metal over the vias (via2), depositing ILD, etching holes to form pedestals for the next capacitors of the stack, forming the capacitors, and then forming vias that contact the M3 layer, are repeated. This process is repeated to form various capacitors in the stack.

In some embodiments, the top electrode of each capacitor is allowed to directly contact the metal above. For example, the pedestals that connect to the top electrodes are removed. In this embodiment, the height of the stacked capacitors is lowered, and the fabrication process is simplified because the extra steps for forming the pedestals are removed.

Figure 16A:
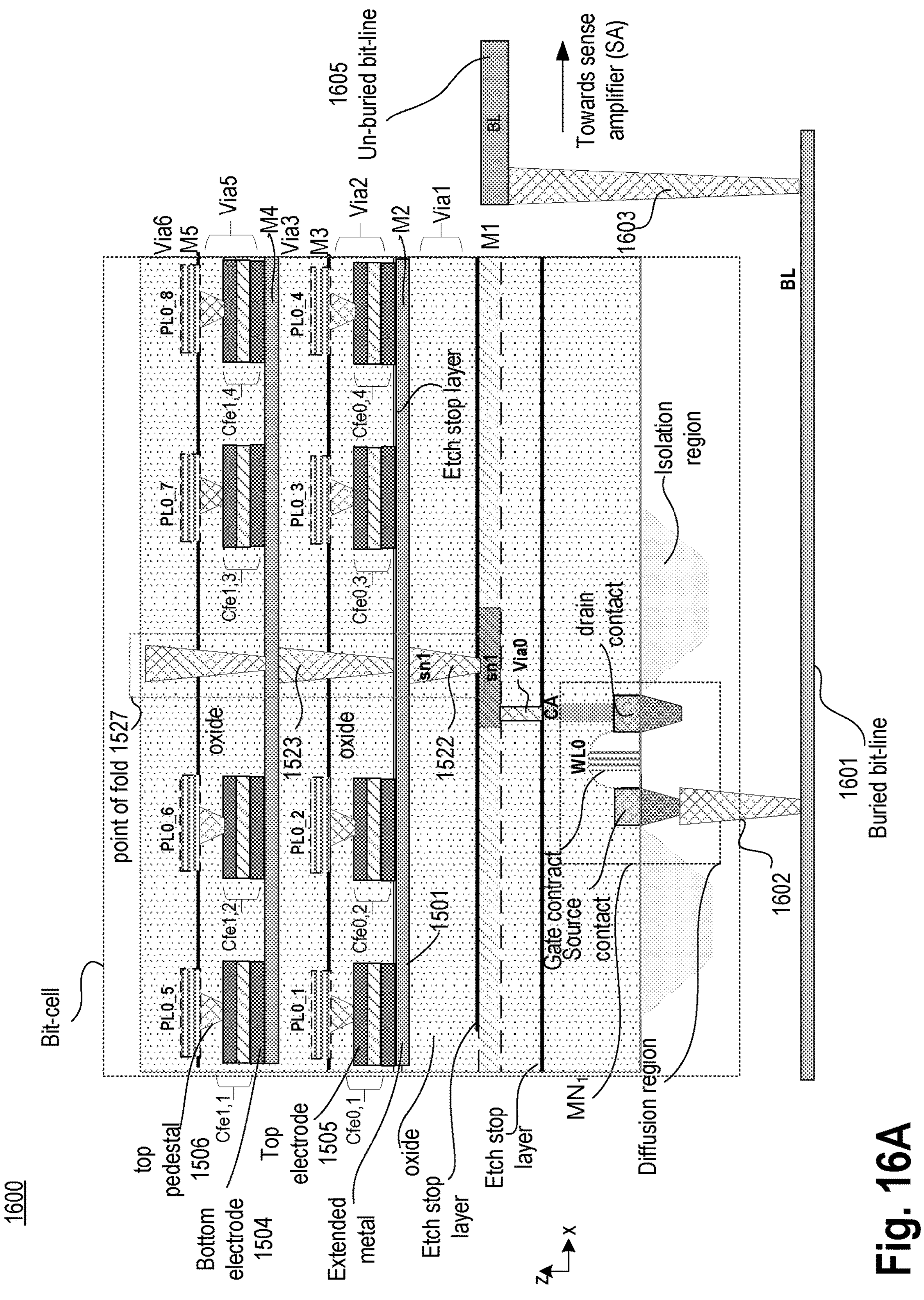
FIG. 16A illustrates a cross-section of a memory bit-cell with folded and stacked capacitors or memory elements and buried bit-line, in accordance with some embodiments.

FIG. 16A illustrates a cross-section of a memory bit-cell 1600 with folded and stacked capacitors or memory elements and buried bit-line, in accordance with some embodiments. Memory bit-cell 1600 is similar to memory bit-cell 1500 but for using a buried metal. Here, the term "buried metal" generally refers to a metal layer that is positioned below the transistor diffusion regions. In this example, the buried metal is bit-line BL 1601 which is coupled to the source/drain region via buried via 1602 as shown. The buried bit-line further reduces the capacitance on the left and right bit-lines because thicker metal may be used to fabricate the buried bit-line for faster signal propagation. Using the buried bit-line also frees up the space above the capacitors for routing the bit-line and/or the split bit-lines.

Buried bit-line also helps reduce parasitic capacitance associated with high dielectric material (e.g., those used for the non-linear polar material and other resistive memories). Buried metal line also helps with process complexity associated with creating a via structure that escapes the ferroelectric/memory device layers. Note, fabricating the via stack escaping the ferroelectric device layer stack (i.e., the capacitor layers) are more involved in a multi-stacked ferroelectric capacitor based memory such as 1TnC, and multi-element ferroelectric gain memory, having stacked capacitors. In some embodiments, buried bit-line 1601 escapes through one or more vias 1603 to un-buried bit-line 1605. In some embodiments, un-buried bit-line 1605 routes towards the sense amplifier (SA). In various embodiments, the mid-array switched bit-line escapes before the capacitor layers are deposited, removing the need to provision for tight via stack escaping the ferroelectric device layer stack. In some embodiments, un-buried BL 1605 (e.g., BL0) is routed on the same metal layer as storage node sn1. For example, un-buried BL 1605 is routed on metal layer 1 (M1).

Figure 16B:
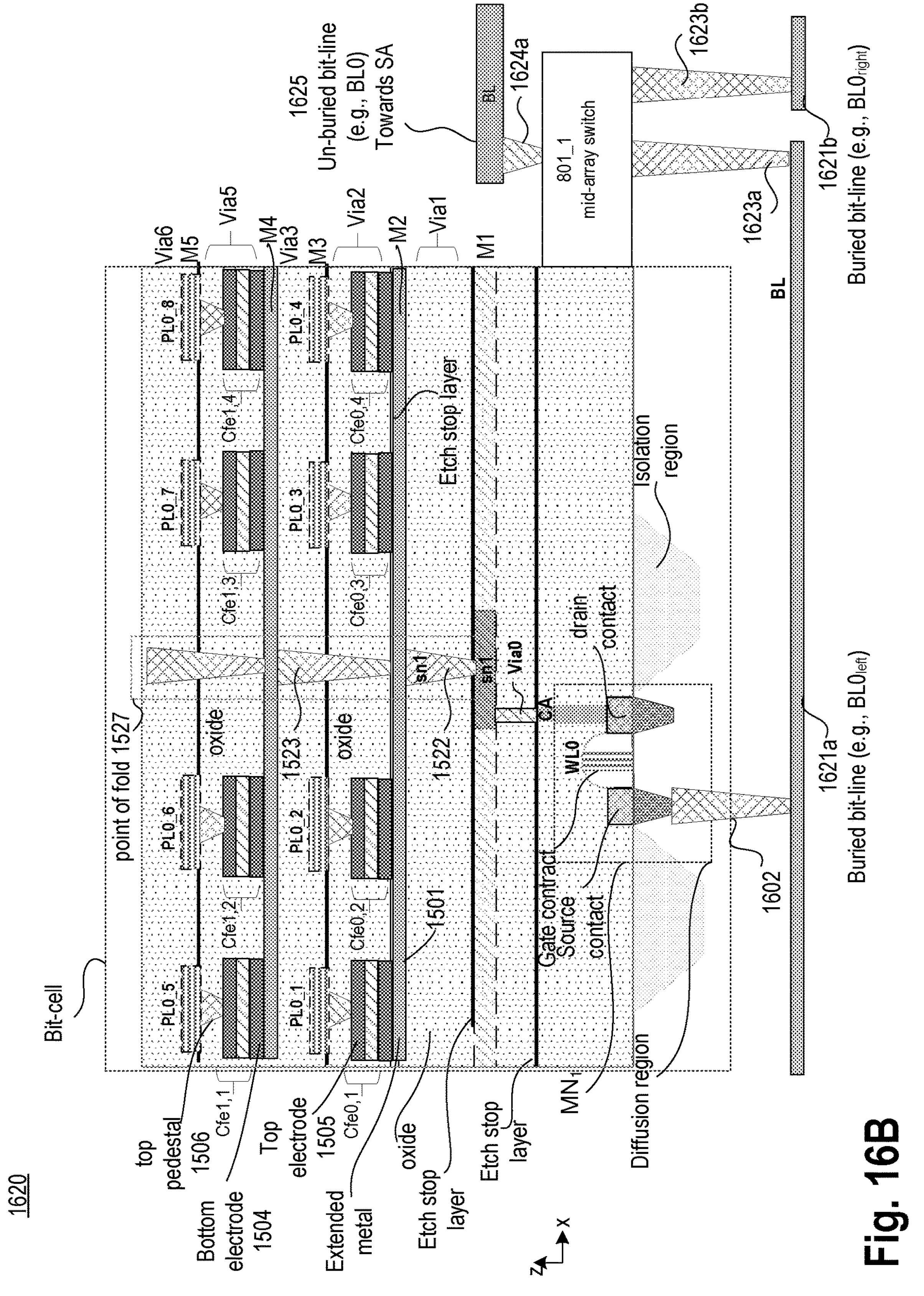
FIG. 16B illustrates a cross-section of a memory comprising a memory bit-cell with folded and stacked capacitors or memory elements and buried local bit-line, and mid-array switch, in accordance with some embodiments.

FIG. 16B illustrates a cross-section of a memory 1620 comprising a memory bit-cell with folded and stacked capacitors or memory elements and buried bit-line, and mid-array switch, in accordance with some embodiments. FIG. 16B is similar to FIG. 16A but for a view showing mid-array switch 801_1 which is then coupled to buried and unburied bit-lines. In various embodiments, mid-array switch 801_1 is fabricated in the active region (e.g., same region where transistor $MN_1$ is fabricated). In some embodiments, buried bit-lines 1621*a* (e.g., BL$\mathbf{0}_{left}$) and 1621*b* (e.g., BL$\mathbf{0}_{right}$) are fabricated under the active region (e.g., under $MN_1$ and transistors of mid-array switch 801_1). In some embodiments, buried bit-line 1621*a* is coupled to one or more transistors of mid-array switch 8011 through via 1623*a*. For example, buried bit-line 1621*a* is coupled to transistor MN10 of mid-array switch 801_1 through one or more vias 1623*a*. In some embodiments, buried bit-line 1621*b* is coupled to one or more transistors of mid-array switch 801_1 through via 1623*b*. For example, buried bit-line 1621*b* is coupled to transistor MN20 of mid-array switch 801_1 through one or more vias 1623*b*. In various embodiments, split bit-lines 1621*a* and 1621*b* are split from un-buried bit-line 1625 which is coupled to mid-array switch 8011 through via 1624*a*. In some embodiments, control (and/or control_b) is also then coupled to mid-array switch 801_1 though one or more vias. In some embodiments, un-buried BL 1625 is routed above mid-array switch 801_1 but below the bit-cell. In one such example, the vertical area above mid-array switch 801_1 can be used to route un-buried BL 1625. In some embodiments, un-buried BL 1625 (e.g., BL0) is routed on the same metal layer as storage node sn1. For example, un-buried BL 1625 is routed on metal layer 1 (M1).

Figure 16C:
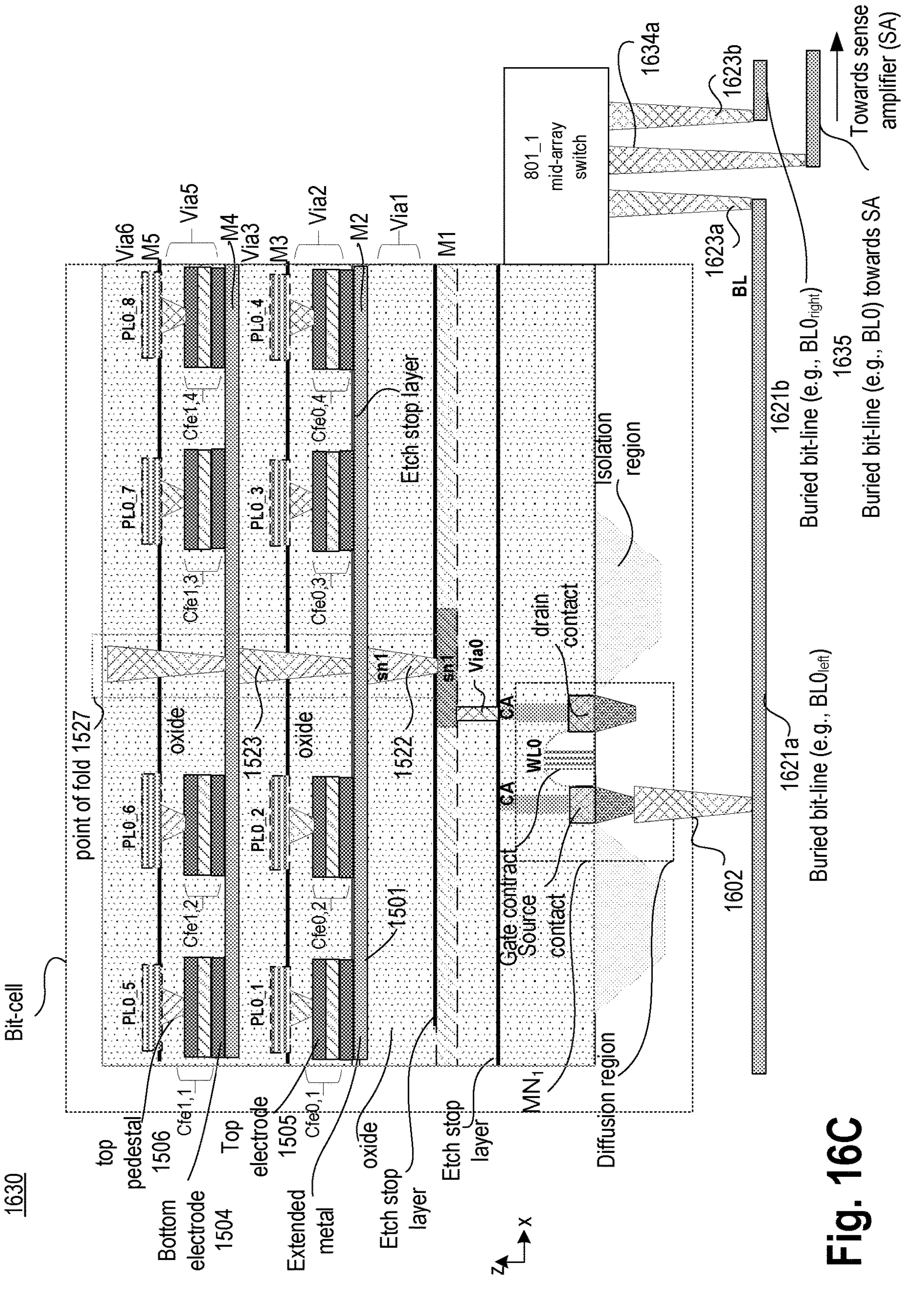
FIG. 16C illustrates a cross-section of a memory comprising a memory bit-cell with folded and stacked capacitors or memory elements and buried bit-lines, and mid-array switch, in accordance with some embodiments.

FIG. 16C illustrates a cross-section of a memory 1630 comprising a memory bit-cell with folded and stacked capacitors or memory elements and buried bit-lines, and mid-array switch, in accordance with some embodiments. Compared to FIG. 16B, here the split bit-lines (e.g., 1621*a* and 1621*b*) and un-split or main bit-line 1635 (e.g., BL0) are routed under the active region, in accordance with some embodiments. In some embodiments, one or more vias 1634*a* are used to connect main bit-line 1635 with mid-array switch 801_1. In some embodiments, main bit-line 1635 is routed towards the SA. Near or under the SA, the buried bit-line is routed up through one or more vias to connect to the SA. In some embodiments, the main bit-line is routed on a metal layer lower than the metal layer for split buried bit-lines.

Figure 16D:
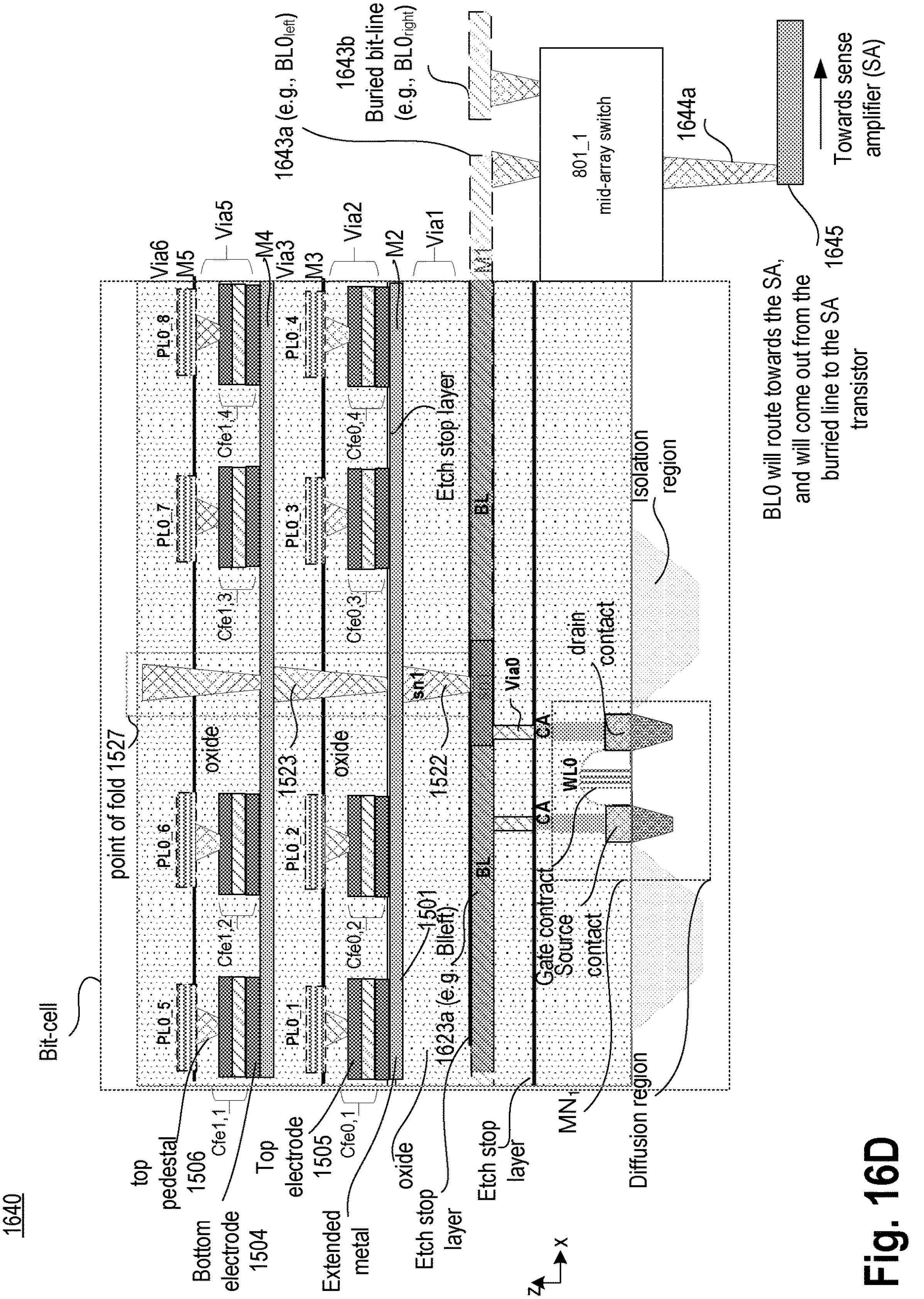
FIG. 16D illustrates a cross-section of a memory comprising a memory bit-cell with folded and stacked capacitors or memory elements and buried main bit-line, and mid-array switch, in accordance with some embodiments.

FIG. 16D illustrates a cross-section of a memory 1640 comprising a memory bit-cell with folded and stacked capacitors or memory elements and buried main bit-line, and mid-array switch, in accordance with some embodiments. In some embodiments, to lower the routing congestion for bit-lines, the main bit-line is routed as a buried bit-line while the split bit-lines are routed above the active region (e.g., above transistor $MN_1$). In this example, split bit-lines 1643*a* and 1643*b* are routed on M1 while buried main bit-line 1645 is routed under the active region (e.g., under mid-array switch 801_1). In some embodiments, one or more vias 1644*a* are used to connect main bit-line 1645 with mid-array switch 801_1. In some embodiments, main bit-line 1645 is routed towards the SA. Near or under the SA, the buried bit-line is routed up through one or more vias to connect to the SA. In some embodiments, main bit-line 1645 is routed on a metal layer below the active devices.

Figure 16E:
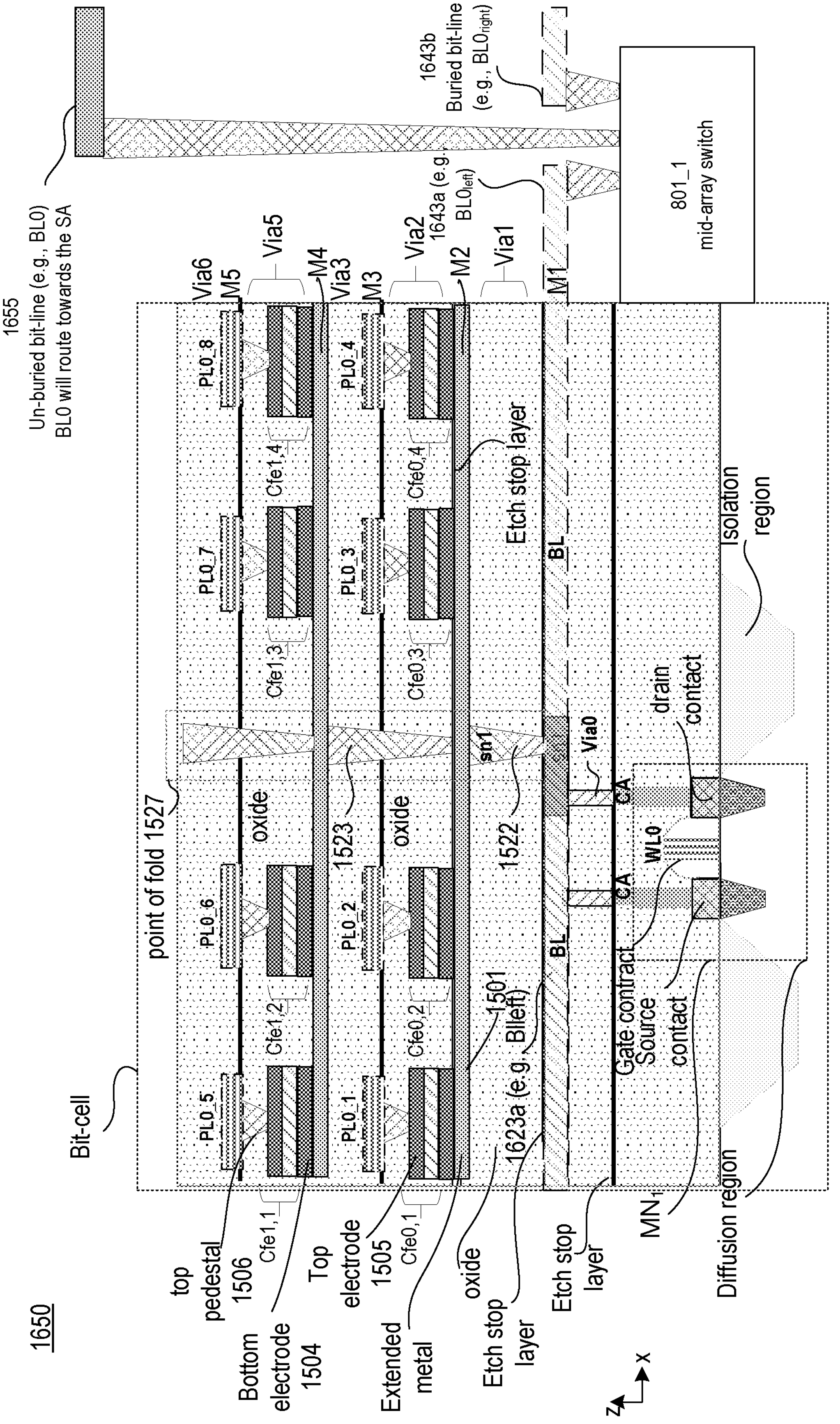
FIG. 16E illustrates a cross-section of a memory comprising a memory bit-cell with folded and stacked capacitors or memory elements and non-buried bit-lines, and mid-array switch, in accordance with some embodiments.

FIG. 16E illustrates a cross-section of a memory 1650 comprising a memory bit-cell with folded and stacked capacitors or memory elements and non-buried bit-lines, and mid-array switch, in accordance with some embodiments. FIG. 16D is similar to FIG. 16E but for routing the main bit-line (e.g., BL0) above the memory bit-cell. In this example, bit-line 1655 is routed towards SA over the bit-cell.

While the various embodiments here are illustrated with reference to stacked and folded capacitors, the capacitors can be stacked without folding. With reference to the example of 8 capacitors, there will be eight capacitors stacked over one another resulting in a taller bit-cell with a smaller x-y footprint compared to stacked and folded configuration. Each level may have one capacitor with a bottom electrode which is coupled to the storage node sn1 via a metal layer. Each level may have one plate-line coupled to the top electrode of the capacitor. While the embodiments are illustrated with reference to planar capacitors, the capacitors can be replaced by non-planar capacitors (or pillar capacitors). Pillar capacitors in a stack may share a common metal extending vertically along the z-axis. This common metal is a shaft, which forms the bottom electrode, coupled to the storage node sn1. A plate-line may couple the outer electrode, which forms the top electrode, of an individual capacitor. The non-planar capacitors can be stacked and folded or simply stacked, in accordance with some embodiments.

Figure 17:
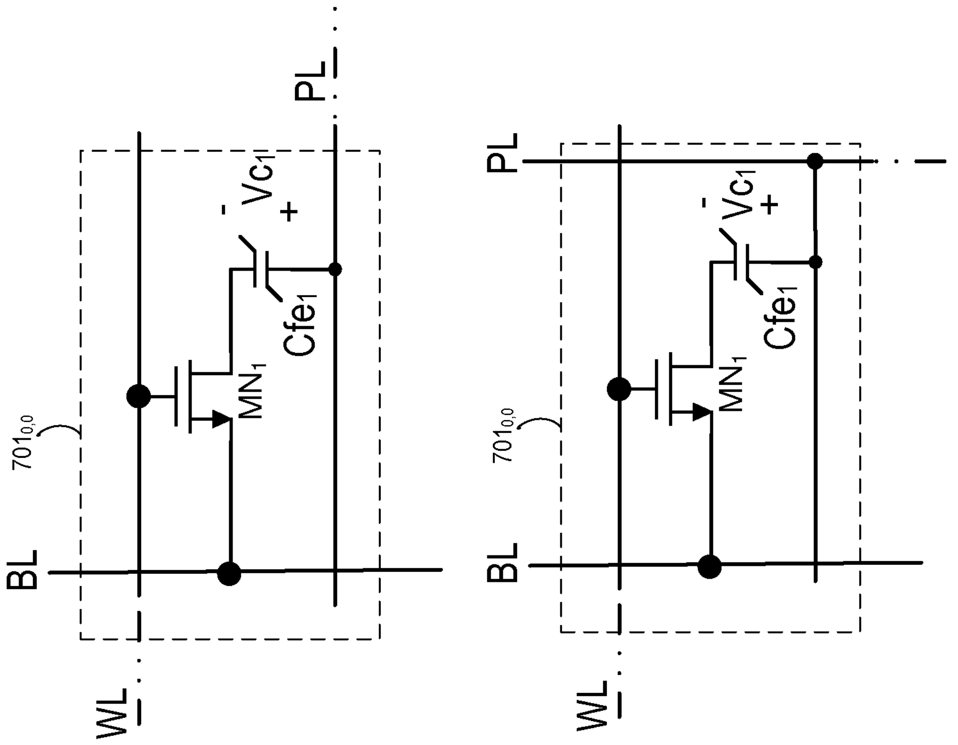
FIG. 17 illustrates a 1T1C bit-cell which may be used in the split memory arrays, in accordance with some embodiments.

While the embodiments are described with reference to 1TnC, 1TnME, or multi-element gain bit-cells, the embodiments are appliable to the simpler bit-cell cells such as 1T1C bit-cell. One such example is illustrated by FIG. 17. FIG. 17 illustrates a 1T1C bit-cell 1700 which may be used in the split memory arrays. In some embodiments, bit-cell $\mathbf{701}_{0,0}$ comprises a word-line (WL), a plate-line (PL), a bit-line (BL), an access transistor $MN_1$, and FE capacitive structure Cfe. The gate of transistor $MN_1$ is coupled to a common WL. In various embodiments, one terminal of the FE capacitive structure $Cfe_1$ is coupled to a PL. The second terminal of the FE capacitive structure is coupled to source or drain terminal of the transistor $MN_1$. In various embodiments, BL is coupled to the source or drain terminal of first transistor $MN_1$. In some embodiments, the PL is parallel to the WL and orthogonal to the BL as illustrated by the bit-cell on the top. In some embodiments, the PL is parallel to the BL and orthogonal to the WL as illustrated by the bit-cell on the bottom. The ferroelectric material of capacitor Cfe can be replaced with other non-linear polar materials. In some embodiments, capacitor Cfe is replaced by a memory element (ME). The embodiments of FIG. 16A-E that describe the various configurations of buried and unburied bit-lines are also appliable to 1T1C bit-cell based memory arrays.

Figure 18:
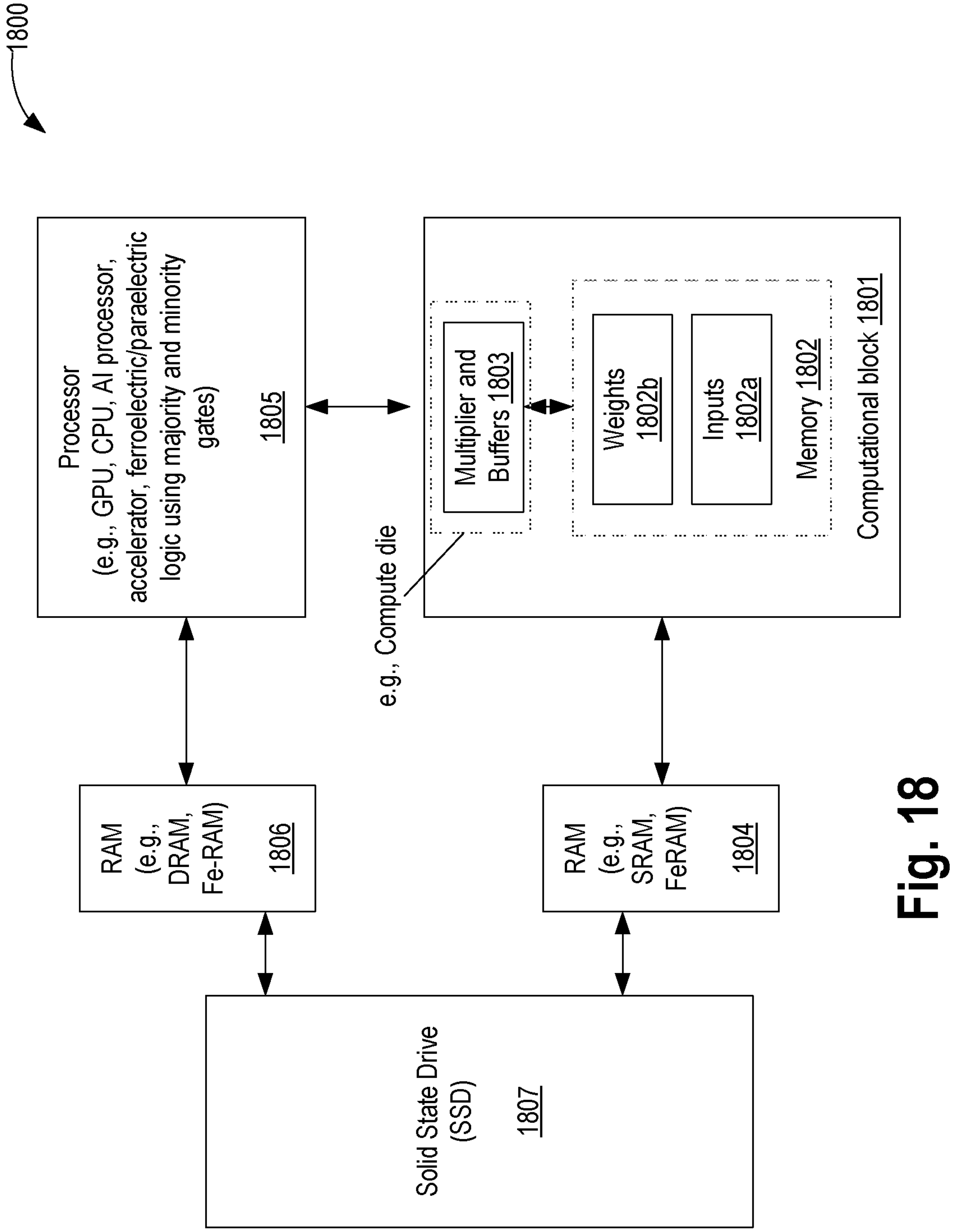
FIG. 18 illustrates a high-level architecture of an artificial intelligence (AI) machine comprising a compute die stacked over a memory die, where the memory die includes memory arrays, where the memory arrays are split and include mid-array switches between the split arrays, in accordance with some embodiments.

FIG. 18 illustrates a high-level architecture of an artificial intelligence (AI) machine 1800 comprising a compute die stacked over a memory die, where the memory die includes memory arrays, where the memory arrays are split and include mid-array switches between the split arrays, in accordance with some embodiments.

AI machine 1800 comprises computational block 1801 or processor having random-access memory (RAM) 1802 and multiplier and buffers 1803; first random-access memory 1804 (e.g., static RAM (SRAM), ferroelectric or paraelectric RAM (FeRAM), ferroelectric or paraelectric static random-access memory (FeSRAM)), main processor 1805, second random-access memory 1806 (dynamic RAM (DRAM), FeRAM), and solid-state memory or drive (SSD) 1807. In some embodiments, some, or all components of AI machine 1800 are packaged in a single package forming a system-on-chip (SoC). The SoC can be configured as a logic-on-logic configuration, which can be in a 3D configuration or a 2.5D configuration.

In some embodiments, computational block 1801 is packaged in a single package and then coupled to processor 1805 and memories 1804, 1806, and 1807 on a printed circuit board (PCB). In some embodiments, computational block 1801 is configured as a logic-on-logic configuration, which can be in a 3D configuration or a 2.5D configuration. In some embodiments, computational block 1801 comprises a special purpose compute die 1803 or microprocessor. For example, compute die 1803 is a compute chiplet that performs a function of an accelerator or inference. In some embodiments, memory 1802 is DRAM which forms a special memory/cache for the special purpose compute die 1803. The DRAM can be embedded DRAM (eDRAM) such as 1T1C (one transistor and one capacitor) based memories. In some embodiments, RAM 1802 is ferroelectric or paraelectric RAM (Fe-RAM).

In some embodiments, compute die 1803 is specialized for applications such as Artificial Intelligence, graph processing, and algorithms for data processing. In some embodiments, compute die 1803 further has logic computational blocks, for example, for multipliers and buffers, a special data memory block (e.g., buffers) comprising DRAM, FeRAM, or a combination of them. In some embodiments, RAM 1802 has weights and inputs stored to improve the computational efficiency. The interconnects between processor 1805 (also referred to as special purpose processor), first RAM 1804 and compute die 1803 are optimized for high bandwidth and low latency. The architecture of FIG. 18 allows efficient packaging to lower the energy, power, or cost and provides for ultra-high bandwidth between RAM 1804 and compute chiplet 1803 of computational block 1801.

In some embodiments, RAM 1802 is partitioned to store input data (or data to be processed) **1802*a* and weight factors 1802*b*. In some embodiments, input data 1802*a* is stored in a separate memory (e.g., a separate memory die) and weight factors 1802*b*** are stored in a separate memory (e.g., separate memory die).

In some embodiments, computational logic or compute chiplet 1803 comprises matrix multiplier, adder, concatenation logic, buffers, and combinational logic. In various embodiments, compute chiplet 1803 performs multiplication operation on inputs **1802*a* and weights 1802*b*. In some embodiments, weights 1802*b* are fixed weights. For example, processor 1805 (e.g., a graphics processor unit (GPU), field programmable grid array (FPGA) processor, application specific integrated circuit (ASIC) processor, digital signal processor (DSP), an AI processor, a central processing unit (CPU), or any other high-performance processor) computes the weights for a training model. Once the weights are computed, they are stored in memory 1802. In various embodiments, the input data that is to be analyzed using a trained model is processed by computational block 1801 with computed weights 1802*b*** to generate an output (e.g., a classification result).

In some embodiments, first RAM 1804 is ferroelectric or paraelectric based SRAM. For example, a six transistor (6T) SRAM bit-cells having ferroelectric or paraelectric transistors are used to implement a non-volatile FeSRAM. In some embodiments, SSD 1807 comprises NAND flash cells. In some embodiments, SSD 1807 comprises NOR flash cells. In some embodiments, SSD 1807 comprises multi-threshold NAND flash cells.

In various embodiments, the non-volatility of FeRAM is used to introduce new features such as security, functional safety, and faster reboot time of AI machine 1800. The non-volatile FeRAM is a low power RAM that provides fast access to data and weights. FeRAM 1804 can also serve as a fast storage for computational block 1801 (which can be an inference die or an accelerator), which typically has low capacity and fast access requirements.

In various embodiments, FeRAM (FeDRAM or FeSRAM) includes ferroelectric or paraelectric material. The ferroelectric or paraelectric material may be in a transistor gate stack or in a capacitor of the memory. The ferroelectric material can be any suitable low voltage FE material discussed with reference to various embodiments. While embodiments here are described with reference to ferroelectric material, the embodiments are applicable to any of the nonlinear polar materials described herein.

Figure 19:
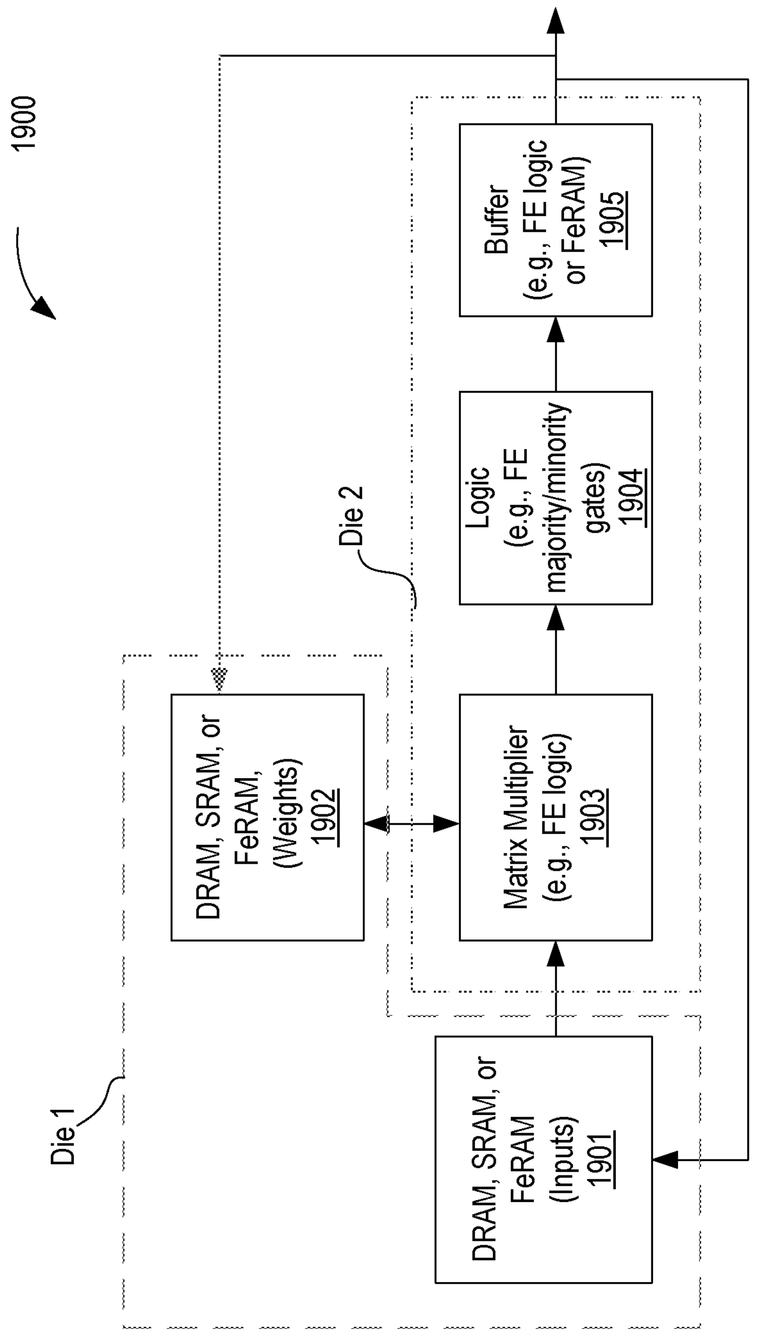
FIG. 19 illustrates an architecture of a computational block comprising a compute die stacked with a memory die, wherein the memory die includes memory arrays that are split and include mid-array switches between the split arrays, in accordance with some embodiments.

FIG. 19 illustrates an architecture of a computational block 1900 comprising a compute die stacked with a memory die, wherein the memory die includes memory arrays that are split and include mid-array switches between the split arrays, in accordance with some embodiments. The architecture of FIG. 19 illustrates an architecture for a special purpose compute die where RAM memory buffers for inputs and weights are split on die-1 and logic and optional memory buffers are split on die-2.

In some embodiments, memory die (e.g., Die 1) is positioned below a compute die (e.g., Die 2) such that a heat sink or thermal solution is adjacent to the compute die. In some embodiments, the memory die is embedded in an interposer. In some embodiments, the memory die behaves as an interposer in addition to its basic memory function. In some embodiments, the memory die is a high bandwidth memory (HBM) which comprises multiple dies of memories in a stack and a controller to control the read and write functions to the stack of memory dies. In some embodiments, the memory die comprises a first die 1901 to store input data and a second die 1902 to store weight factors. In some embodiments, the memory die is a single die that is partitioned such that first partition 1901 of the memory die is used to store input data and second partition 1902 of the memory die is used to store weights. In some embodiments, the memory die comprises DRAM. In some embodiments, the memory die comprises FE-SRAM or FE-DRAM. In some embodiments, the memory die comprises MRAM. In some embodiments, the memory die comprises SRAM. For example, memory partitions 1901 and 1902, or memory dies 1901 and 1902 include one or more of: DRAM, FE-SRAM, FE-DRAM, SRAM, and/or MRAM. In some embodiments, the input data stored in memory partition or die 1901 is the data to be analyzed by a trained model with fixed weights stored in memory partition or die 1902.

In some embodiments, the compute die comprises ferroelectric or paraelectric logic (e.g., majority, minority, and/or threshold gates) to implement matrix multiplier 1903, logic 1904, and temporary buffer 1905. Matrix multiplier 1903 performs multiplication operation on input data 'X' and weights 'W' to generate an output 'Y'. This output may be further processed by logic 1904. In some embodiments, logic 1904 performs a threshold operation, pooling and drop out operations, and/or concatenation operations to complete the AI logic primitive functions.

In some embodiments, the output of logic 1904 (e.g., processed output 'Y') is temporarily stored in buffer 1905. In some embodiments, buffer 1905 is memory such as one or more of: DRAM, Fe-SRAM, Fe-DRAM, MRAM, resistive RAM (Re-RAM) and/or SRAM. In some embodiments, buffer 1905 is part of the memory die (e.g., Die 1). In some embodiments, buffer 1905 performs the function of a re-timer. In some embodiments, the output of buffer 1905 (e.g., processed output 'Y') is used to modify the weights in memory partition or die 1902. In one such embodiment, computational block 1900 not only operates as an inference circuitry, but also as a training circuitry to train a model. In some embodiments, matrix multiplier 1903 includes an array of multiplier cells, wherein the DRAMs 1901 and 1902 include arrays of memory bit-cells, respectively, wherein each multiplier cell is coupled to a corresponding memory bit-cell of DRAM 1901 and/or DRAM 1902. In some embodiments, computational block 1900 comprises an interconnect fabric coupled to the array of multiplier cells such that each multiplier cell is coupled to the interconnect fabric.

Architecture 1900 provides reduced memory access for the compute die (e.g., die 2) by providing data locality for weights, inputs, and outputs. In one example, data from and to the AI computational blocks (e.g., matrix multiplier 1903) is locally processed within a same packaging unit. Architecture 1900 also segregates the memory and logic operations onto a memory die (e.g., Die 1) and a logic die (e.g., Die 2), respectively, allowing for optimized AI processing. Desegregated dies allow for improved yield of the dies. A high-capacity memory process for Die 1 allows reduction of power of the external interconnects to memory, reduces cost of integration, and results in a smaller footprint.

Figure 20:
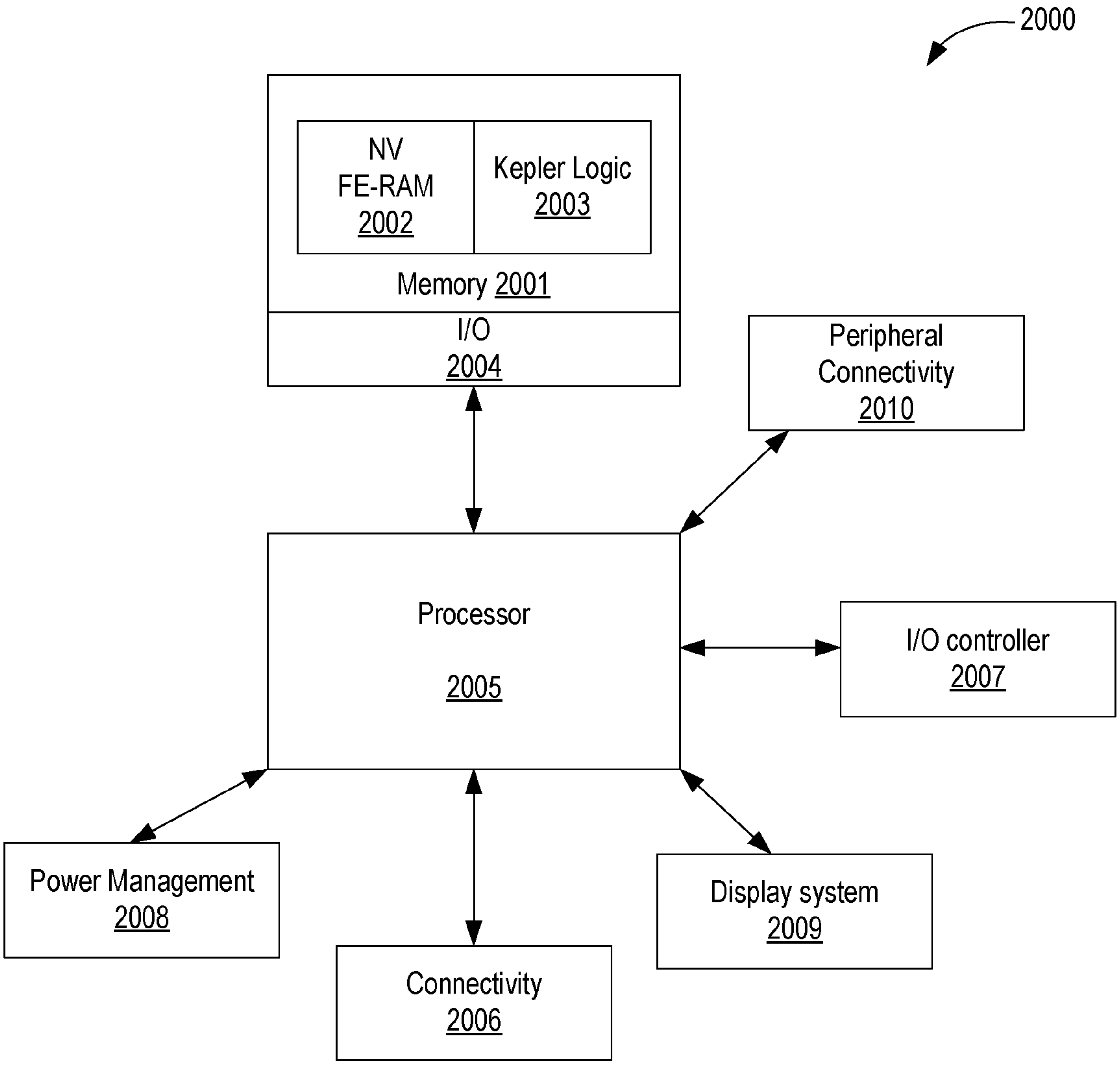
FIG. 20 illustrates a system-on-chip (SOC) that uses memory arrays that are split and include mid-array switches between the split arrays, in accordance with some embodiments.

FIG. 20 illustrates a system-on-chip (SOC) 2000 that uses memory arrays that are split and include mid-array switches between the split arrays, in accordance with some embodiments. SoC 2000 comprises memory 2001 having static random-access memory (SRAM) or FE based random-access memory FE-RAM, or any other suitable memory. The memory can be non-volatile (NV) or volatile memory. Memory 2001 may also comprise logic 2003 to control memory 2002. For example, write and read drivers are part of logic 2003. These drivers and other logic are implemented using the majority or threshold gates of various embodiments. The logic can comprise majority or threshold gates and traditional logic (e.g., CMOS based NAND, NOR etc.).

SoC further comprises a memory I/O (input-output) interface 2004. The interface may be a double-data rate (DDR) compliant interface or any other suitable interface to communicate with a processor. Processor 2005 of SoC 2000 can be a single core or multiple core processor. Processor 2005 can be a general-purpose processor (CPU), a digital signal processor (DSP), or an Application Specific Integrated Circuit (ASIC) processor. In some embodiments, processor 2005 is an artificial intelligence (AI) processor (e.g., a dedicated AI processor, a graphics processor configured as an AI processor). In various embodiments, processor 2005 executes instructions that are stored in memory 2001.

AI is a broad area of hardware and software computations where data is analyzed, classified, and then a decision is made regarding the data. For example, a model describing classification of data for a certain property or properties is trained over time with large amounts of data. The process of training a model requires large amounts of data and processing power to analyze the data. When a model is trained, weights or weight factors are modified based on outputs of the model. Once weights for a model are computed to a high confidence level (e.g., 95% or more) by repeatedly analyzing data and modifying weights to get the expected results, the model is deemed "trained." This trained model with fixed weights is then used to make decisions about new data. Training a model and then applying the trained model for new data is hardware intensive activity. In some embodiments, the AI processor has reduced latency of computing the training model and using the training model, which reduces the power consumption of such AI processor systems.

Processor 2005 may be coupled to a number of other chiplets that can be on the same die as SoC 2000 or on separate dies. These chiplets include connectivity circuitry 2006, I/O controller 2007, power management 2008, and display system 2009, and peripheral connectivity 2006.

Connectivity 2006 represents hardware devices and software components for communicating with other devices. Connectivity 2006 may support various connectivity circuitries and standards. For example, connectivity 2006 may support GSM (global system for mobile communications) or variations or derivatives, CDMA (code division multiple access) or variations or derivatives, TDM (time division multiplexing) or variations or derivatives, 3rd Generation Partnership Project (3GPP) Universal Mobile Telecommunications Systems (UMTS) system or variations or derivatives, 3GPP Long-Term Evolution (LTE) system or variations or derivatives, 3GPP LTE-Advanced (LTE-A) system or variations or derivatives, Fifth Generation (5G) wireless system or variations or derivatives, 5G mobile networks system or variations or derivatives, 5G New Radio (NR) system or variations or derivatives, or other cellular service standards. In some embodiments, connectivity 2006 may support non-cellular standards such as WiFi.

I/O controller 2007 represents hardware devices and software components related to interaction with a user. I/O controller 2007 is operable to manage hardware that is part of an audio subsystem and/or display subsystem. For example, input through a microphone or other audio device can provide input or commands for one or more applications or functions of SoC 2000. In some embodiments, I/O controller 2007 illustrates a connection point for additional devices that connect to SoC 2000 through which a user might interact with the system. For example, devices that can be attached to the SoC 2000 might include microphone devices, speaker or stereo systems, video systems or other display devices, keyboard or keypad devices, or other I/O devices for use with specific applications such as card readers or other devices.

Power management 2008 represents hardware or software that performs power management operations, e.g., based at least in part on receiving measurements from power measurement circuitries, temperature measurement circuitries, charge level of battery, and/or any other appropriate information that may be used for power management. By using majority and threshold gates of various embodiments, non-volatility is achieved at the output of these logic. Power management 2008 may accordingly put such logic into low power state without the worry of losing data. Power management may select a power state according to Advanced Configuration and Power Interface (ACPI) specification for one or all components of SoC 2000.

Display system 2009 represents hardware (e.g., display devices) and software (e.g., drivers) components that provide a visual and/or tactile display for a user to interact with the processor 2005. In some embodiments, display system 2009 includes a touch screen (or touch pad) device that provides both output and input to a user. Display system 2009 may include a display interface, which includes the particular screen or hardware device used to provide a display to a user. In some embodiments, the display interface includes logic separate from processor 2005 to perform at least some processing related to the display.

Peripheral connectivity 2010 may represent hardware devices and/or software devices for connecting to peripheral devices such as printers, chargers, cameras, etc. In some embodiments, peripheral connectivity 2010 may support communication protocols, e.g., PCIe (Peripheral Component Interconnect Express), USB (Universal Serial Bus), Thunderbolt, High-Definition Multimedia Interface (HDMI), Firewire, etc.

In various embodiments, SoC 2000 includes a coherent cache or memory-side buffer chiplet (not shown) which include ferroelectric or paraelectric memory. The coherent cache or memory-side buffer chiplet can be coupled to processor 2005 and/or memory 2001 according to the various embodiments described herein (e.g., via silicon bridge or vertical stacking).

The term "device" may generally refer to an apparatus according to the context of the usage of that term. For example, a device may refer to a stack of layers or structures, a single structure or layer, a connection of various structures having active and/or passive elements, etc. Generally, a device is a three-dimensional structure with a plane along the x-y direction and a height along the z direction of an x-y-z Cartesian coordinate system. The plane of the device may also be the plane of an apparatus, which comprises the device.

Throughout the specification, and in the claims, the term "connected" means a direct connection, such as electrical, mechanical, or magnetic connection between the things that are connected, without any intermediary devices.

The term "coupled" means a direct or indirect connection, such as a direct electrical, mechanical, or magnetic connection between the things that are connected or an indirect connection, through one or more passive or active intermediary devices.

The term "adjacent" here generally refers to a position of a thing being next to (e.g., immediately next to or close to with one or more things between them) or adjoining another thing (e.g., abutting it).

The term "circuit" or "module" may refer to one or more passive and/or active components that are arranged to cooperate with one another to provide a desired function.

The term "signal" may refer to at least one current signal, voltage signal, magnetic signal, or data/clock signal. The meaning of "a," "an," and "the" include plural references. The meaning of "in" includes "in" and "on."

Here, the term "analog signal" generally refers to any continuous signal for which the time varying feature (variable) of the signal is a representation of some other time varying quantity, i.e., analogous to another time varying signal.

Here, the term "digital signal" generally refers to a physical signal that is a representation of a sequence of discrete values (a quantified discrete-time signal), for example of an arbitrary bit stream, or of a digitized (sampled and analog-to-digital converted) analog signal.

The term "scaling" generally refers to converting a design (schematic and layout) from one process technology to another process technology and subsequently being reduced in layout area. The term "scaling" generally also refers to downsizing layout and devices within the same technology node. The term "scaling" may also refer to adjusting (e.g., slowing down or speeding up—i.e., scaling down, or scaling up respectively) of a signal frequency relative to another parameter, for example, power supply level.

The terms "substantially," "close," "approximately," "near," and "about," generally refer to being within +/−10% of a target value. For example, unless otherwise specified in the explicit context of their use, the terms "substantially equal," "about equal" and "approximately equal" mean that there is no more than incidental variation between among things so described. In the art, such variation is typically no more than +/−10% of a predetermined target value.

Here, the term "stack and fold" generally refers to a configuration of devices that are stacked vertically (substantially directly above or with a horizontal offset) such that one terminal of the devices is shared to a common node, and further the capacitors are placed along both sides of the common node. The common node thus becomes a point of fold. In various embodiments, the devices here are capacitors. The embodiments are not limited to capacitors and are applicable to any devices with a common node. In some embodiments, N number of capacitors can be divided in L number of stack layers such that there are N/L capacitors in each stacked layer. The N/L capacitor's one terminal can be shorted together with an electrode (e.g., bottom electrode). In some embodiments, the electrode can be metal, a conducting oxide, or a combination of a conducting oxide and a barrier (or insulative material).

In some embodiments, the capacitors are stacked and folded, and also vertically offset relative to lower capacitors in the stack. The offset allows for routing metal electrodes coupled to the top electrodes of the capacitors through space created by the offset while reducing parasitic to the capacitor(s) underneath. As such, the various metal electrodes are parallel to one another with limited jogs, for example.

In some embodiments, the capacitors are staggered while sharing a same bottom electrode or shared metal layer. The capacitors are staggered by having offsets in the x-direction and a y-direction relative to one another. The offsets allow for routing metal electrodes coupled to the top electrodes of the capacitors through space created by the offset. As such, the various metal electrodes are parallel to one another with limited jogs, for example. The various embodiments here can be combined with other embodiments. Hence, all possible permutations of combinations are not shown, but are within the scope of this disclosure.

Here the term "staggered configuration" or "staggered" generally refers to placement of devices (e.g., capacitors) relative to one another such that the devices are offset from one another in a horizontal plane and/or a vertical plane. When devices are offset in a horizontal plane, the devices may be diagonally away from one another (e.g., having an x-offset and a y-offset in an x-y horizontal plane). When devices are offset in a vertical plane, the devices may be diagonally away from one another (e.g., having an x-offset and a z-offset in a x-z vertical plane). In some examples, the devices can be staggered both horizontally and vertically. In some examples, the devices are staggered horizontally. In some embodiments, the devices are staggered vertically.

Unless otherwise specified the use of the ordinal adjectives "first," "second," and "third," etc., to describe a common object, merely indicate that different instances of like objects are being referred to and are not intended to imply that the objects so described must be in a given sequence, either temporally, spatially, in ranking or in any other manner.

For the purposes of the present disclosure, phrases "A and/or B" and "A or B" mean (A), (B), or (A and B). For the purposes of the present disclosure, the phrase "A, B, and/or C" means (A), (B), (C), (A and B), (A and C), (B and C), or (A, B and C).

The terms "left," "right," "front," "back," "top," "bottom," "over," "under," and the like in the description and in the claims, if any, are used for descriptive purposes and not necessarily for describing permanent relative positions. For example, the terms "over," "under," "front side," "back side," "top," "bottom," "over," "under," and "on" as used herein refer to a relative position of one component, structure, or material with respect to other referenced components, structures or materials within a device, where such physical relationships are noteworthy. These terms are employed herein for descriptive purposes only and predominantly within the context of a device z-axis and therefore may be relative to an orientation of a device. Hence, a first material "over" a second material in the context of a figure provided herein may also be "under" the second material if the device is oriented upside-down relative to the context of the figure provided. In the context of materials, one material disposed over or under another may be directly in contact or may have one or more intervening materials. Moreover, one material disposed between two materials may be directly in contact with the two layers or may have one or more intervening layers. In contrast, a first material "on" a second material is in direct contact with that second material. Similar distinctions are to be made in the context of component assemblies.

The term "between" may be employed in the context of the z-axis, x-axis or y-axis of a device. A material that is between two other materials may be in contact with one or both of those materials, or it may be separated from both of the other two materials by one or more intervening materials. A material "between" two other materials may therefore be in contact with either of the other two materials, or it may be coupled to the other two materials through an intervening material. A device that is between two other devices may be directly connected to one or both of those devices, or it may be separated from both of the other two devices by one or more intervening devices.

Here, multiple non-silicon semiconductor material layers may be stacked within a single fin structure. The multiple non-silicon semiconductor material layers may include one or more "P-type" layers that are suitable (e.g., offer higher hole mobility than silicon) for P-type transistors. The multiple non-silicon semiconductor material layers may further include one or more "N-type" layers that are suitable (e.g., offer higher electron mobility than silicon) for N-type transistors. The multiple non-silicon semiconductor material layers may further include one or more intervening layers separating the N-type from the P-type layers. The intervening layers may be at least partially sacrificial, for example to allow one or more of a gate, source, or drain to wrap completely around a channel region of one or more of the N-type and P-type transistors. The multiple non-silicon semiconductor material layers may be fabricated, at least in part, with self-aligned techniques such that a stacked CMOS device may include both a high-mobility N-type and P-type transistor with a footprint of a single FET (field effect transistor).

Here, the term "backend" generally refers to a section of a die which is opposite of a "frontend" and where an IC (integrated circuit) package couples to IC die bumps. For example, high-level metal layers (e.g., metal layer 6 and above in a ten-metal stack die) and corresponding vias that are closer to a die package are considered part of the backend of the die. Conversely, the term "frontend" generally refers to a section of the die that includes the active region (e.g., where transistors are fabricated) and low-level metal layers and corresponding vias that are closer to the active region (e.g., metal layer 5 and below in the ten-metal stack die example).

Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. If the specification states a component, feature, structure, or characteristic "may," "might," or "could" be included, that particular component, feature, structure, or characteristic is not required to be included. If the specification or claim refers to "a" or "an" element, that does not mean there is only one of the elements. If the specification or claims refer to "an additional" element, that does not preclude there being more than one of the additional elements.

Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

While the disclosure has been described in conjunction with specific embodiments thereof, many alternatives, modifications and variations of such embodiments will be apparent to those of ordinary skill in the art in light of the foregoing description. The embodiments of the disclosure are intended to embrace all such alternatives, modifications, and variations as to fall within the broad scope of the appended claims.

In addition, well-known power/ground connections to integrated circuit (IC) chips and other components may or may not be shown within the presented figures, for simplicity of illustration and discussion, and so as not to obscure the disclosure. Further, arrangements may be shown in block diagram form to avoid obscuring the disclosure, and also in view of the fact that specifics with respect to implementation of such block diagram arrangements are highly dependent upon the platform within which the present disclosure is to be implemented (i.e., such specifics should be well within purview of one skilled in the art). Where specific details (e.g., circuits) are set forth to describe example embodiments of the disclosure, it should be apparent to one skilled in the art that the disclosure can be practiced without, or with variation of, these specific details. The description is thus to be regarded as illustrative instead of limiting.

The structures of various embodiments described herein can also be described as method(s) of forming those structures or apparatuses, and method(s) of operation of these structures or apparatuses. Following examples are provided that illustrate the various embodiments. The examples can be combined with other examples. As such, various embodiments can be combined with other embodiments without changing the scope of the invention.

Example 1: An apparatus comprising: a first array comprising first bit-cells arranged in first rows and in first columns, wherein the first rows are orthogonal to the first columns, wherein the first array having a first set of bit-lines, wherein an individual first row of the first rows has an individual first bit-line of the first set of bit-lines; a second array comprising second bit-cells that are arranged in second rows and second columns, wherein the second rows are orthogonal to the second columns, wherein the second array having a second set of bit-lines, wherein an individual second row of the second rows has an individual second bit-line of the second set of bit-lines; and a selection circuitry positioned between the first array and the second array, wherein the selection circuitry is operable to pass a signal to one of the individual first bit-line or the individual second bit-line according to one or more controls.

Example 2: The apparatus of example 1, wherein the selection circuitry comprises: a first transistor controllable by a first control of the one or more controls, wherein the first transistor is coupled to the individual first bit-line and to a third bit-line; and a second transistor controllable by a second control of the one or more controls, wherein the second transistor is coupled to the individual second bit-line and to the third bit-line.

Example 3: The apparatus of example 2, wherein the first control and the second control are complementary of each other.

Example 4: The apparatus of example 2 comprising a sense amplifier coupled to the third bit-line.

Example 5: The apparatus of example 2, wherein the first transistor and the second transistor are n-type transistors, p-type transistors, or a combination of n-type and p-type transistors.

Example 6: The apparatus of example 1, wherein the individual first bit-line is substantially equal in routing length as the individual second bit-line.

Example 7: The apparatus of example 1, wherein an individual first bit-cell of the first bit-cells comprises a transistor and one capacitor connected to the transistor, wherein the transistor is coupled to the individual first bit-line.

Example 8: The apparatus of example 1, wherein an individual first bit-cell of the first bit-cells comprises a transistor and multiple capacitors connected to the transistor, wherein the transistor is coupled to the individual first bit-line.

Example 9: The apparatus of example 1, wherein an individual first-bit cell of the first bit-cells comprises: a transistor having a gate terminal coupled to a word-line, a source terminal couple to the individual first bit-line, and a drain terminal coupled to a storage node; and a plurality of capacitors having a first terminal coupled to the storage node, wherein a second terminal of an individual capacitor of the plurality of capacitors is coupled to an individual plate-line, wherein the plurality of capacitors are planar capacitors that are arranged in a stacked and folded configuration.

Example 10: The apparatus of example 1, wherein an individual first bit-cell of the first bit-cells comprises: a first transistor having a first gate terminal coupled to a word-line, a first source terminal couple to the individual first bit-line, and a first drain terminal coupled to a storage node; a second transistor coupled to the first transistor, wherein the second transistor includes a second gate terminal coupled to the storage node, a second source terminal couple to a sense line, and a second drain terminal coupled to a bias; and a plurality of capacitors having a first terminal coupled to the storage node, wherein a second terminal of an individual capacitor of the plurality of capacitors is coupled to an individual plate-line, wherein the plurality of capacitors are planar capacitors that are arranged in a stacked and folded configuration.

Example 11: An apparatus comprising: a first bit-line routed along a first row of a first array; a second bit-line routed long a second row of a second array; and a multiplexer positioned between the first array and the second array, wherein the multiplexer is operable to pass a signal to one of the first bit-line or the second bit-line according to one or more controls.

Example 12: The apparatus of example 11, wherein the first bit-line is substantially equal in routing length as the second bit-line.

Example 13: The apparatus of example 11, wherein the multiplexer comprises: a first transistor controllable by a first control of the one or more controls, wherein the first transistor couples the first bit-line and to a third bit-line; and a second transistor controllable by a second control of the one or more controls, wherein the second transistor couples the second bit-line and to the third bit-line.

Example 14: The apparatus of example 13, wherein the first control and the second control are complementary of each other.

Example 15: The apparatus of example 13 comprising a sense amplifier coupled to the third bit-line.

Example 16: The apparatus of example 11, wherein the first array includes a first-bit cell which comprises: a transistor having a gate terminal coupled to a word-line, a source terminal couple to the first bit-line, and a drain terminal coupled to a storage node; and a plurality of capacitors having a first terminal coupled to the storage node, wherein a second terminal of an individual capacitor of the plurality of capacitors is coupled to an individual plate-line, wherein the plurality of capacitors are planar capacitors that are arranged in a stacked and folded configuration.

Example 17: The apparatus of example 11, wherein the first array includes a first-bit cell which comprises: a first transistor having a first gate terminal coupled to a word-line, a first source terminal couple to the first bit-line, and a first drain terminal coupled to a storage node; a second transistor coupled to the first transistor, wherein the second transistor includes a second gate terminal coupled to the storage node, a second source terminal couple to a sense line, and a second drain terminal coupled to a bias; and a plurality of capacitors having a first terminal coupled to the storage node, wherein a second terminal of an individual capacitor of the plurality of capacitors is coupled to an individual plate-line, wherein the plurality of capacitors are planar capacitors that are arranged in a stacked and folded configuration.

Example 18: A system comprising: a memory to store instructions; a processor circuitry to execute instructions; and a communication interface to allow the processor circuitry to communicate with another device, wherein the memory includes: a first array comprising first bit-cells arranged in first rows and in first columns, wherein the first rows are orthogonal to the first columns, wherein the first array having a first set of bit-lines, wherein an individual first row of the first rows has an individual first bit-line of the first set of bit-lines; a second array comprising second bit-cells that are arranged in second rows and second columns, wherein the second rows are orthogonal to the second columns, wherein the second array having a second set of bit-lines, wherein an individual second row of the second rows has an individual second bit-line of the second set of bit-lines; and a selection circuitry positioned between the first array and the second array, wherein the selection circuitry is operable to pass a signal to one of the individual first bit-line or the individual second bit-line according to one or more controls.

Example 19: The system of example 18, wherein the selection circuitry comprises: a first transistor controllable by a first control of the one or more controls, wherein the first transistor is coupled to the individual first bit-line and to a third bit-line; and a second transistor controllable by a second control of the one or more controls, wherein the second transistor is coupled to the individual second bit-line and to the third bit-line.

Example 20: The system of example 19, wherein the first control and the second control are complementary of each other.

Example 1a: An apparatus comprising: a first bit-line routed along a first row of a first array; a second bit-line routed along a second row of a second array; and a multiplexer positioned between the first array and the second array, wherein the multiplexer is operable to pass a signal to one of the first bit-line or the second bit-line according to one or more controls, wherein the signal is to route on a third bit-line which is routed under active devices of the multiplexer.

Example 2a: The apparatus of example 1a, wherein the first bit-line is substantially equal in routing length as the second bit-line.

Example 3a: The apparatus of example 1a, wherein the multiplexer comprises: a first select transistor controllable by a first control of the one or more controls, wherein the first select transistor couples the first bit-line to the third bit-line; and a second select transistor controllable by a second control of the one or more controls, wherein the second select transistor couples the second bit-line to the third bit-line, wherein the first select transistor and the second select transistor are the active devices.

Example 4a: The apparatus of example 1a comprises one or more vias to couple the third bit-line to a sense amplifier.

Example 5a: The apparatus of example 3a, wherein the first bit-line and the second bit-line are on a layer above the first select transistor.

Example 6a: The apparatus of example 3a, wherein the first control and the second control are complementary of each other.

Example 7a: The apparatus of example 1a comprising a sense amplifier coupled to the third bit-line.

Example 8a: The apparatus of example 1a, wherein the first array includes a first-bit cell which comprises: an access transistor having a gate terminal coupled to a word-line, a source terminal couple to the first bit-line, and a drain terminal coupled to a storage node; and a plurality of capacitors having a first terminal coupled to the storage node, wherein a second terminal of an individual capacitor of the plurality of capacitors is coupled to an individual plate-line, wherein the plurality of capacitors are planar capacitors that are arranged in a stacked and folded configuration.

Example 9a: The apparatus of example 8a, wherein the plurality of capacitors are planar capacitors that are arranged in a stacked and folded configuration.

Example 10a: The apparatus of example 1a, wherein the first array includes a first-bit cell which comprises: an access transistor having a first gate terminal coupled to a word-line, a first source terminal couple to the first bit-line, and a first drain terminal coupled to a storage node; a gain transistor coupled to the access transistor, wherein the gain transistor includes a second gate terminal coupled to the storage node, a second source terminal couple to a sense line, and a second drain terminal coupled to a bias; and a plurality of capacitors having a first terminal coupled to the storage node, wherein a second terminal of an individual capacitor of the plurality of capacitors is coupled to an individual plate-line.

Example 11a: The apparatus of example 10a, wherein the plurality of capacitors are planar capacitors that are arranged in a stacked and folded configuration.

Example 12a: An apparatus comprising: a first bit-line routed along a first row of a first array; a second bit-line routed along a second row of a second array; and a third bit-line routed in a region which is below the first array or the second array.

Example 13a: The apparatus of example 12a, wherein the first bit-line is substantially equal in routing length as the second bit-line.

Example 14a: The apparatus of example 12a comprising: a multiplexer positioned between the first array and the second array, wherein the multiplexer is operable to pass a signal via the third bit-line to one of the first bit-line or the second bit-line according to one or more controls.

Example 15a: The apparatus of example 14a, wherein the multiplexer comprises: a first select transistor controllable by a first control of the one or more controls, wherein the first select transistor couples the first bit-line to the third bit-line; and a second select transistor controllable by a second control of the one or more controls, wherein the second select transistor couples the second bit-line to the third bit-line.

Example 16a: The apparatus of example 15a, wherein the first control and the second control are complementary of each other.

Example 17a: A system comprising: a processor circuitry to execute one or more instructions; a memory to store the one or more instructions; and a communication interface to allow the processor circuitry to communicate with another device, wherein the memory includes: a first bit-line routed along a first row of a first array; a second bit-line routed long a second row of a second array; and a third bit-line routed in a region which is below the first array or the second array.

Example 18a: The system of example 17a, wherein the first bit-line is substantially equal in routing length as the second bit-line.

Example 19a: The system of example 17a comprising: a multiplexer positioned between the first array and the second array, wherein the multiplexer is operable to pass a signal via the third bit-line to one of the first bit-line or the second bit-line according to one or more controls.

Example 20a: The system of example 19a, wherein the multiplexer comprises: a first select transistor controllable by a first control of the one or more controls, wherein the first select transistor couples the first bit-line to the third bit-line; and a second select transistor controllable by a second control of the one or more controls, wherein the second select transistor couples the second bit-line to the third bit-line.

An abstract is provided that will allow the reader to ascertain the nature and gist of the technical disclosure. The abstract is submitted with the understanding that it will not be used to limit the scope or meaning of the claims. The following claims are hereby incorporated into the detailed description, with each claim standing on its own as a separate embodiment.

We claim:

1. An apparatus comprising:

a first array comprising first bit-cells arranged in first rows and in first columns, wherein the first rows are orthogonal to the first columns, wherein the first array having a first set of bit-lines, and wherein an individual first row of the first rows has an individual first bit-line of the first set of bit-lines;

a second array comprising second bit-cells that are arranged in second rows and second columns, wherein the second rows are orthogonal to the second columns, wherein the second array having a second set of bit-lines, and wherein an individual second row of the second rows has an individual second bit-line of the second set of bit-lines; and a selection circuitry positioned between the first array and the second array, wherein the selection circuitry is operable to pass a signal to one of the individual first bit-line or the individual second bit-line according to one or more controls, wherein the selection circuitry comprises a first transistor controllable by a first control of the one or more controls and a second transistor controllable by a second control of the one or more controls, and wherein the first control and the second control are complementary of each other.

2. The apparatus of claim 1, wherein the first transistor is coupled to the individual first bit-line and to a third bit-line; and wherein the second transistor is coupled to the individual second bit-line and to the third bit-line.

3. The apparatus of claim 2 comprising a sense amplifier coupled to the third bit-line.

4. The apparatus of claim 2, wherein the first transistor and the second transistor are n-type transistors, p-type transistors, or a combination of n-type and p-type transistors.

5. The apparatus of claim 1, wherein the individual first bit-line is substantially equal in routing length as the individual second bit-line.

6. The apparatus of claim 1, wherein an individual first bit-cell of the first bit-cells comprises a transistor and one capacitor connected to the transistor, and wherein the transistor is coupled to the individual first bit-line.

7. The apparatus of claim 1, wherein an individual first bit-cell of the first bit-cells comprises a transistor and multiple capacitors connected to the transistor, and wherein the transistor is coupled to the individual first bit-line.

8. The apparatus of claim 1, wherein an individual first-bit cell of the first bit-cells comprises:

a transistor having a gate terminal coupled to a word-line, a source terminal couple to the individual first bit-line, and a drain terminal coupled to a storage node; and a plurality of capacitors having a first terminal coupled to the storage node, wherein a second terminal of an individual capacitor of the plurality of capacitors is coupled to an individual plate-line, and wherein the plurality of capacitors are planar capacitors that are arranged in a stacked and folded configuration.

9. The apparatus of claim 1, wherein an individual first bit-cell of the first bit-cells comprises:

a first transistor having a first gate terminal coupled to a word-line, a first source terminal couple to the individual first bit-line, and a first drain terminal coupled to a storage node;

a second transistor coupled to the first transistor, wherein the second transistor includes a second gate terminal coupled to the storage node, a second source terminal couple to a sense line, and a second drain terminal coupled to a bias; and a plurality of capacitors having a first terminal coupled to the storage node, wherein a second terminal of an individual capacitor of the plurality of capacitors is coupled to an individual plate-line, wherein the plurality of capacitors are planar capacitors that are arranged in a stacked and folded configuration.

10. An apparatus comprising:

a first bit-line routed along a first row of a first array;

a second bit-line routed along a second row of a second array; and a multiplexer positioned between the first array and the second array, wherein the multiplexer is operable to pass a signal to one of the first bit-line or the second bit-line according to one or more controls, wherein the multiplexer comprises a first transistor controllable by a first control of the one or more controls and a second transistor controllable by a second control of the one or more controls, and wherein the first control and the second control are complementary of each other.

11. The apparatus of claim 10, wherein the first bit-line is substantially equal in routing length as the second bit-line.

12. The apparatus of claim 10, wherein the first transistor couples the first bit-line and to a third bit-line; and wherein the second transistor couples the second bit-line and to the third bit-line.

13. The apparatus of claim 12 comprising a sense amplifier coupled to the third bit-line.

14. The apparatus of claim 10, wherein the first array includes a first-bit cell which comprises:

a transistor having a gate terminal coupled to a word-line, a source terminal couple to the first bit-line, and a drain terminal coupled to a storage node; and a plurality of capacitors having a first terminal coupled to the storage node, wherein a second terminal of an individual capacitor of the plurality of capacitors is coupled to an individual plate-line, and wherein the plurality of capacitors are planar capacitors that are arranged in a stacked and folded configuration.

15. The apparatus of claim 10, wherein the first array includes a first-bit cell which comprises:

a first transistor having a first gate terminal coupled to a word-line, a first source terminal coupled to the first bit-line, and a first drain terminal coupled to a storage node;

a second transistor coupled to the first transistor, wherein the second transistor includes a second gate terminal coupled to the storage node, a second source terminal couple to a sense line, and a second drain terminal coupled to a bias; and a plurality of capacitors having a first terminal coupled to the storage node, wherein a second terminal of an individual capacitor of the plurality of capacitors is coupled to an individual plate-line, and wherein the plurality of capacitors are planar capacitors that are arranged in a stacked and folded configuration.

16. A system comprising:

a memory to store instructions;

a processor circuitry to execute instructions; and a communication interface to allow the processor circuitry to communicate with another device, wherein the memory includes:

a first array comprising first bit-cells arranged in first rows and in first columns, wherein the first rows are orthogonal to the first columns, wherein the first array having a first set of bit-lines, and wherein an individual first row of the first rows has an individual first bit-line of the first set of bit-lines;

a second array comprising second bit-cells that are arranged in second rows and second columns, wherein the second rows are orthogonal to the second columns, wherein the second array having a second set of bit-lines, and wherein an individual second row of the second rows has an individual second bit-line of the second set of bit-lines; and a selection circuitry positioned between the first array and the second array, wherein the selection circuitry is operable to pass a signal to one of the individual first bit-line or the individual second bit-line according to one or more controls, wherein the selection circuitry comprises a first transistor controllable by a first control of the one or more controls and a second transistor controllable by a second control of the one or more controls, and wherein the first control and the second control are complementary of each other.

17. The system of claim 16, wherein the first transistor is coupled to the individual first bit-line and to a third bit-line; and wherein the second transistor is coupled to the individual second bit-line and to the third bit-line.

* * * * *